(12) United States Patent
Narasaki et al.

(10) Patent No.: US 11,765,899 B2
(45) Date of Patent: Sep. 19, 2023

(54) SEMICONDUCTOR STORAGE DEVICE

(71) Applicant: Kioxia Corporation, Tokyo (JP)

(72) Inventors: Ryota Narasaki, Yokkaichi Mie (JP); Weili Cai, Yokkaichi Mie (JP); Satoshi Nagashima, Yokkaichi Mie (JP); Takayuki Ishikawa, Yokkaichi Mie (JP); Yusuke Shimada, Yokkaichi Mie (JP); Yefei Han, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 281 days.

(21) Appl. No.: 17/191,217

(22) Filed: Mar. 3, 2021

(65) Prior Publication Data

US 2022/0085060 A1  Mar. 17, 2022

(30) Foreign Application Priority Data

Sep. 14, 2020 (JP) ................. 2020-154168

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
CPC ........ H10B 43/10; H10B 43/20; H10B 43/23; H10B 43/27; H10B 41/27; H01L 29/4941; H01L 29/4958; H01L 29/40117; H01L 29/4234; H01L 29/7889; H01L 29/7926; H01L 23/5226

See application file for complete search history.

(56) References Cited

U.S. PATENT DOCUMENTS

| | | | |
|---|---|---|---|
| 9,431,412 B1 | 8/2016 | Kato et al. | |
| 10,236,254 B1 | 3/2019 | Arai et al. | |
| 2017/0148805 A1 | 5/2017 | Nishikawa et al. | |
| 2018/0269218 A1* | 9/2018 | Kato | H10B 43/40 |
| 2020/0091178 A1 | 3/2020 | Nakao et al. | |
| 2020/0286902 A1 | 9/2020 | Fukuda et al. | |

FOREIGN PATENT DOCUMENTS

| | | |
|---|---|---|
| CN | 108140645 A | 6/2018 |
| JP | 2019-054182 A | 4/2019 |
| TW | 201703233 A | 1/2017 |
| TW | 201836124 A | 10/2018 |

\* cited by examiner

*Primary Examiner* — Yara B Green
*Assistant Examiner* — Fakeha Sehar
(74) *Attorney, Agent, or Firm* — Foley & Lardner LLP

(57) ABSTRACT

A semiconductor storage device includes a first conductive layer; a first insulating layer between the first and second conductive layers; a second insulating layer between the first conductive layer and the first insulating layer; a third insulating layer between the second conductive layer and the first insulating layer; a fourth insulating layer between the second conductive layer and the third conductive layer; a fifth insulating layer between the second conductive layer and the fourth insulating layer; and a sixth insulating layer between the third conductive layer and the fourth insulating layer. The first conductive layer has a first surface. The second conductive layer has a second surface. A barrier conductive film containing at least one of nitrogen (N) or titanium (Ti) is provided on the first surface and the second surface.

3 Claims, 70 Drawing Sheets

SEMICONDUCTOR STORAGE DEVICE

CROSS-REFERENCE TO RELATED APPLICATION

This application is based upon and claims the benefit of priority from Japanese Patent Application No. 2020-154168, filed on Sep. 14, 2020, the entire contents of which are incorporated herein by reference.

FIELD

Embodiments described herein relate generally to semiconductor storage devices.

BACKGROUND

In general, a semiconductor storage device includes a substrate, a plurality of gate electrodes stacked in a direction intersecting a front surface of the substrate, a semiconductor layer facing the plurality of gate electrodes, and a gate insulation layer provided between the gate electrode and the semiconductor layer. The gate insulation layer includes a memory unit that can store data such as, for example, an insulating charge storage portion made of silicon nitride ($Si_3N_4$), and a conductive charge storage portion such as a floating gate.

DETAILED DESCRIPTION

Figure 1:
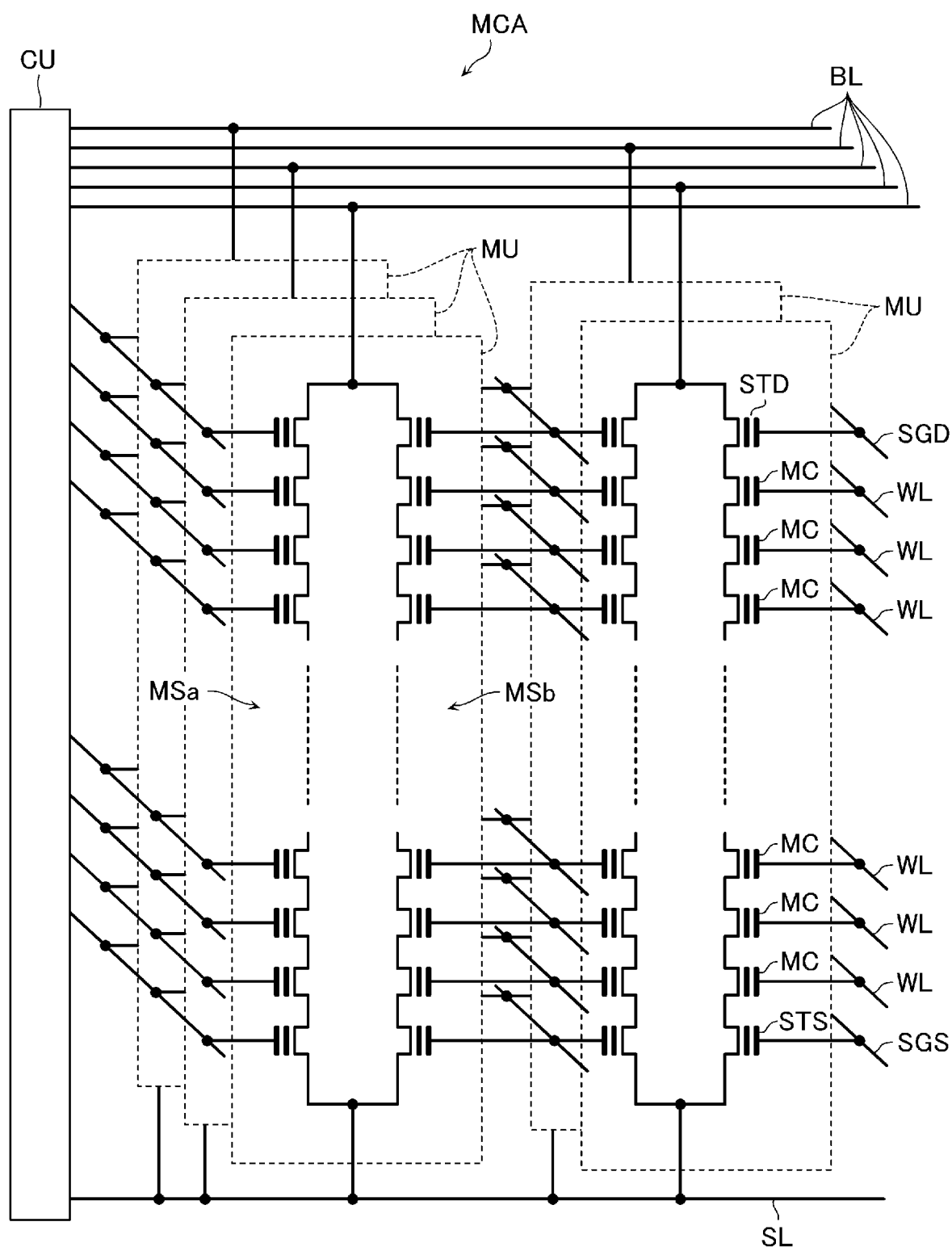
FIG. 1 is a schematic equivalent circuit diagram of a semiconductor storage device according to a first embodiment.

Embodiments provide a semiconductor storage device that is highly integrated.

In general, according to one embodiment, there is provided a semiconductor storage device. The semiconductor storage device includes a first conductive layer, a second conductive layer, and a third conductive layer that extend in a first direction and are arranged in a second direction intersecting the first direction; a plurality of first semiconductor layers provided between the first conductive layer and the second conductive layer and arranged in the first direction; a plurality of first charge storage portions provided between the first conductive layer and the plurality of first semiconductor layers; a plurality of second charge storage portions provided between the second conductive layer and the plurality of first semiconductor layers; a first insulating layer provided between the first conductive layer and the second conductive layer and between two adjacent ones of the first semiconductor layers in the first direction; a second insulating layer provided between the first conductive layer and the first insulating layer and between two adjacent ones of the first charge storage portions in the first direction; a third insulating layer provided between the second conductive layer and the first insulating layer and between two adjacent ones of the second charge storage portions in the first direction; a plurality of second semiconductor layers provided between the second conductive layer and the third conductive layer and arranged in the first direction; a plurality of third charge storage portions provided between the second conductive layer and the plurality of second semiconductor layers; a plurality of fourth charge storage portions provided between the third conductive layer and the plurality of second semiconductor layers; a fourth insulating layer provided between the second conductive layer and the third conductive layer and between two adjacent ones of the second semiconductor layers in the first direction; a fifth insulating layer provided between the second conductive layer and the fourth insulating layer and between two adjacent ones of the third charge storage portions in the first direction; and a sixth insulating layer provided between the third conductive layer and the fourth insulating layer and between two adjacent ones of the fourth charge storage portions in the first direction. The first conductive layer has a first surface facing the second insulating layer. The second conductive layer has a second surface facing the third insulating layer. The second conductive layer has a third surface facing the fifth insulating layer. The third conductive layer has a fourth surface facing the sixth insulating layer. A barrier conductive film containing at least one of nitrogen (N) or titanium (Ti) is provided on the first surface and the second surface. The barrier conductive film is not provided on the third surface and the fourth surface.

According to another embodiment, a semiconductor storage device includes: a substrate; a plurality of first conductive layers being arranged in a first direction intersecting a front surface of the substrate and extending in a second direction intersecting the first direction; a plurality of memory cells being connected to the plurality of first conductive layers; a plurality of second conductive layers being arranged in the first direction, extending in the second direction, and being connected to end portions of the plurality of first conductive layers in the second direction, respectively; and a plurality of contact electrodes extending in the first direction and being connected to the plurality of second conductive layers, respectively. The plurality of second conductive layers include a first metal film containing a metal. The plurality of first conductive layers include no film containing a metal or include a second metal film containing a metal and having a thickness in the first direction smaller than a thickness of the first metal film in the first direction.

Next, a semiconductor storage device according to an embodiment will be described in detail with reference to the drawings. It is noted that the following embodiments are merely examples, and the embodiments are not intended to limit the present disclosure. In addition, the following drawings are schematic, and some configurations and the like may be omitted for the convenience of description. In addition, components common to the plurality of embodiments are denoted by the same reference numerals, and the description may be omitted.

In addition, when the "semiconductor storage device" is referred to in this specification, in some cases, the semiconductor storage device may denote a memory die or may denote a memory system including a control die of a memory chip, a memory card, a solid state drive (SSD), or the like. In addition, in some cases, the semiconductor storage device may denote a configuration including a host computer such as a smart phone, a tablet terminal, and a personal computer.

In addition, in this specification, when a first component is said to be "electrically connected" to a second component, the first component may be directly connected to the second component, and the first component may be connected to the second component via wirings, semiconductor members, transistors, or the like. For example, when three transistors are connected in series, the first transistor is "electrically connected" to the third transistor even though the second transistor is in the OFF state.

In addition, in this specification, when the first component is said to be "connected between" the second component and the third component, in some cases, it may be denoted that the first component, the second component, and the third component are connected in series and that the second component is connected to the third component via the first component.

In addition, in this specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In addition, in this specification, in some cases, a direction along a predetermined surface may be referred to as a first direction, a direction intersecting the first direction along the predetermined surface may be referred to as a second direction, and a direction intersecting the predetermined surface may be referred to as a third direction. The first direction, the second direction, and the third direction may or may not correspond to any of the X direction, the Y direction, and the Z direction.

In addition, in this specification, "upper", "lower", and the like are represented based on the substrate. For example, a direction away from the substrate along the Z direction is referred to as "upper", and a direction closer to the substrate along the Z direction is referred to as "lower". In addition, when referring to a lower surface or a lower end of a certain component, the lower surface or the lower end denotes a surface or an end portion of the component on the substrate side, and when referring to an upper surface or an upper end, the upper surface or the upper end denotes a surface or an end portion of the component on the side opposite to the substrate. In addition, a surface that intersects the X direction or the Y direction is referred to as a side surface or the like.

First Embodiment

[Configuration]

FIG. 1 is a schematic equivalent circuit diagram of a semiconductor storage device according to a first embodiment.

The semiconductor storage device according to the embodiment includes a memory cell array MCA and a control unit CU that controls the memory cell array MCA.

The memory cell array MCA includes a plurality of memory units MU. Each of these plurality of memory units MU includes two memory strings MSa and MSb that are electrically independent. One end of each of these memory strings MSa and MSb is connected to a drain-side select transistor STD and is connected to a common bit line BL via each select transistor. The other end of each of the memory strings MSa and MSb is connected to a source-side select transistor STS and is connected to a common source line SL via each select transistor.

Each of the memory strings MSa and MSb includes a plurality of memory cells MC connected in series. The memory cell MC is a field effect transistor including a semiconductor layer, a gate insulation layer, and a gate electrode. The semiconductor layer functions as a channel region. The gate insulation layer includes a charge storage portion that can store data. A threshold voltage of the memory cell MC changes according to a charge amount in the charge storage portion. The gate electrode is a portion of a word line WL.

The select transistor (STD, STS) is a field effect transistor including a semiconductor layer, a gate insulation layer, and a gate electrode. The semiconductor layer functions as a channel region. The gate electrode of the drain-side select transistor STD is a portion of a drain-side select gate line SGD. The gate electrode of the source-side select transistor STS is portion of a source-side select gate line SGS.

For example, the control unit CU generates voltages required for a read operation, a write operation, and an erase operation and supplies the voltages to a bit line BL, a source line SL, a word line WL, and select gate lines (SGD, SGS). For example, the control unit CU may include a plurality of transistors and wirings provided on the same substrate as that of the memory cell array MCA or may include a plurality of transistors and wirings provided on a substrate different from that of the memory cell array MCA.

Figure 2:
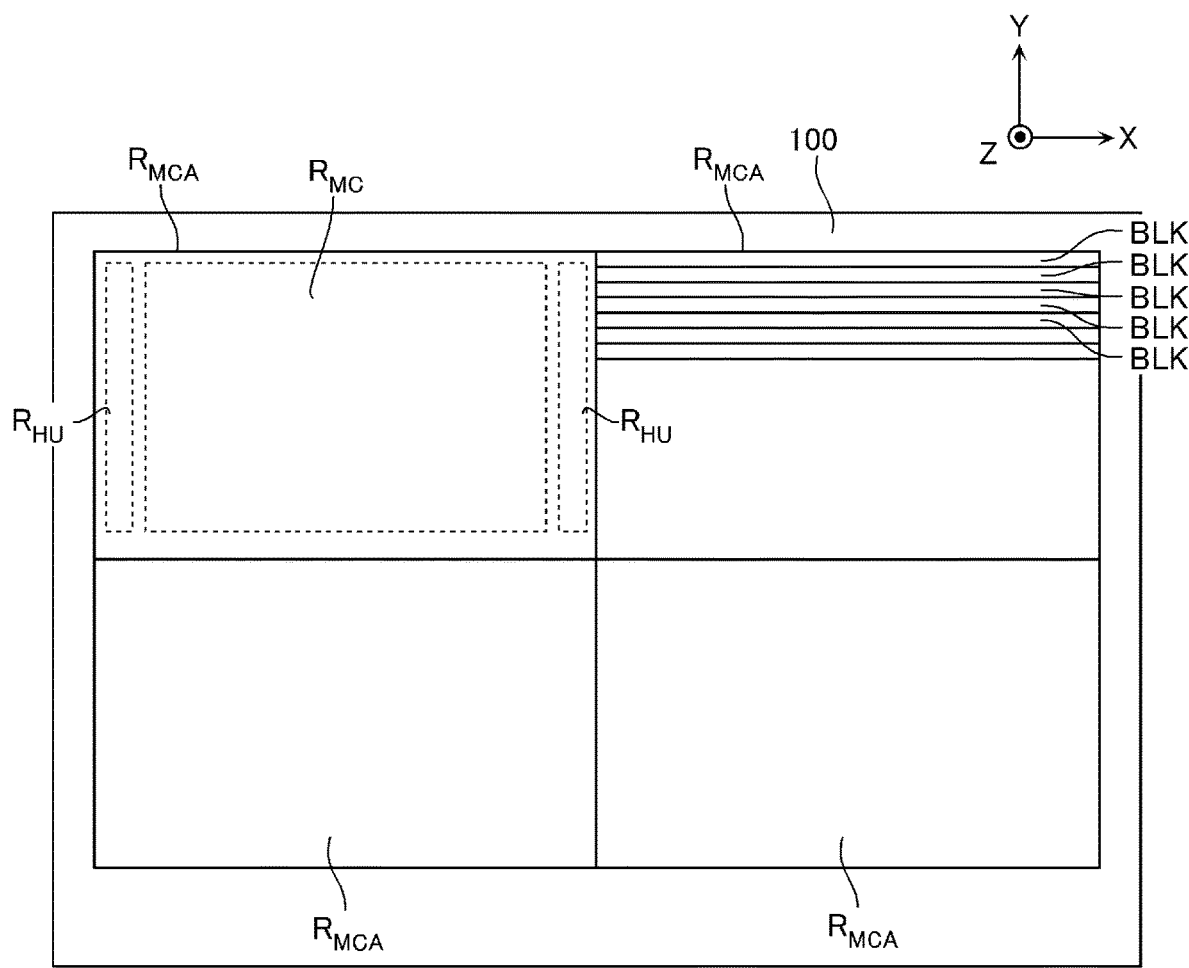
FIG. 2 is a schematic plan view of the semiconductor storage device.

FIG. 2 is a schematic plan view illustrating a configuration example of the semiconductor storage device according to the embodiment.

The semiconductor storage device according to this embodiment includes a semiconductor substrate 100. In the illustrated example, four memory cell array regions $R_{MCA}$ arranged in the X direction and the Y direction are provided in the semiconductor substrate 100. In addition, a memory cell region $R_{MC}$ and a hookup region $R_{HU}$, which are arranged in the X direction, are provided in each memory cell array region $R_{MCA}$. In addition, a plurality of memory blocks BLK arranged in the Y direction are provided in each memory cell array region $R_{MCA}$. Each memory block BLK extends in the X direction and is provided over the memory cell region $R_{MC}$ and the hookup region $R_{HU}$.

[Configuration of Memory Cell Region $R_{MC}$]

Figure 3:
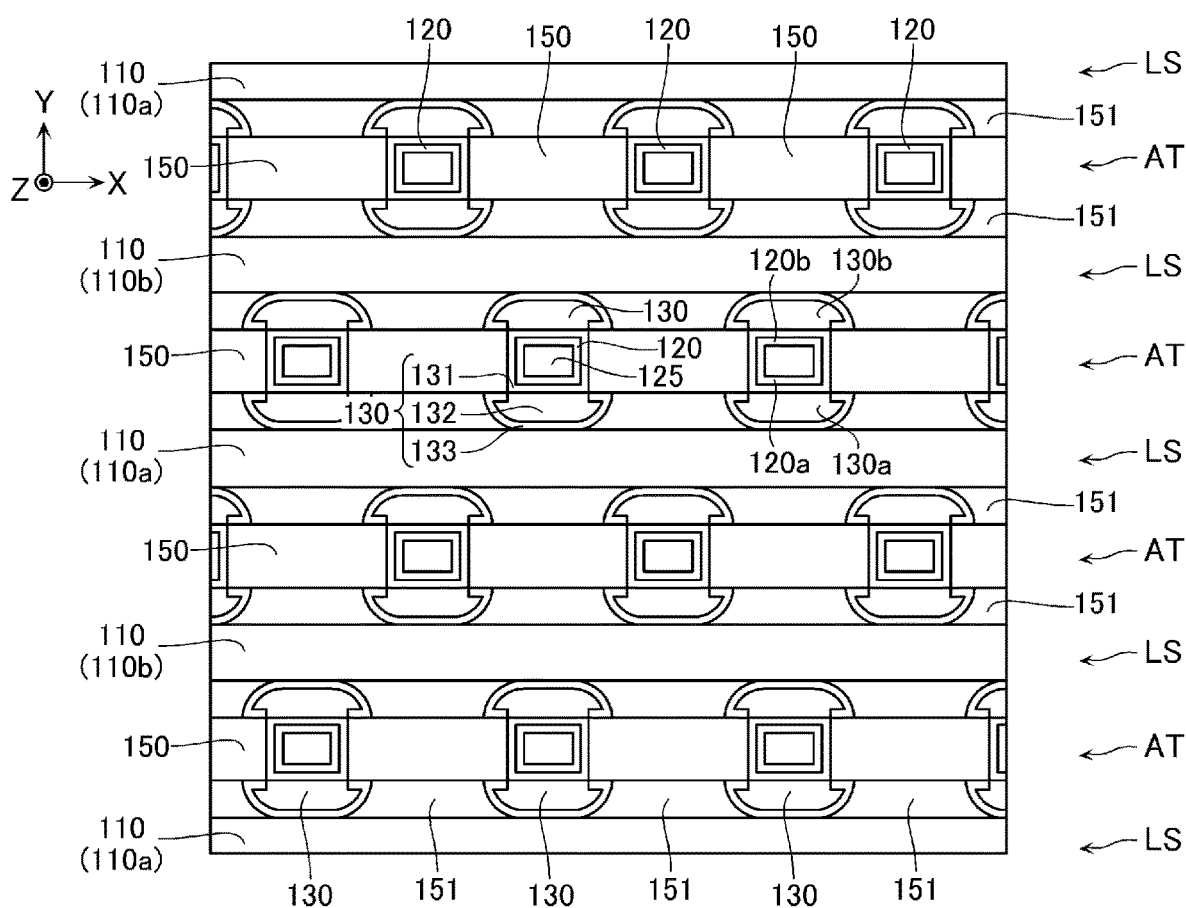
FIG. 3 is a schematic cross-sectional view of the semiconductor storage device.
Figure 4:
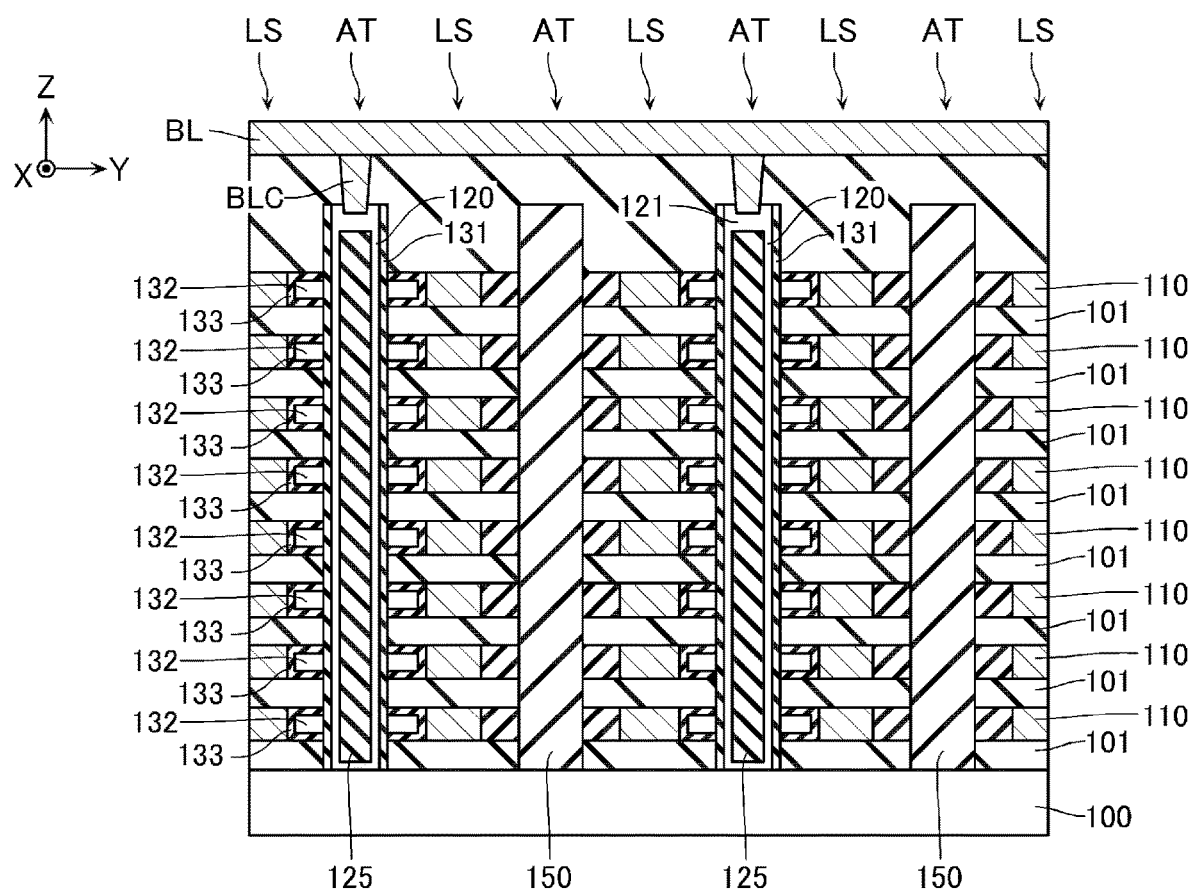
FIG. 4 is a schematic cross-sectional view of the semiconductor storage device.
Figure 5:
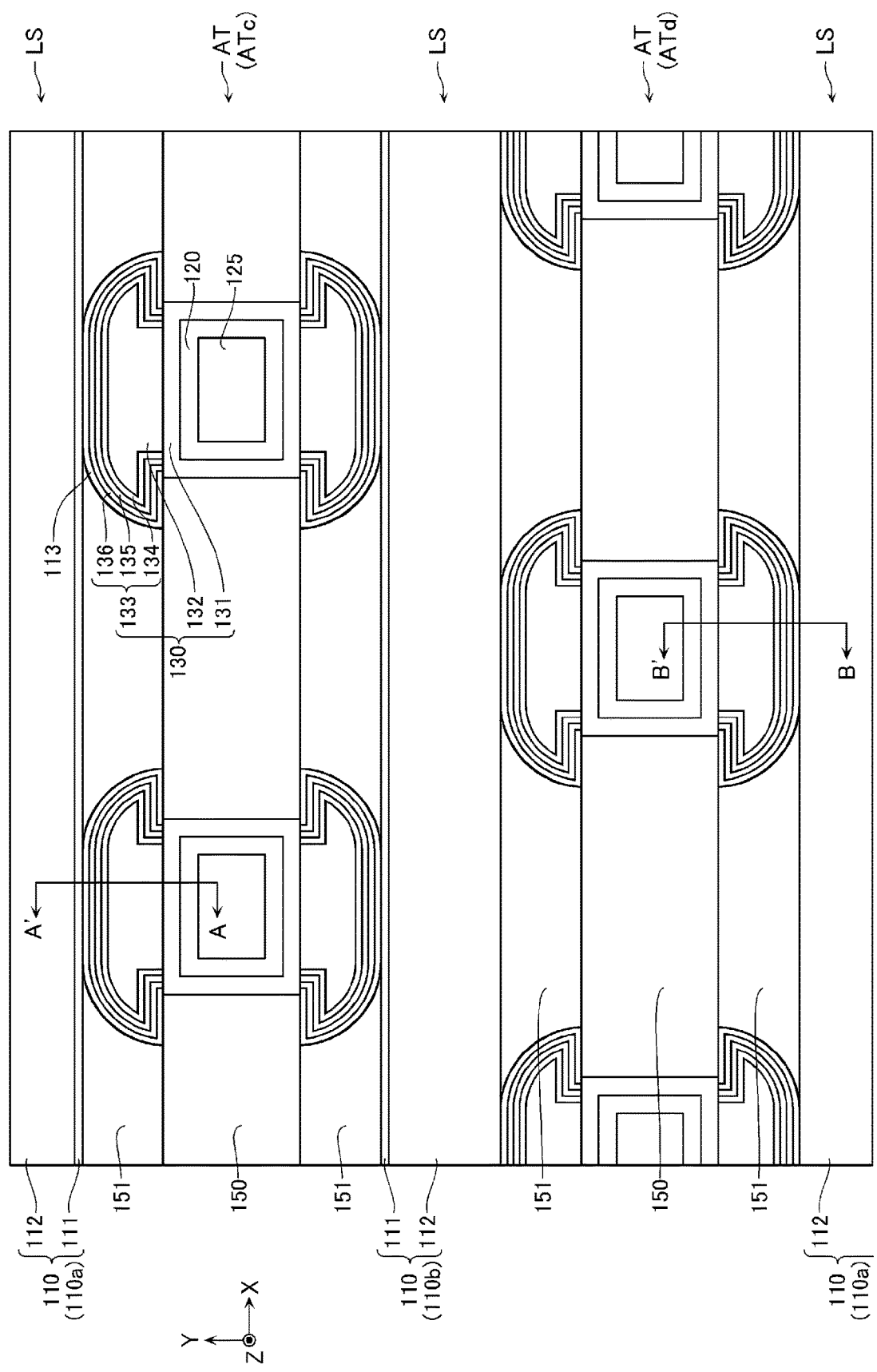
FIG. 5 is a schematic cross-sectional view of the semiconductor storage device.
Figure 6:
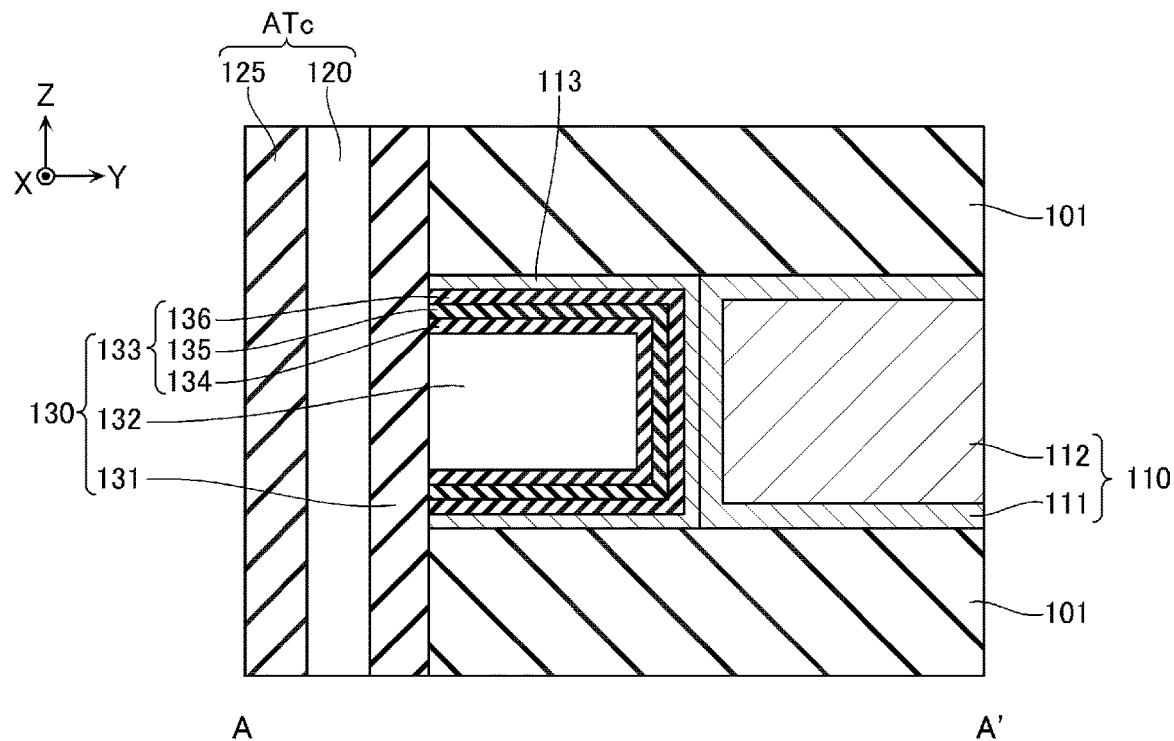
FIG. 6 is a schematic cross-sectional view of the semiconductor storage device.
Figure 7:
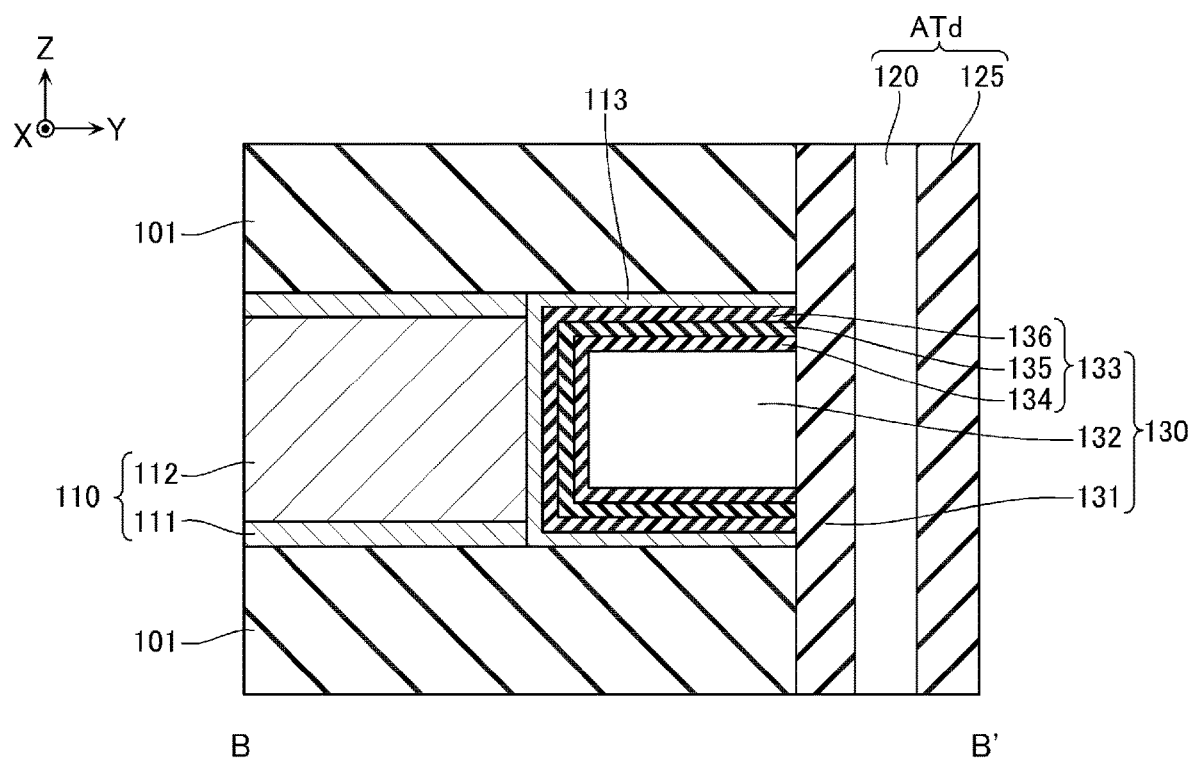
FIG. 7 is a schematic cross-sectional view of the semiconductor storage device.

FIG. 3 is a schematic XY cross-sectional view illustrating a portion of the configuration of the memory cell region $R_{MC}$. FIG. 4 is a schematic YZ cross-sectional view illustrating a portion of the configuration of the memory cell region $R_{MC}$. FIG. 5 is a schematic enlarged view illustrating a portion of the configuration of FIG. 3. FIG. 6 is a schematic cross-sectional view when the configuration illustrated in FIG. 5 is taken along a line A-A' and viewed along a direction of an arrow. FIG. 7 is a schematic cross-sectional view when the configuration illustrated in FIG. 5 is taken along a line B-B' and viewed along a direction of an arrow.

For example, as illustrated in FIG. 4, the semiconductor storage device according to the embodiment includes a plurality of stacked body structures LS arranged in the Y direction on the semiconductor substrate 100 and trench structures AT provided between the plurality of stacked body structures LS. The stacked body structure LS includes a plurality of conductive layers 110 stacked in the Z direction via insulating layers 101 made of silicon oxide ($SiO_2$) or the like. For example, as illustrated in FIG. 3, the trench structure AT includes a plurality of semiconductor layers 120 which extend in the Z direction and are arranged in the X direction via insulating layers 150 made of silicon oxide ($SiO_2$) or the like. In addition, each gate insulation layer 130 is provided between the conductive layer 110 and the semiconductor layer 120. In addition, each insulating layer 151 made of silicon nitride (SiN) or the like is provided between the conductive layer 110 and the insulating layer 150.

The semiconductor substrate 100 is, for example, a semiconductor substrate made of single crystal silicon (Si) or the like. The semiconductor substrate 100 has, for example, a double-well structure having an n-type impurity layer on the upper surface of the semiconductor substrate and a p-type impurity layer in the n-type impurity layer. It is noted that, for example, transistors, wirings, and the like constituting at least a portion of the control unit CU may be provided on the front surface of the semiconductor substrate 100 (FIG. 1).

The conductive layer 110 is a conductive layer extending in the X direction, and for example, as illustrated in FIGS. 6 and 7, is a stacked film including a barrier conductive film 111 made of titanium nitride (TiN) or the like and a metal film 112 made of tungsten (W) or the like. Each of the conductive layers 110 functions as the word line WL and the gate electrode of the memory cell MC (FIG. 1), as the drain-side select gate line SGD and the gate electrode of the drain-side select transistor STD (FIG. 1), or as the source-side select gate line SGS and the gate electrode of the source-side select transistor STS (FIG. 1).

In the following description, in the case of focusing on two stacked body structures LS adjacent to each other in the Y direction, in some cases, the plurality of conductive layers 110 in one stacked body structure LS may be referred to as conductive layers 110a (FIG. 3). In addition, the plurality of conductive layers 110 in the other stacked body structure LS may be referred to as conductive layers 110b (FIG. 3). The conductive layers 110a and the conductive layers 110b are electrically independent. Therefore, different voltages can be supplied to the conductive layers 110a and the conductive layers 110b. The conductive layer 110a functions as the gate electrode of the memory cell MC in the memory string MSa, as the gate electrode of the drain-side select transistor STD in the memory string MSa, or as the gate electrode of the source-side select transistor STS in the memory string MSa. The conductive layer 110b functions as the gate electrode of the memory cell MC in the memory string MSb, as the gate electrode of the drain-side select transistor STD in the memory string MSb, or as the gate electrode of the source-side select transistor STS in the memory string MSb.

In addition, in the following description, when focusing on two trench structures AT adjacent to each other in the Y direction, in some cases, one trench structure AT may be referred to as a trench structure ATc (FIG. 5). In addition, the other trench structure AT may be referred to as a trench structure ATd (FIG. 5). As illustrated in FIG. 5, among side surfaces of the metal film 112 in the conductive layer 110 in the Y direction, on the side surface on the trench structure ATc side, the barrier conductive film 111 extending in the X direction is provided over a region corresponding to the plurality of semiconductor layers 120. Therefore, a portion of the barrier conductive film 111 is provided between the side surface of the metal film 112 on the trench structure ATc side and the insulating layer 151. On the other hand, among the side surfaces of the metal film 112 in the conductive layer 110 in the Y direction, on the side surface on the trench structure ATd side, the barrier conductive film 111 is not provided. Therefore, the barrier conductive film 111 is not provided between the side surface of the metal film 112 on the trench structure ATd side and the insulating layer 151.

The semiconductor layer 120 is, for example, a semiconductor layer made of undoped polycrystalline silicon (Si) or the like. The semiconductor layer 120 has a substantially bottomed square cylindrical shape, and an insulating layer 125 made of silicon oxide ($SiO_2$) or the like is provided in the central portion thereof. It is noted that, in the following description, in some cases, among the semiconductor layers 120, the region facing the plurality of conductive layers 110a is referred to as a first region 120a (FIG. 3), and the region facing the plurality of conductive layers 110b is referred to as a second region 120b (FIG. 3). The first region 120a functions as channel regions of the plurality of memory cells MC, the drain-side select transistor STD, and the source-side select transistor STS in the memory string MSa (FIG. 1). The second region 120b functions as channel regions of the plurality of memory cells MC, the drain-side select transistor STD, and the source-side select transistor STS in the memory string MSb (FIG. 1).

As illustrated in FIG. 4, for example, an impurity region 121 containing N-type impurities such as phosphorus (P) is provided at the upper end of the semiconductor layer 120. The impurity region 121 is connected to the bit line BL extending in the Y direction via a bit line contact BLC made of tungsten (W) or the like.

In the illustrated example, the lower end of the semiconductor layer 120 is connected to the semiconductor substrate 100. In such a case, the semiconductor substrate 100 functions as a portion of the source line SL (FIG. 1), and the semiconductor layer 120 is electrically connected to the control unit CU via the semiconductor substrate 100. However, such a configuration is merely an example, and the specific configuration can be adjusted as appropriate. For example, the lower end of the semiconductor layer 120 may be connected to a wiring, a semiconductor layer, or the like other than the semiconductor substrate 100.

The gate insulation layer 130 includes a tunnel insulating layer 131, a charge storage portion 132, and a block insulating layer 133, which are provided over a range from the semiconductor layer 120 side to the conductive layer 110 side. The tunnel insulating layer 131 includes, for example, silicon oxide ($SiO_2$), silicon oxynitride (SiON), or other insulating layer. For example, as illustrated in FIG. 4, the tunnel insulating layer 131 may extend in the Z direction along the outer peripheral surface of the semiconductor layer 120. It is noted that the tunnel insulating layer 131 may be formed on each side surface of the charge storage portion 132 in the Y direction. The charge storage portion 132 is, for example, a floating gate made of polycrystalline silicon or the like containing N-type impurities such as phosphorus (P) or P-type impurities such as boron (B). However, the charge storage portion 132 may be an insulating charge storage portion containing silicon nitride (SiN) or the like. For example, as illustrated in FIGS. 5 to 7, the block insulating layer 133 includes an insulating metal oxide film 134 made of hafnium silicate (HfSiO) or the like, an insulating film 135 made of silicon oxide ($SiO_2$) or the like, and an insulating metal oxide film 136 made of alumina (AlO) or the like. As illustrated in FIGS. 5 to 7, each layer constituting the block insulating layer 133 covers the side surface, the upper surface, and the lower surface of the charge storage portion 132 on the conductive layer 110 side in the Y direction and both side surfaces in the X direction.

It is noted that, in the examples of FIGS. 5 to 7, a barrier conductive film 113 made of titanium nitride (TiN) or the like is provided between the block insulating layer 133 and the insulating layer 101 and between the block insulating layer 133 and the conductive layer 110. Therefore, as illustrated in FIG. 6, the side surface of the metal film 112 on the trench structure ATc side in the Y direction faces the charge storage portion 132 via the barrier conductive film 111, the barrier conductive film 113, and the block insulating layer 133. In addition, as illustrated in FIG. 7, the side surface of the metal film 112 on the trench structure ATd side in the Y direction faces the charge storage portion 132 via the barrier conductive film 113 and the block insulating layer 133.

[Configuration of Hookup Region $R_{HU}$]

Figure 8:
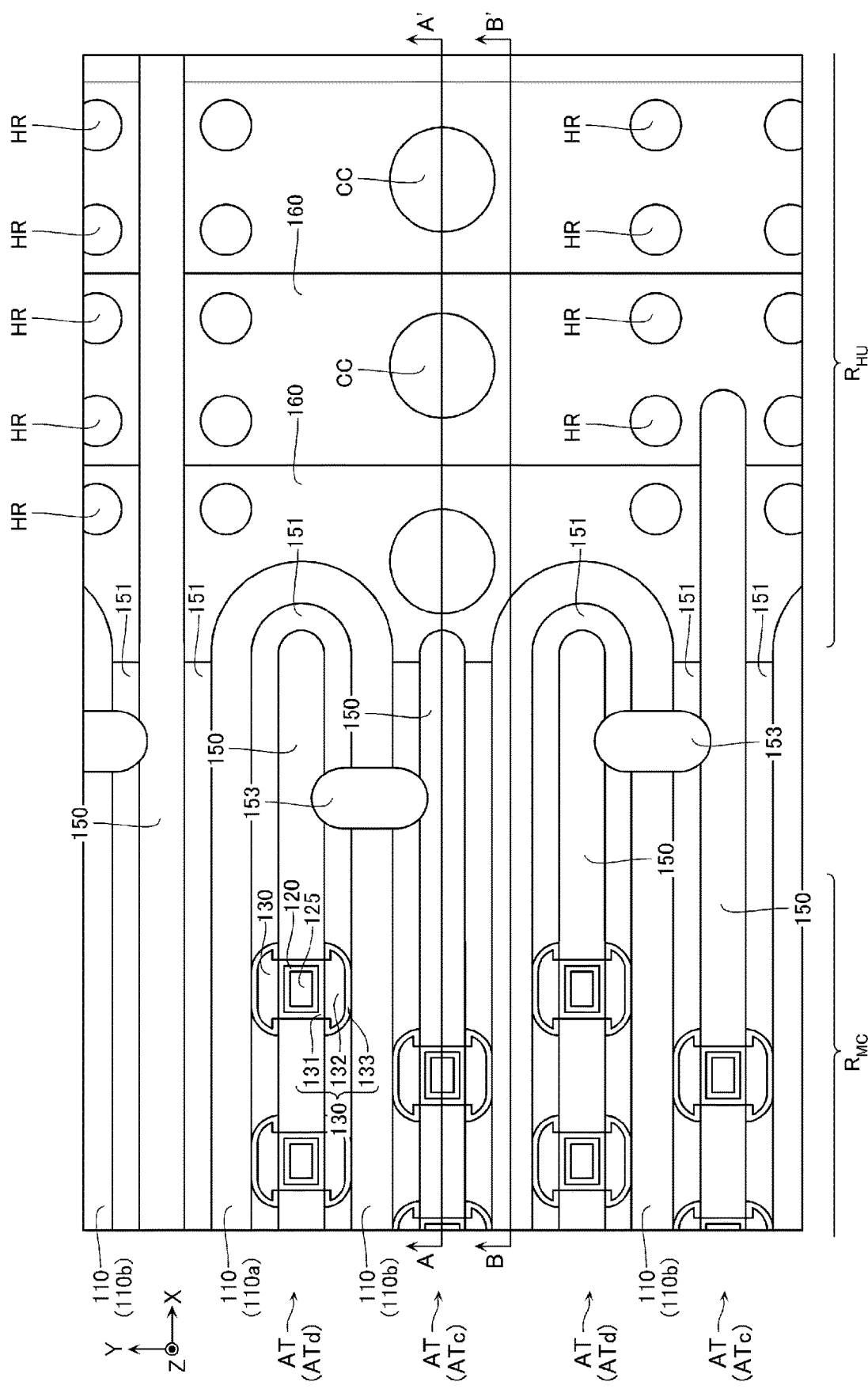
FIG. 8 is a schematic plan view of the semiconductor storage device.
Figure 9:
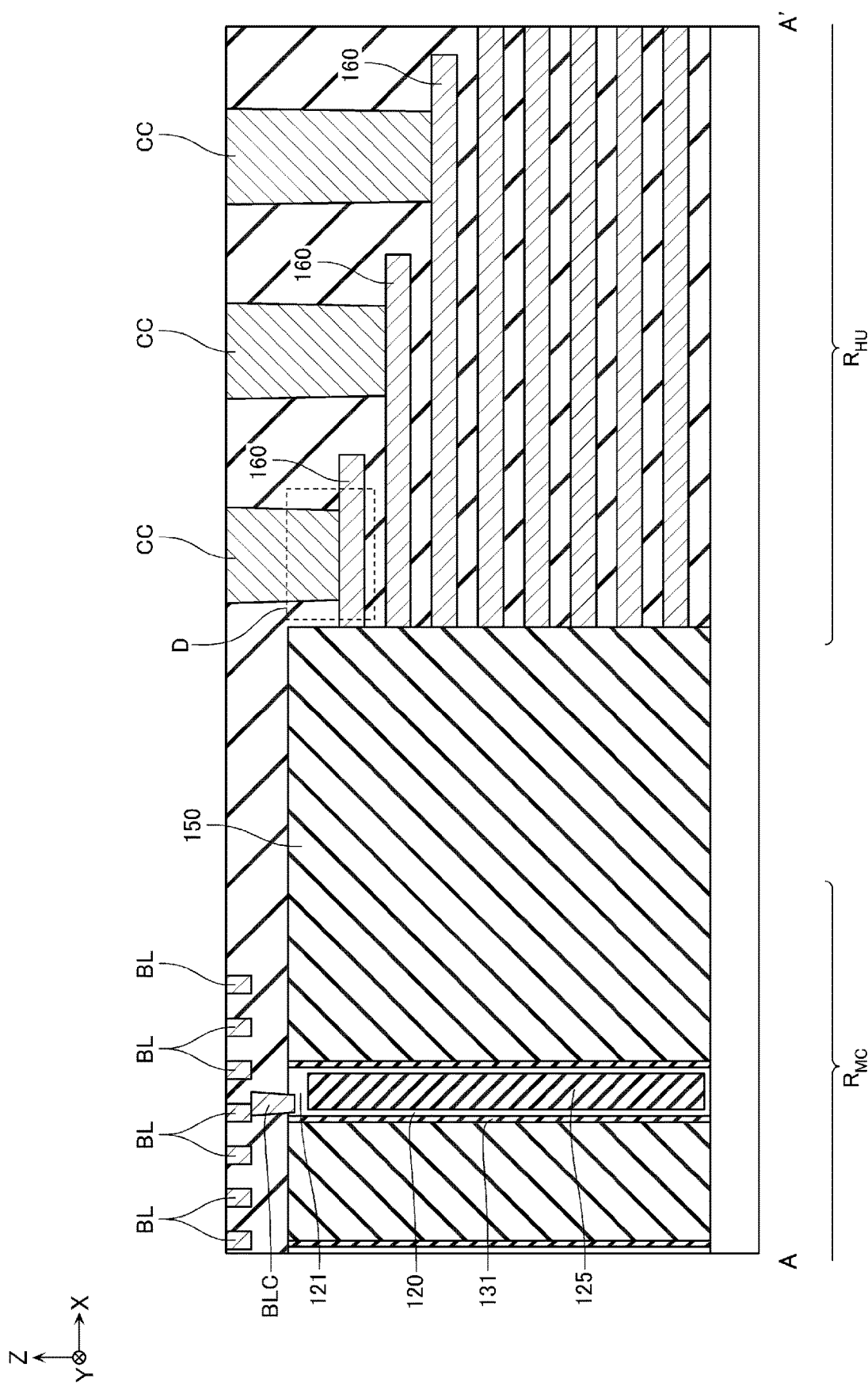
FIG. 9 is a schematic cross-sectional view of the semiconductor storage device.
Figure 10:
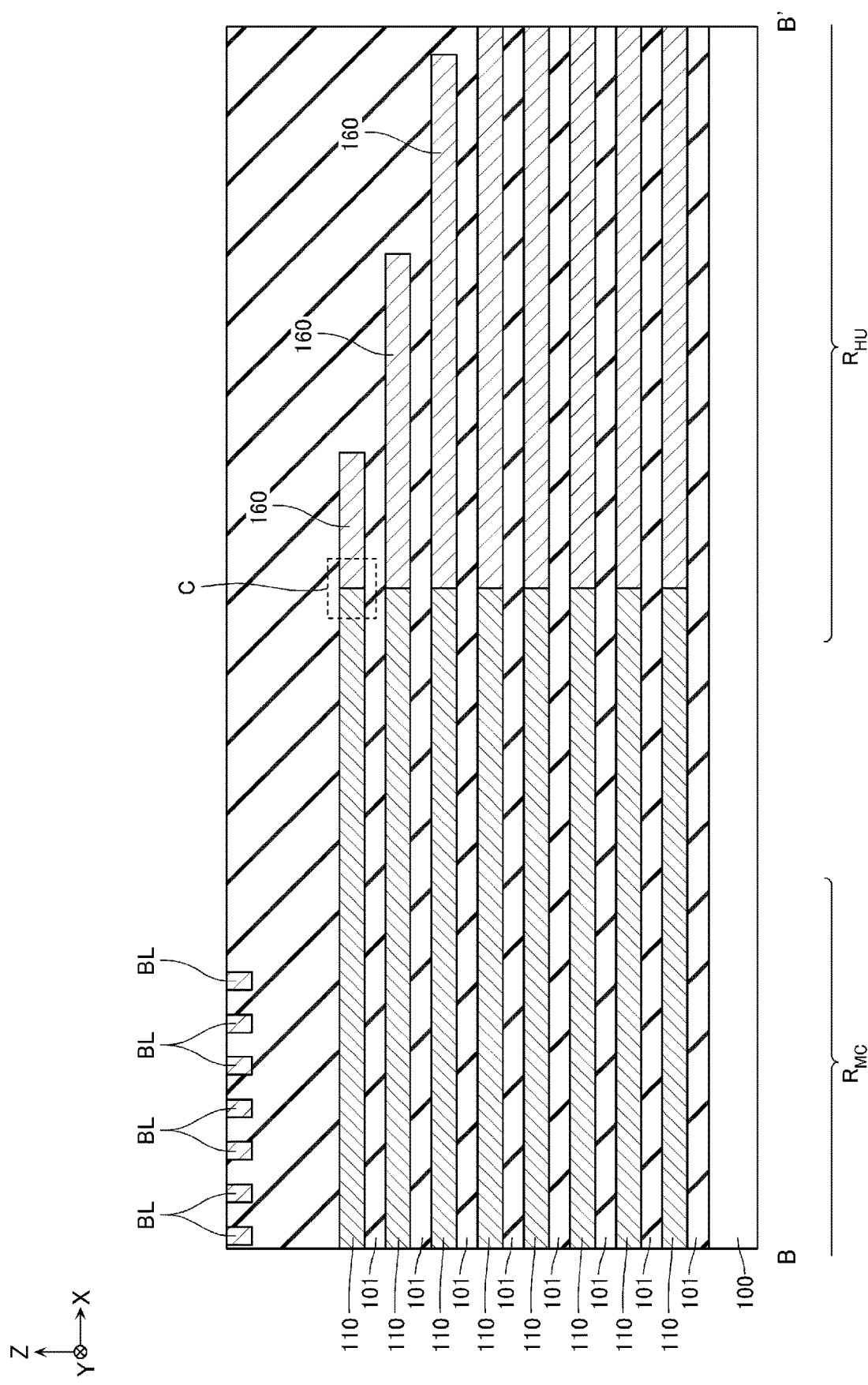
FIG. 10 is a schematic cross-sectional view of the semiconductor storage device.
Figure 11:
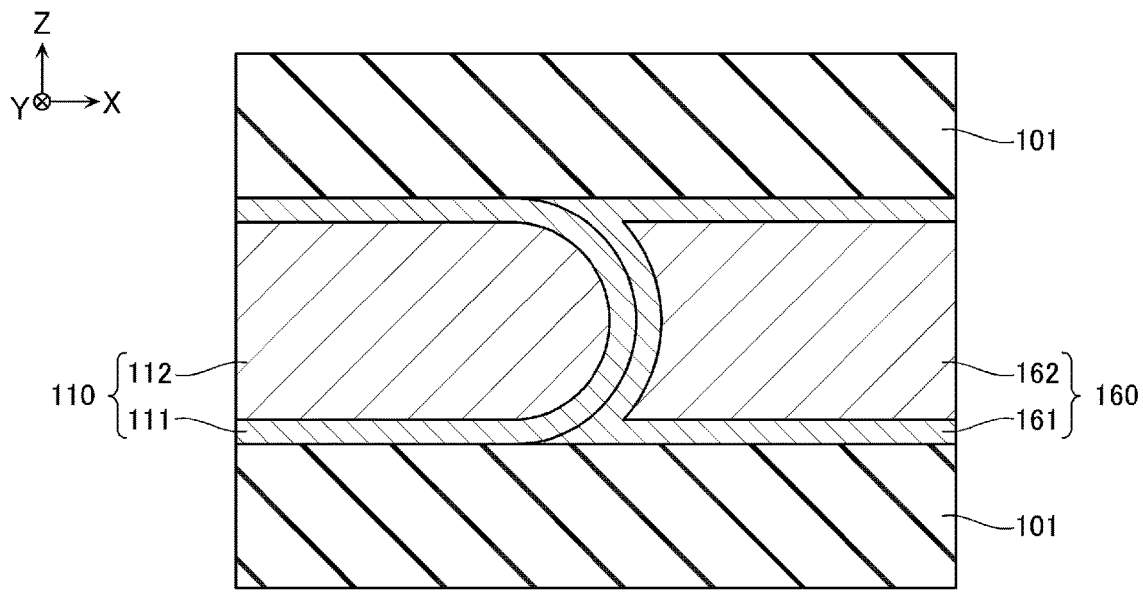
FIG. 11 is a schematic cross-sectional view of the semiconductor storage device.
Figure 12:
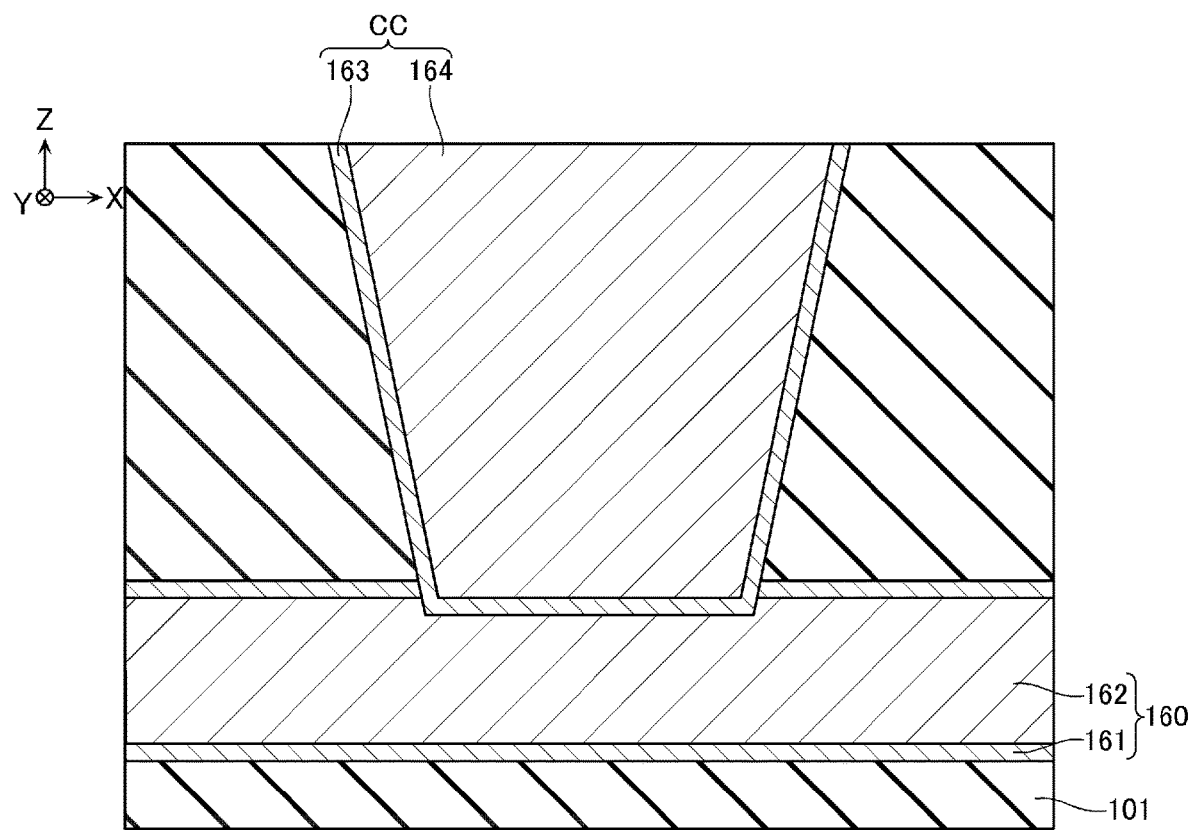
FIG. 12 is a schematic cross-sectional view of the semiconductor storage device.

FIG. 8 is a schematic plan view illustrating a portion of the configuration of the hookup region $R_{HU}$. FIG. 9 is a schematic cross-sectional view when the configuration illustrated in FIG. 8 is taken along a line A-A' and viewed along a direction of an arrow. FIG. 10 is a schematic cross-sectional view when the configuration illustrated in FIG. 8 is taken along a line B-B' and viewed along a direction of an arrow. FIG. 11 is a schematic enlarged view of a portion indicated by C in FIG. 10. FIG. 12 is a schematic enlarged view of a portion indicated by D in FIG. 9.

As illustrated in FIG. 8, in the hookup region $R_{HU}$, the end portion of the insulating layer 150 corresponding to the trench structure ATd in the X direction is covered with the insulating layer 151. In addition, the end portion of the insulating layer 151 in the X direction is covered with the conductive layer 110. In addition, a plurality of conductive layers 160 are provided in the hookup region $R_{HU}$. The end portion of the conductive layer 160 on the memory cell region $R_{MC}$ side in the X direction is connected to the end portions of the plurality of conductive layers 110, and the insulating layer 150 and the insulating layer 151 corresponding to the trench structure ATc in the X direction.

As illustrated in FIG. 10, the conductive layers 160 are arranged in the Z direction and are connected to the end portions of the conductive layers 110 provided at the corresponding height positions in the X direction. For example, as illustrated in FIG. 11, the conductive layer 160 is a stacked film including a barrier conductive film 161 made of titanium nitride (TiN) or the like and a metal film 162 made of tungsten (W) or the like. The metal film 162 in the conductive layer 160 is connected to the metal film 112 in the conductive layer 110 via the barrier conductive film 161 and the barrier conductive film 111.

It is noted that, as illustrated with reference to FIG. 2, the hookup regions $R_{HU}$ one by one are provided on one side and the other side of the memory cell array region $R_{MCA}$ in the X direction. In the example of FIG. 8, the conductive layers 160 in the hookup region $R_{HU}$ disposed on the right side in FIGS. 2 and 8 are connected to the conductive layers 110a. In addition, although the illustration is omitted, the conductive layers 160 in the hookup region $R_{HU}$ disposed on the left side in FIGS. 2 and 8 are connected to the conductive layers 110b. It is noted that FIG. 8 illustrates insulating layers 153 made of silicon oxide ($SiO_2$) or the like for electrically insulating the conductive layers 160 and the conductive layers 110b in the hookup region $R_{HU}$. For example, the insulating layers 153 extend in the Z direction, are in contact with the plurality of conductive layers 110a arranged in the Z direction on one side surface in the X direction, and are in contact with the plurality of conductive layers 110b arranged in the Z direction on the other side surface in the X direction.

In addition, as illustrated in FIG. 8, a plurality of contacts CC are provided in the hookup region $R_{HU}$. As illustrated in FIG. 9, the plurality of contacts CC extend in the Z direction and are connected to the upper surface of the conductive layer 160 at the lower end. The contact CC is, for example, as illustrated in FIG. 12, a stacked film including a barrier conductive film 163 made of titanium nitride (TiN) or the like and a metal film 164 made of tungsten (W) or the like. The metal film 164 in the contact CC is connected to the metal film 162 in the conductive layer 160 via the barrier conductive film 163 in the contact CC. It is noted that the conductive layers 110 are connected to the control unit CU (FIG. 1) via the conductive layers 160 and the contacts CC.

In addition, as illustrated in FIG. 8, a support structure HR made of silicon oxide ($SiO_2$) or the like that supports the conductive layers 160 is provided in the hookup region $R_{HU}$. The support structure HR extends in the Z direction and is in contact with the barrier conductive film 161 of the plurality of conductive layers 160 arranged in the Z direction on the outer peripheral surface.

[Manufacturing Method]

Figure 48:
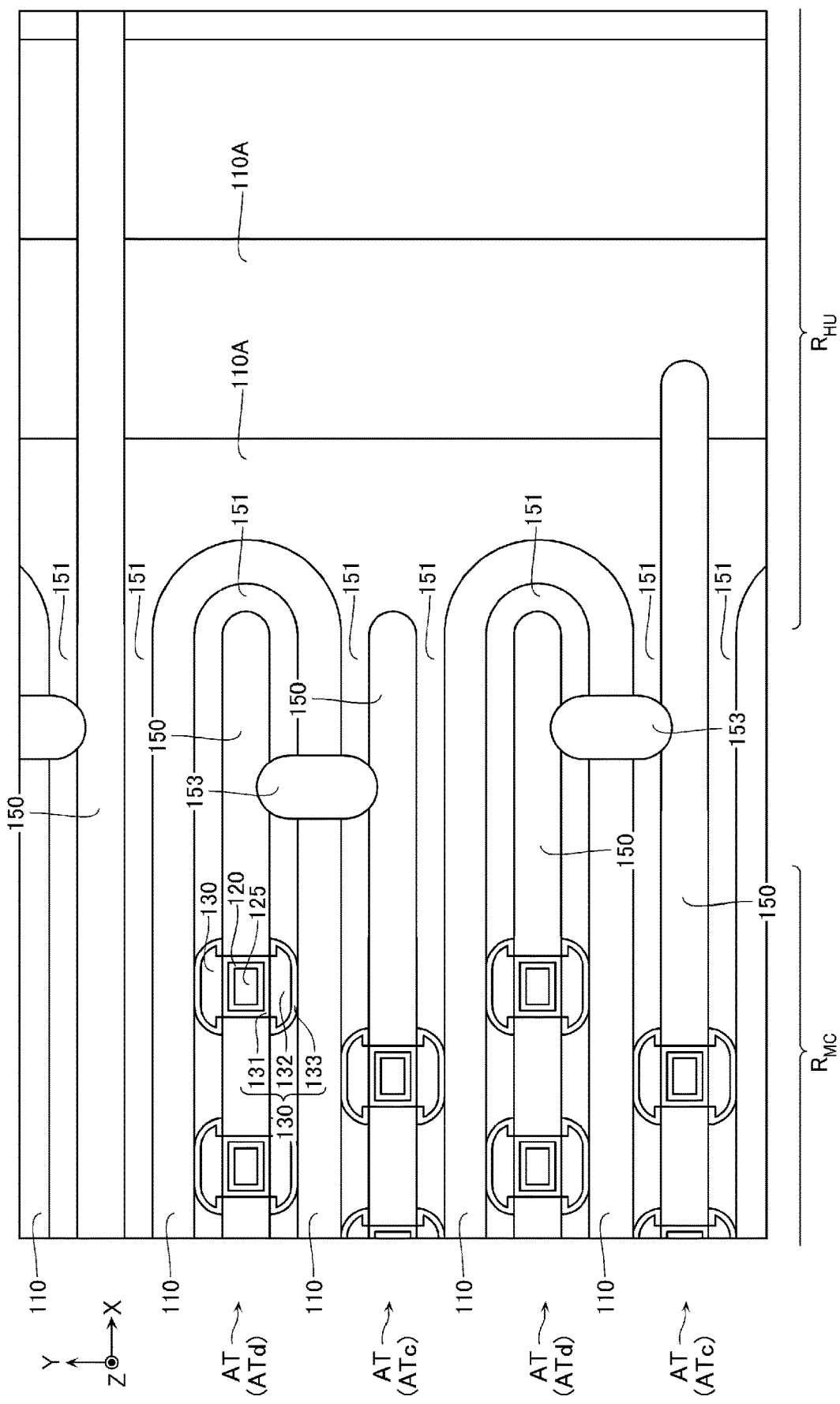
FIG. 48 is a schematic plan view illustrating the manufacturing method.
Figure 49:
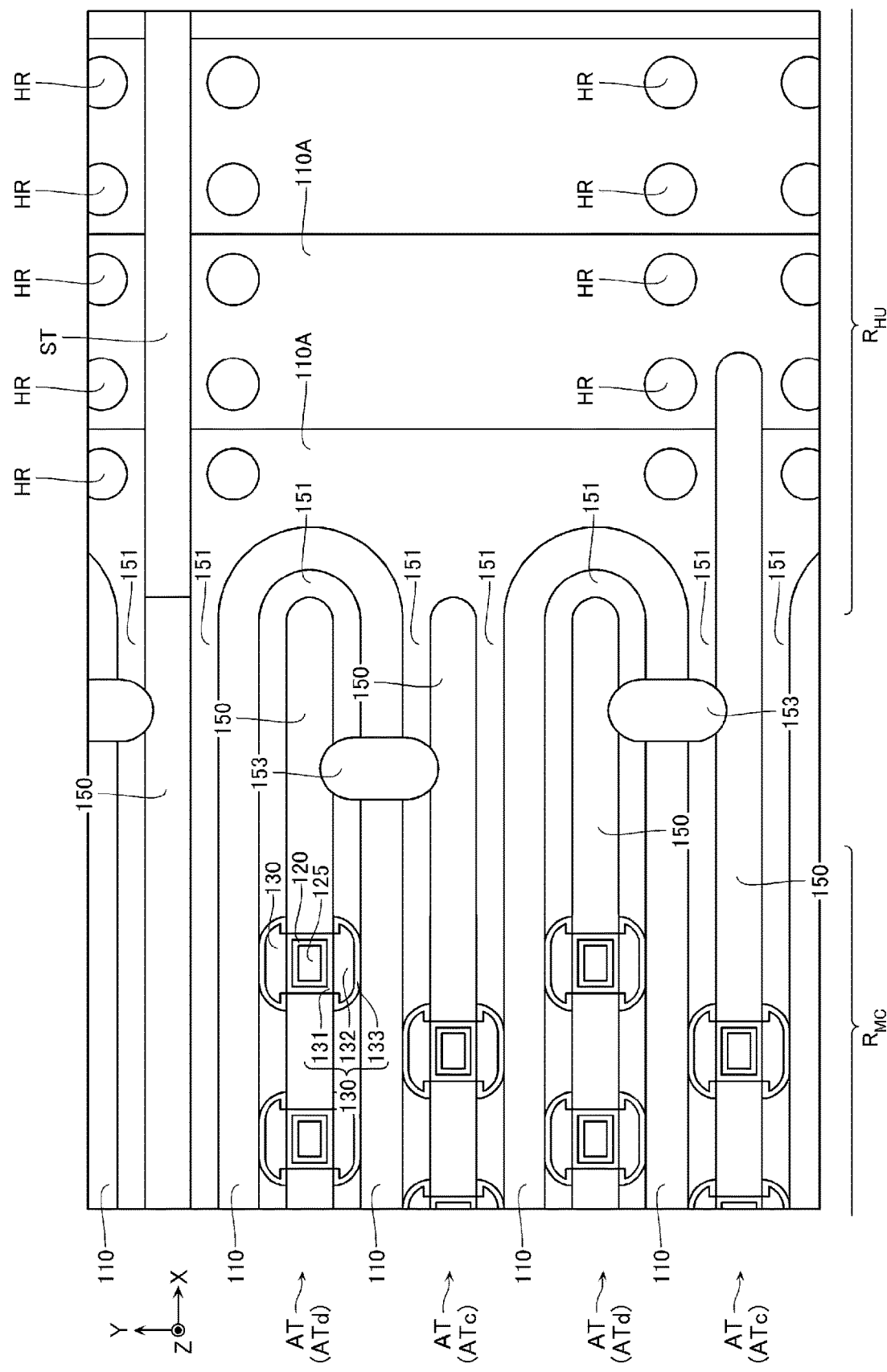
FIG. 49 is a schematic plan view illustrating the manufacturing method.

Next, a method of manufacturing the semiconductor storage device according to the embodiment will be described with reference to FIGS. 13 to 52. FIGS. 14, 16, 18, 20, 22, 24, 30, 32, 34, 36, and 44 are schematic XY sectional views illustrating the manufacturing method and correspond to the portions illustrated in FIG. 3. FIGS. 15, 17, 19, 21, 23, 25, 31, 33, 35, 37, and 45 to 47 are schematic YZ cross-sectional views illustrating the manufacturing method and correspond to the portions illustrated in FIG. 4. FIGS. 26, 38, 40, and 42 are schematic cross-sectional views illustrating the manufacturing method and correspond to the portions illustrated in FIG. 6. FIGS. 27 to 29, 39, 41, and 43 are schematic cross-sectional views illustrating the manufacturing method and correspond to the portions illustrated in FIG. 7. FIGS. 48 and 49 are schematic plan views illustrating the manufacturing method and correspond to the portions illustrated in FIG. 8. FIGS. 13 and 50 to 52 are schematic cross-sectional views illustrating the manufacturing method and correspond to the portions illustrated in FIG. 10.

Figure 13:
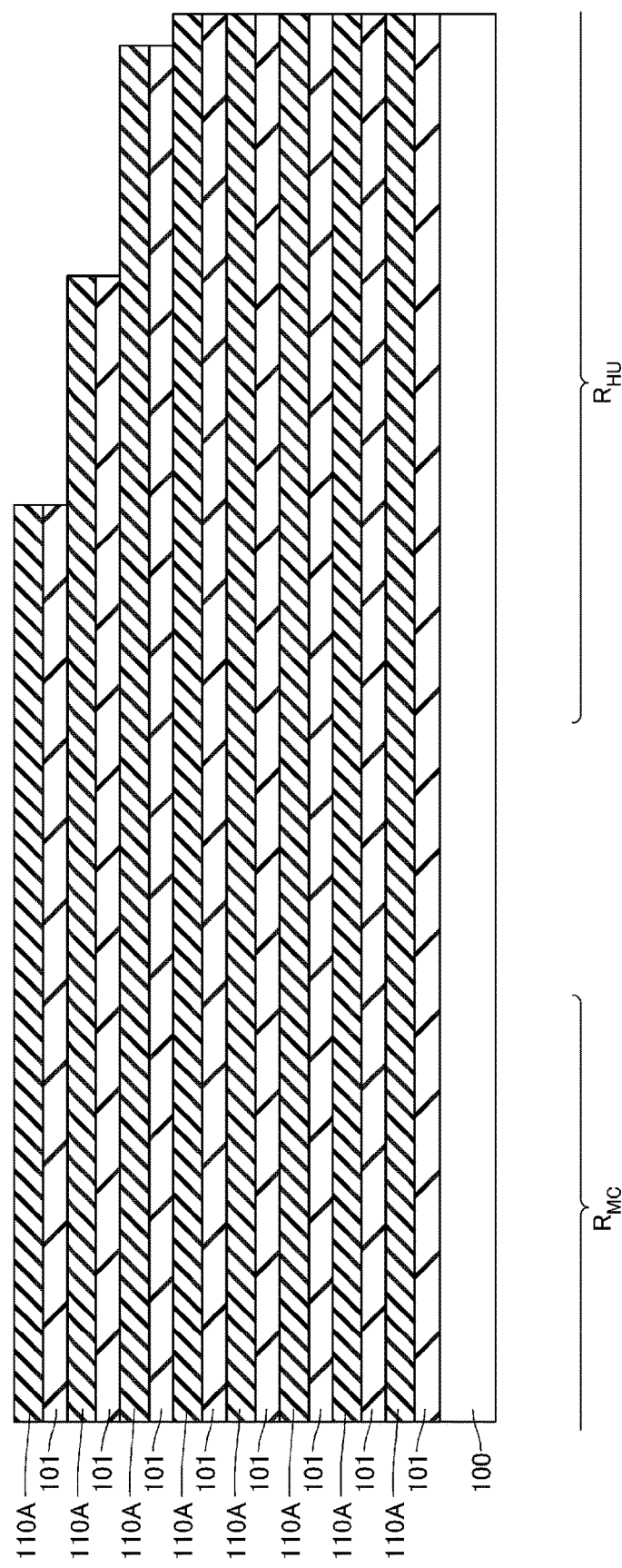
FIG. 13 is a schematic cross-sectional view illustrating a method of manufacturing the semiconductor storage device.

As illustrated in FIG. 13, in the same manufacturing method, the plurality of insulating layers 101 and sacrifice layers 110A are alternately stacked on the semiconductor substrate 100 (not illustrated). The sacrifice layer 110A is made of, for example, silicon nitride ($Si_3N_4$) or the like. This process is performed, for example, by a method such as chemical vapor deposition (CVD).

Next, as illustrated in FIG. 13, a portion of the portion of the stacked structure including the plurality of insulating layers 101 and the sacrifice layers 110A provided in the hookup region $R_{HU}$ is removed to form a substantially stepped structure. In this process, for example, the resist covering a portion of the memory cell region $R_{MC}$ and the hookup region $R_{HU}$ is formed above the stacked structure. Next, a portion of the sacrifice layers 110A is selectively removed by a method such as reactive ion etching (RIE). Next, a portion of the insulating layers 101 is selectively removed by a method such as RIE. Next, a portion of the resist is removed by isotropic etching such as wet etching to expose a portion of the upper surface of the stacked structure. Hereinafter, the removing of a portion of the sacrifice layers 110A, the removing of a portion of the insulating layers 101, and the remaining of a portion of the resist are repeatedly performed.

Figure 14:
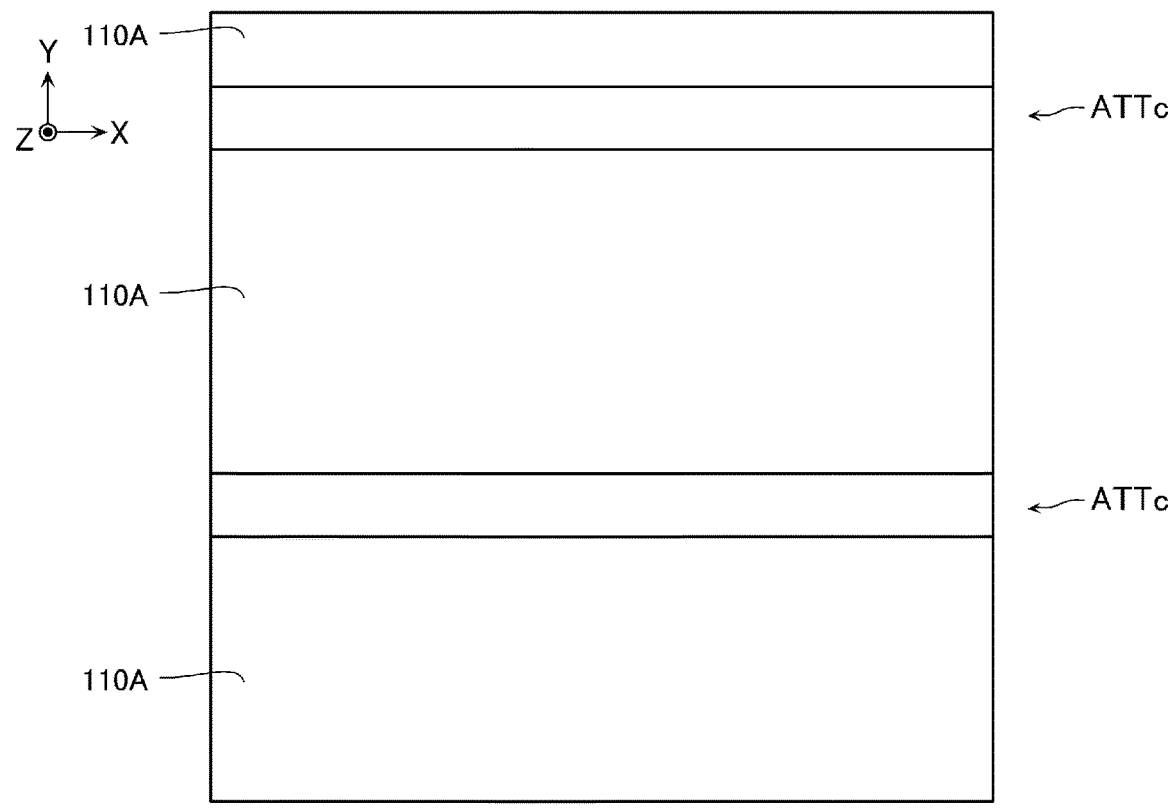
FIG. 14 is a schematic cross-sectional view illustrating the manufacturing method.
Figure 15:
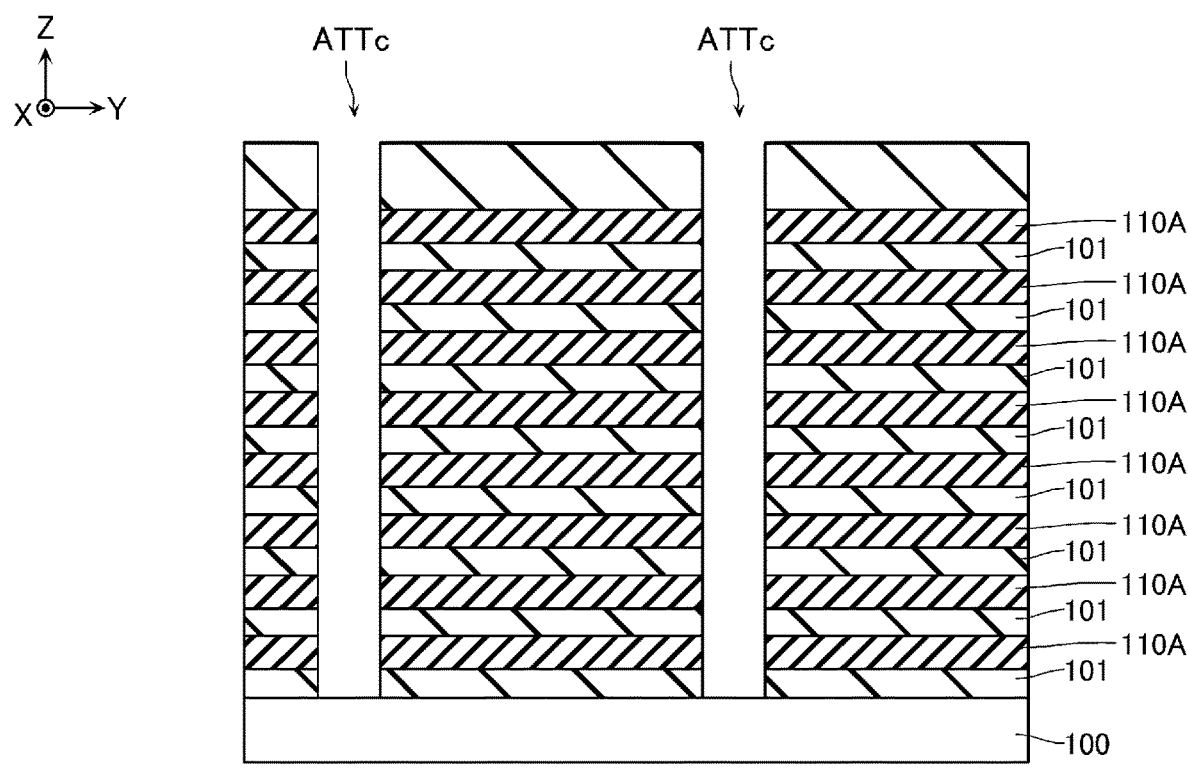
FIG. 15 is a schematic cross-sectional view illustrating the manufacturing method.

Next, as illustrated in FIGS. 14 and 15, a trench ATTc is formed in the stacked structure including the insulating layers 101 and the sacrifice layers 110A. In this process, for example, an insulating layer having an opening in a portion corresponding to the trench structure ATc is formed on the upper surface of the structure illustrated in FIG. 13, and RIE or the like is performed by using the insulating layer as a mask. As illustrated in FIG. 14, the trench ATTc extends in the X direction. In addition, as illustrated in FIG. 15, the trench ATTc extends in the Z direction and penetrates the plurality of insulating layers 101 and the sacrifice layers 110A to separate these components in the Y direction.

Figure 16:
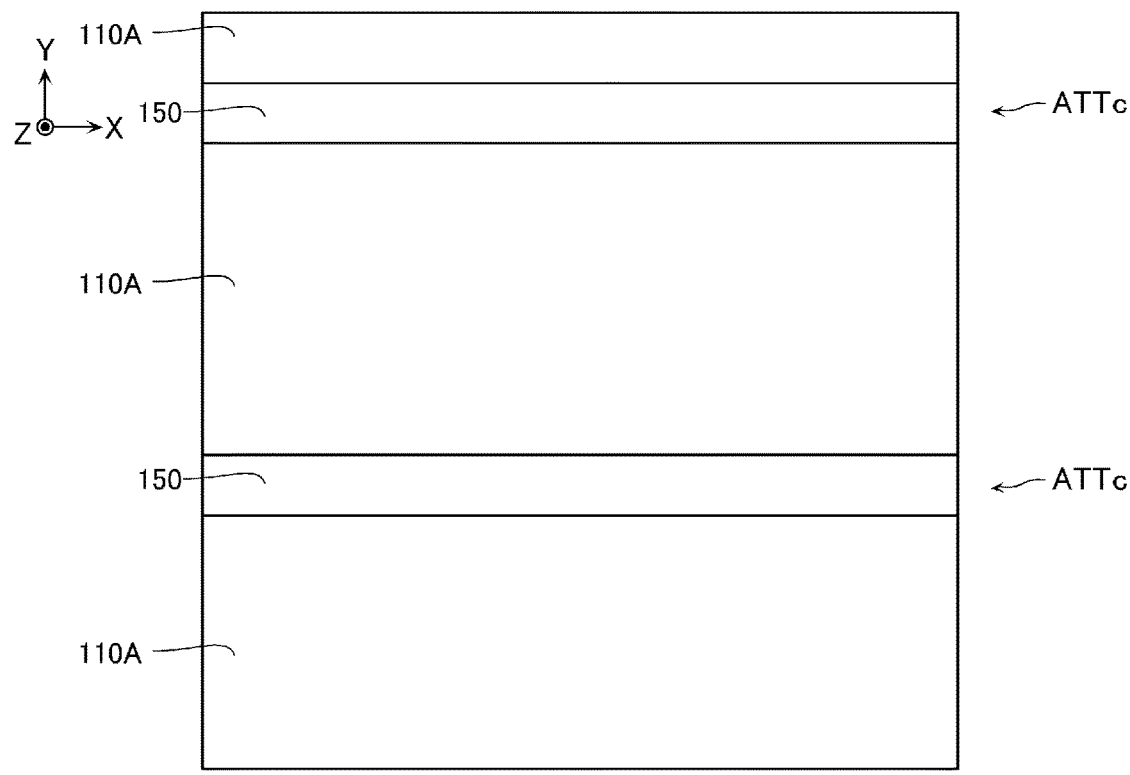
FIG. 16 is a schematic cross-sectional view illustrating the manufacturing method.
Figure 17:
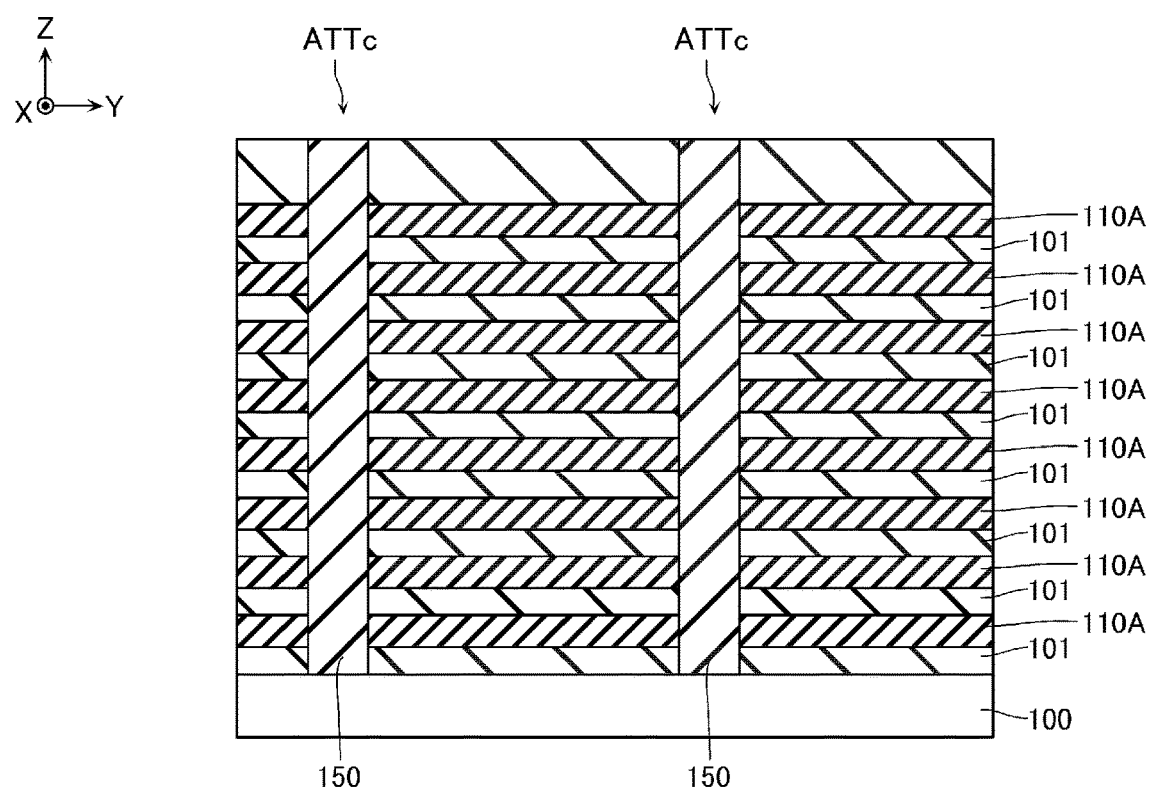
FIG. 17 is a schematic cross-sectional view illustrating the manufacturing method.

Next, as illustrated in FIGS. 16 and 17, the insulating layer 150 is formed inside the trench ATTc. This process is performed by, for example, a method such as CVD.

Figure 18:
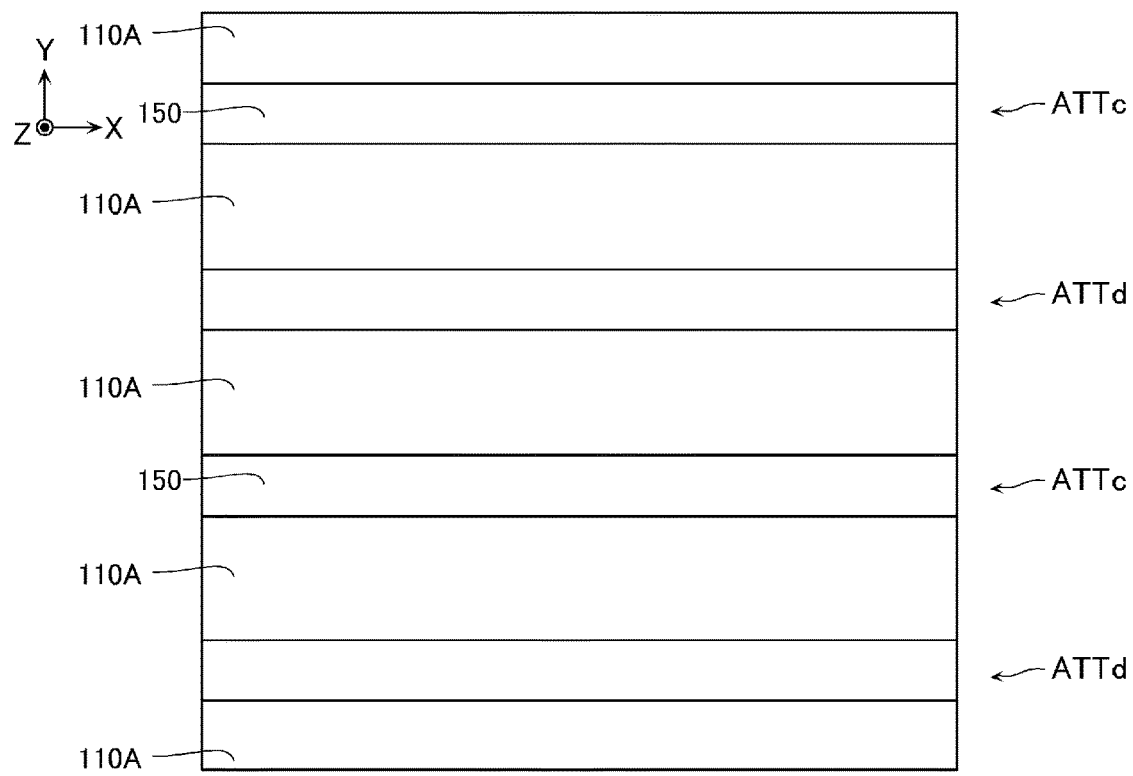
FIG. 18 is a schematic cross-sectional view illustrating the manufacturing method.
Figure 19:
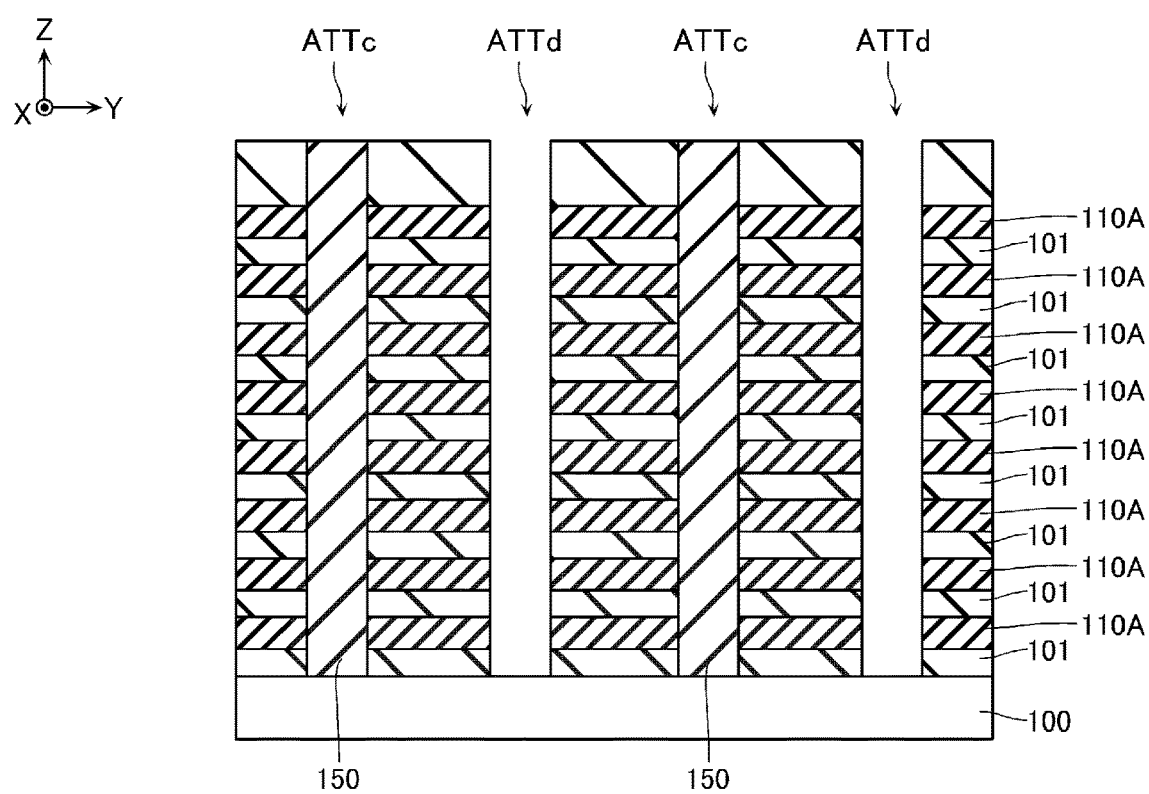
FIG. 19 is a schematic cross-sectional view illustrating the manufacturing method.

Next, as illustrated in FIGS. 18 and 19, a trench ATTd is formed in the stacked structure including the insulating layer 101 and the sacrifice layer 110A. In this process, for example, an insulating layer having an opening in a portion corresponding to the trench structure ATd is formed on the upper surface of the structure illustrated in FIGS. 16 and 17, and RIE or the like is performed by using the insulating layer as a mask. As illustrated in FIG. 18, the trench ATTd extends in the X direction. In addition, as illustrated in FIG. 19, the trench ATTd extends in the Z direction and penetrates the plurality of insulating layers 101 and the sacrifice layers 110A to separate these components in the Y direction.

Figure 20:
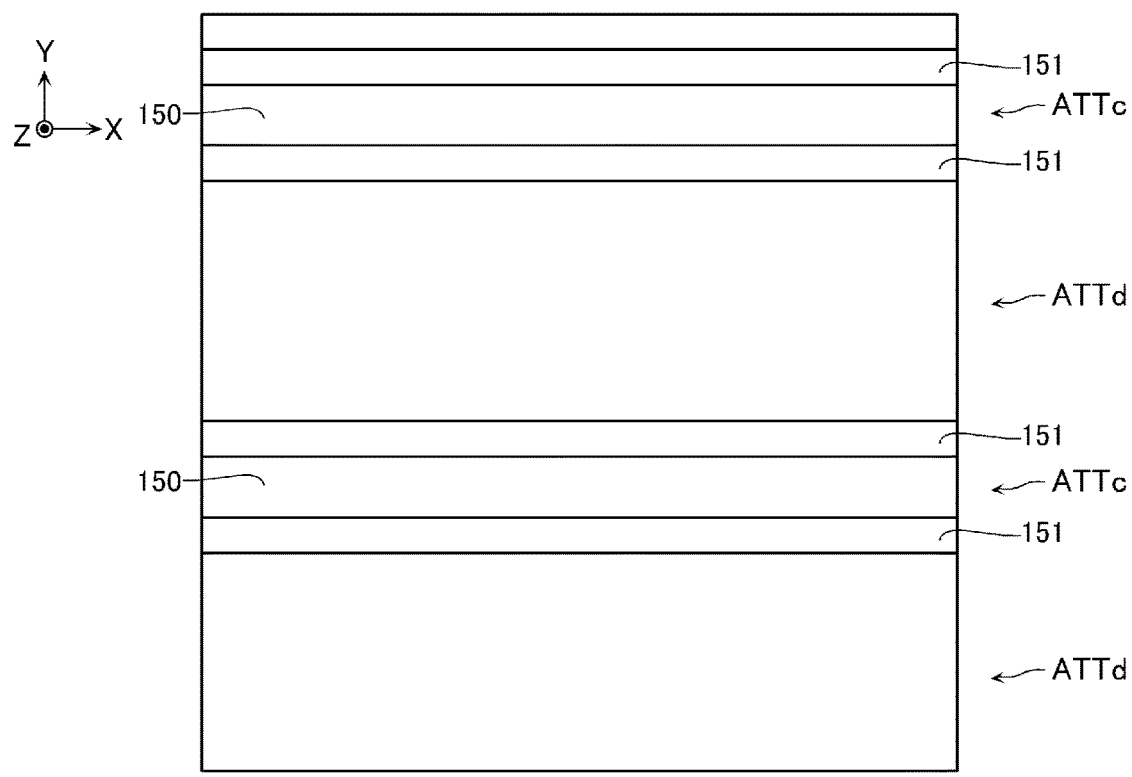
FIG. 20 is a schematic cross-sectional view illustrating the manufacturing method.
Figure 21:
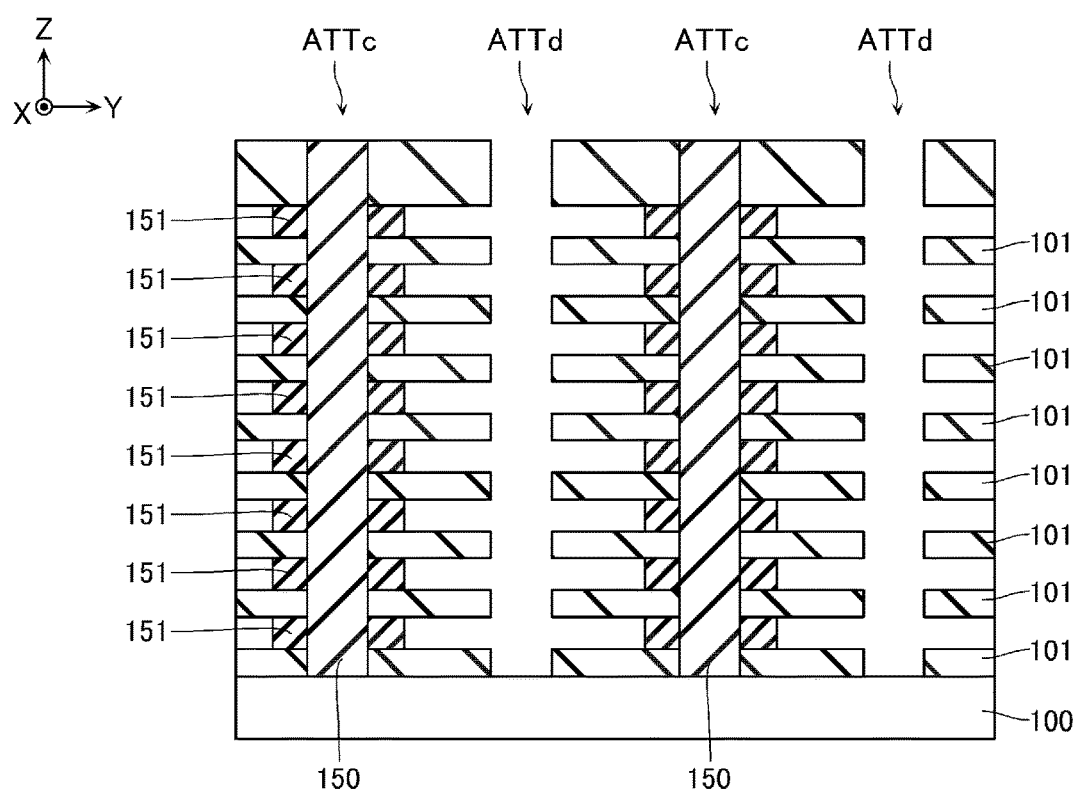
FIG. 21 is a schematic cross-sectional view illustrating the manufacturing method.

Next, as illustrated in FIGS. 20 and 21, a portion of the plurality of sacrifice layers 110A is removed through the trench ATTd. This process is performed, for example, by wet etching or the like. It is noted that, in this process, a portion of the sacrifice layer 110A remains on the side surface of the insulating layer 150 formed inside the trench ATTc. The portion of the sacrifice layer 110A remaining in this process becomes the insulating layer 151 corresponding to the trench structure ATc. In addition, in this process, only the portion of the sacrifice layer 110A provided in the memory cell region $R_{MC}$ is removed.

Figure 22:
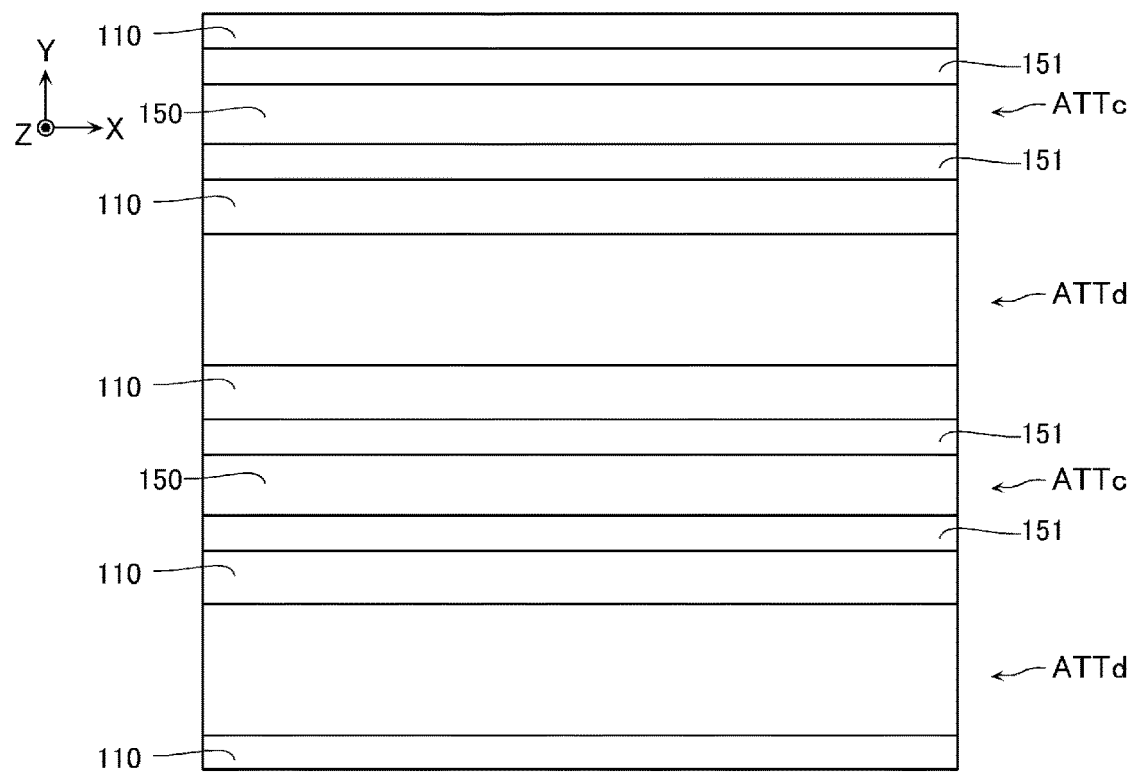
FIG. 22 is a schematic cross-sectional view illustrating the manufacturing method.
Figure 23:
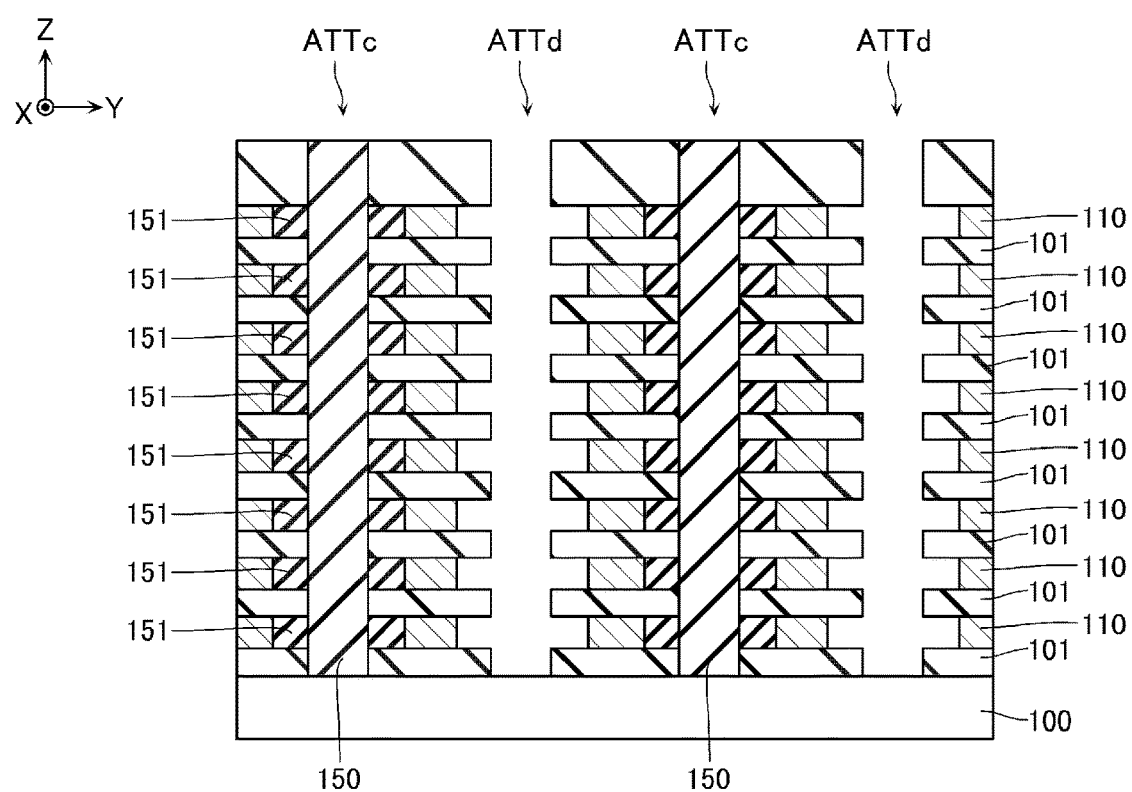
FIG. 23 is a schematic cross-sectional view illustrating the manufacturing method.

Next, as illustrated in FIGS. 22 and 23, the conductive layer 110 is formed on the upper and lower surfaces of the insulating layer 101 through the trench ATTd. In this process, for example, the conductive layer 110 is formed by CVD and a portion of the conductive layer 110 is removed by wet etching or the like.

Figure 24:
FIG. 24 is a schematic cross-sectional view illustrating the manufacturing method.
Figure 25:
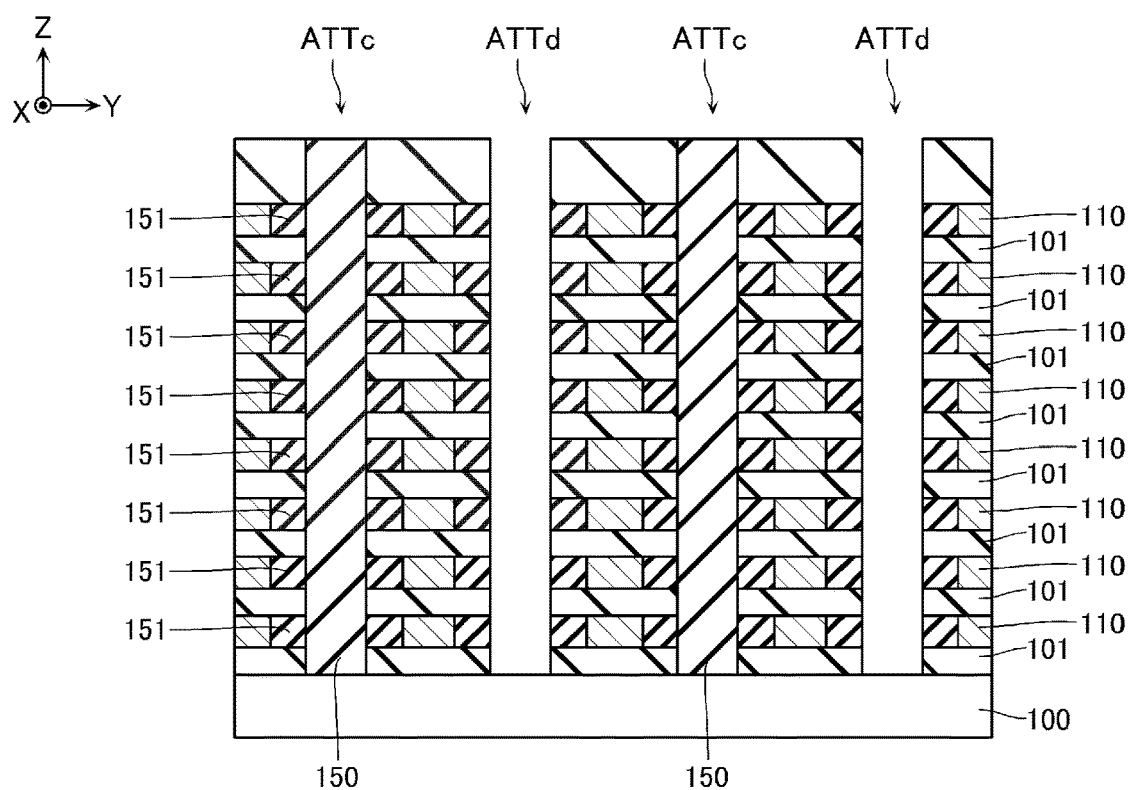
FIG. 25 is a schematic cross-sectional view illustrating the manufacturing method.

Next, as illustrated in FIGS. 24 and 25, the insulating layer 151 is formed on the side surface of the conductive layer 110 in the Y direction through the trench ATTd. In this process, for example, the insulating layer 151 is formed by CVD, and a portion of the insulating layer 151 is removed by wet etching or the like.

Figure 26:
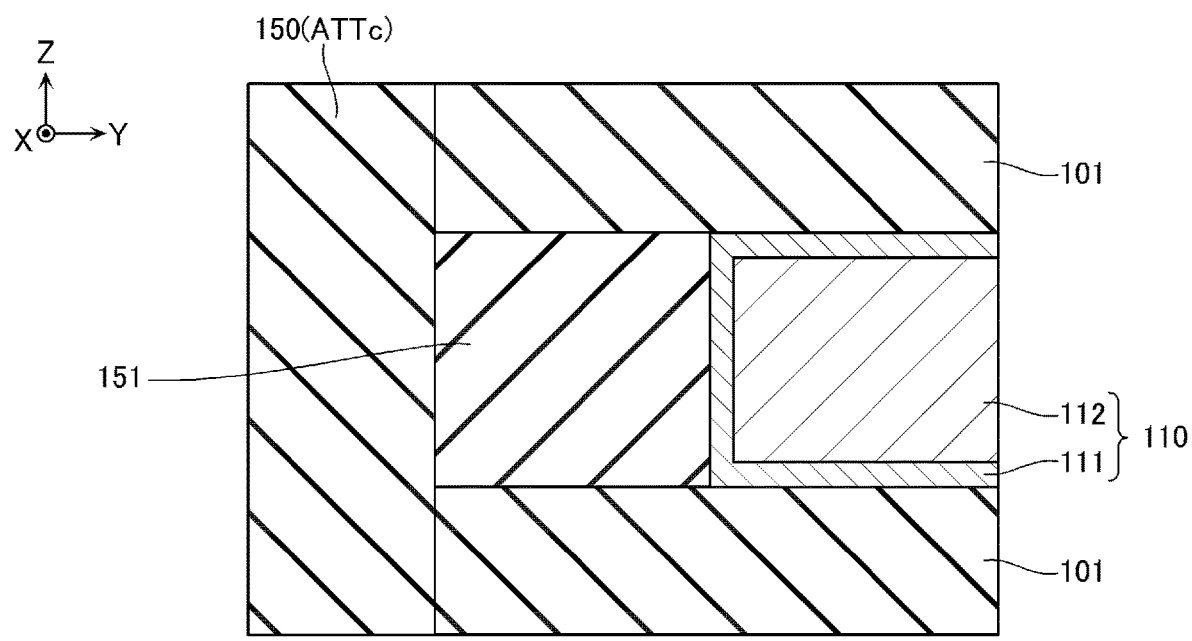
FIG. 26 is a schematic cross-sectional view illustrating the manufacturing method.
Figure 27:
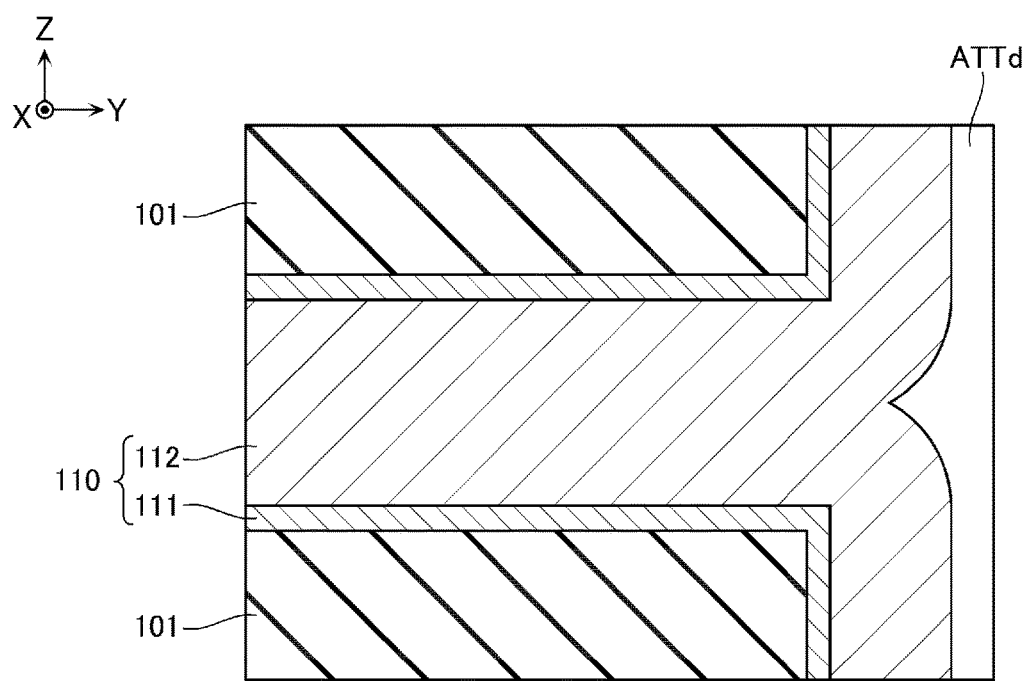
FIG. 27 is a schematic cross-sectional view illustrating the manufacturing method.
Figure 28:
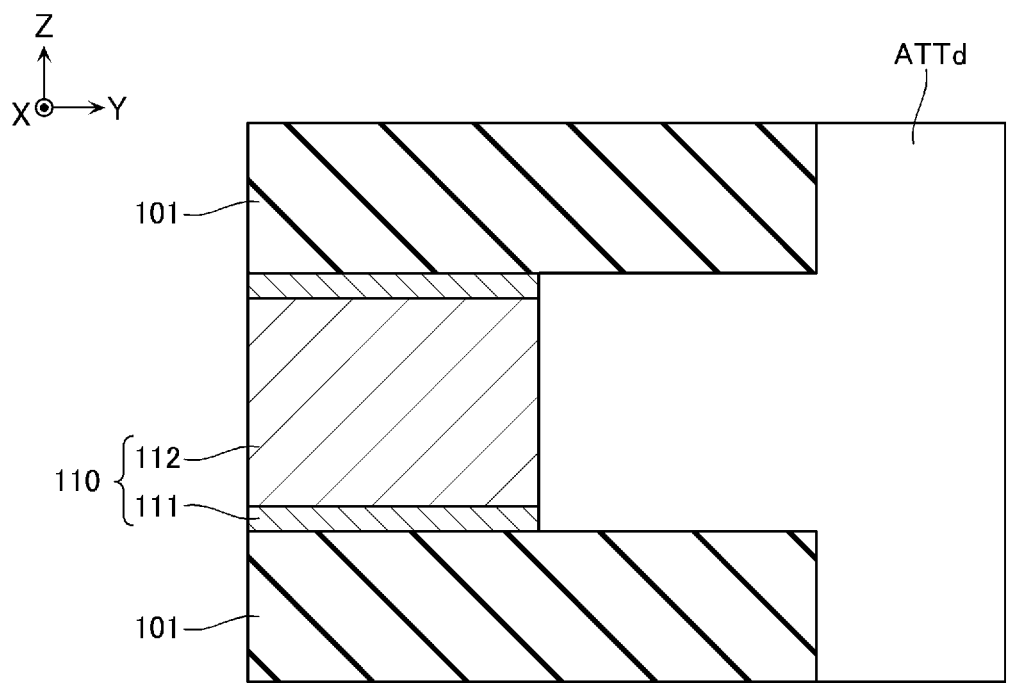
FIG. 28 is a schematic cross-sectional view illustrating the manufacturing method.
Figure 29:
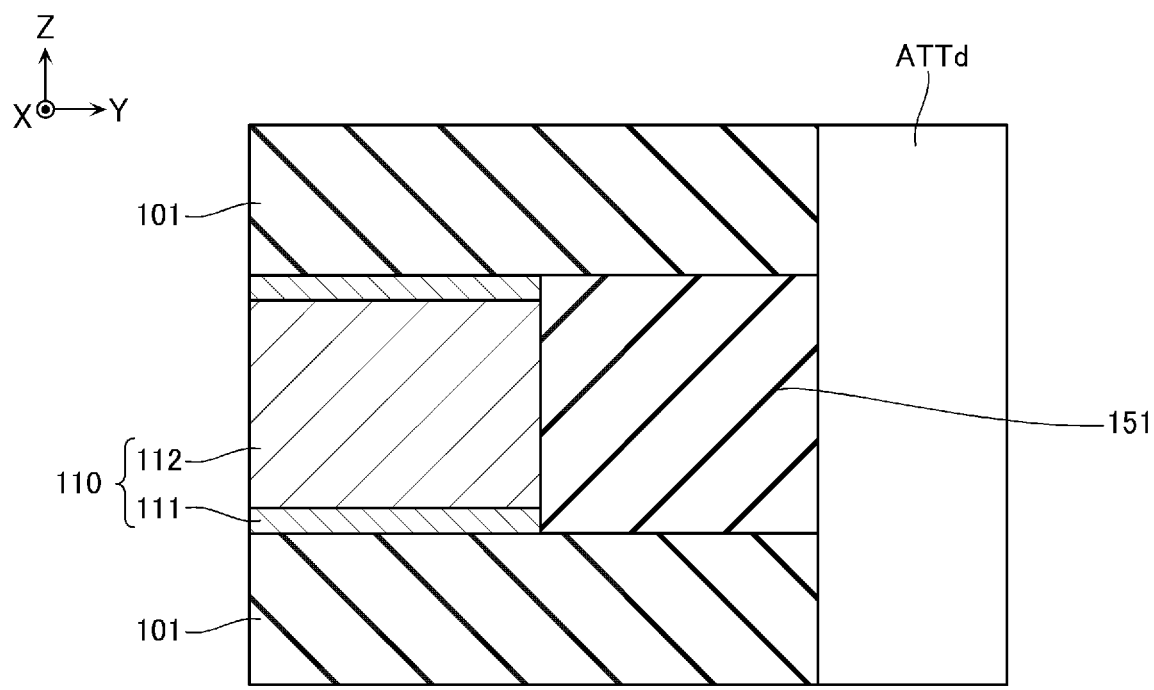
FIG. 29 is a schematic cross-sectional view illustrating the manufacturing method.

It is noted that, in the processes with reference to FIGS. 22 and 23, for example, as illustrated in FIGS. 26 and 27, the barrier conductive film 111 is formed on the portion exposed through the trench ATTd, that is, the upper and lower surfaces of the insulating layer 101, the side surface of the insulating layer 101 in the Y direction and, the side surface of the insulating layer 151 in the Y direction, and after that, and then the metal film 112 is formed. In this process, the barrier conductive film 111 is formed on the side surface of the insulating layer 151 corresponding to the trench structure ATc in the Y direction. Next, as illustrated in FIG. 28, in the barrier conductive film 111 and the metal film 112, the portion formed on the side surface of the insulating layer 101 in the Y direction is removed through the trench ATTd. Next, as illustrated in FIG. 29, the insulating layer 151 corresponding to the trench structure ATd is formed on the side surface of the conductive layer 110 in the Y direction. In this process, the insulating layer 151 corresponding to the trench structure ATd is formed on the side surface of the metal film 112 of the conductive layer 110 in the Y direction without passing through the barrier conductive film 111.

Figure 30:
FIG. 30 is a schematic cross-sectional view illustrating the manufacturing method.
Figure 31:
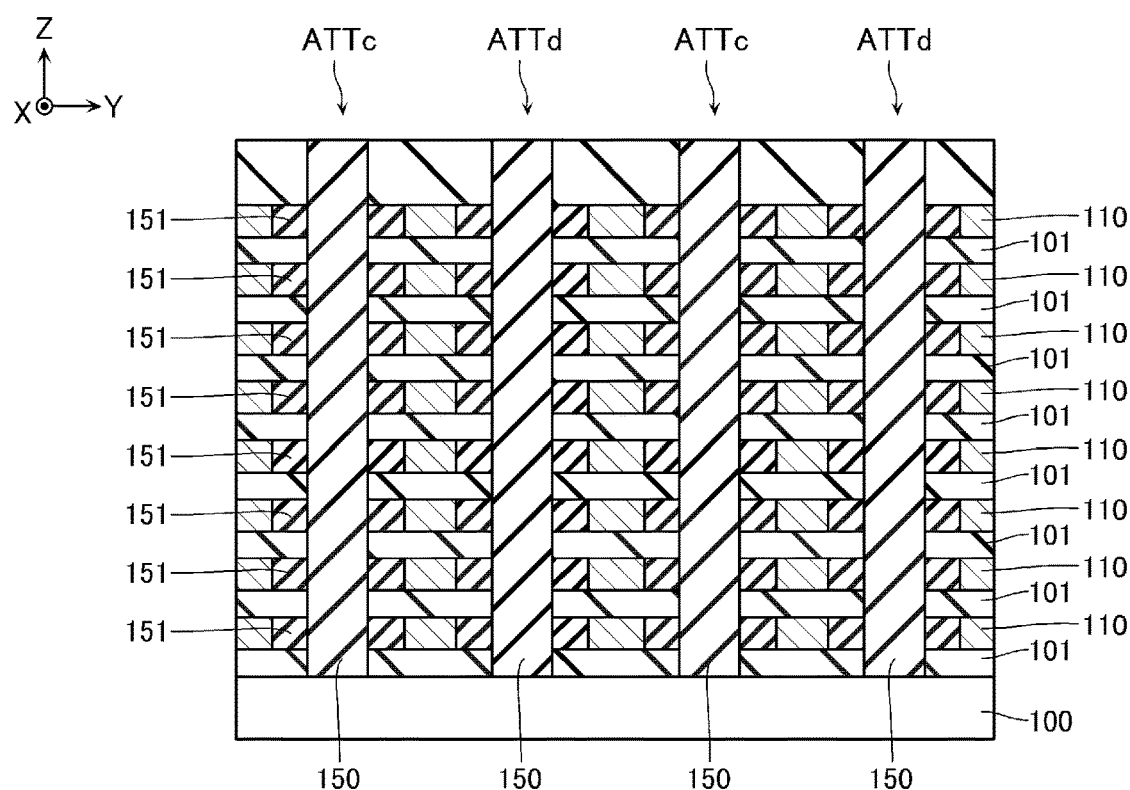
FIG. 31 is a schematic cross-sectional view illustrating the manufacturing method.

Next, as illustrated in FIGS. 30 and 31, the insulating layer 150 is formed inside the trench ATTd. This process is performed by, for example, a method such as CVD.

Figure 32:
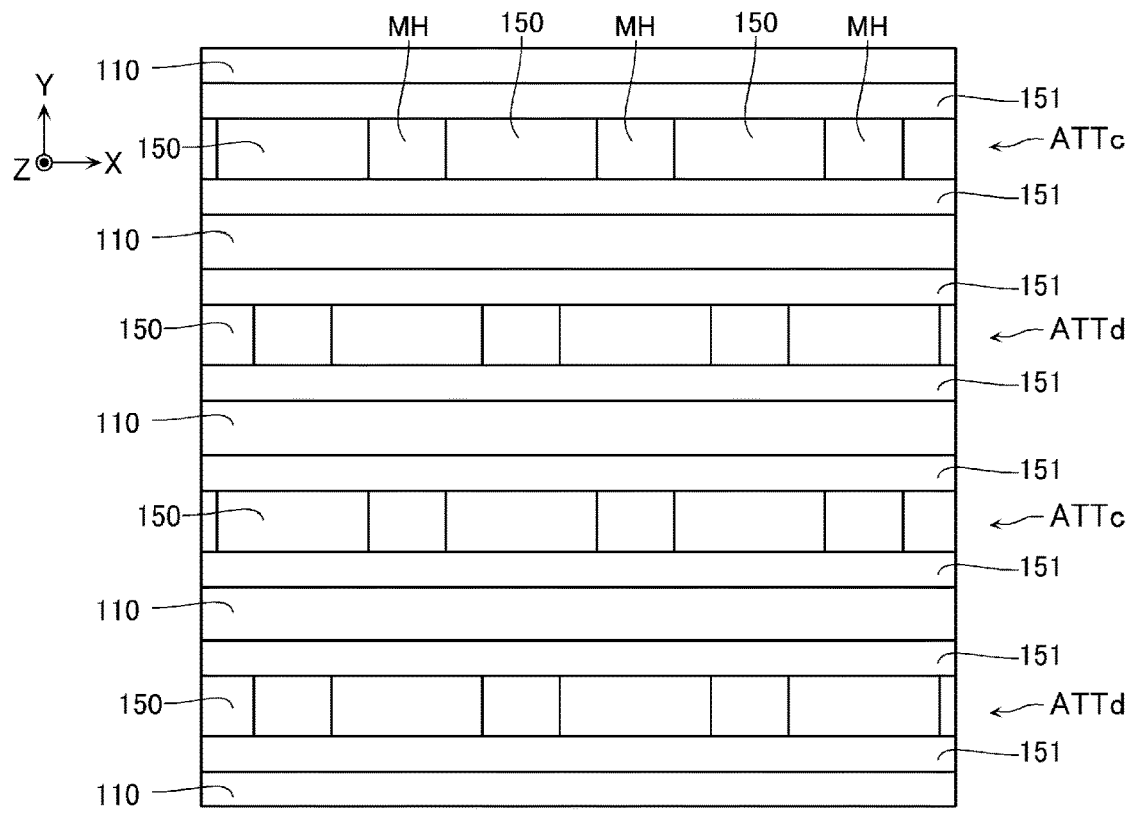
FIG. 32 is a schematic cross-sectional view illustrating the manufacturing method.
Figure 33:
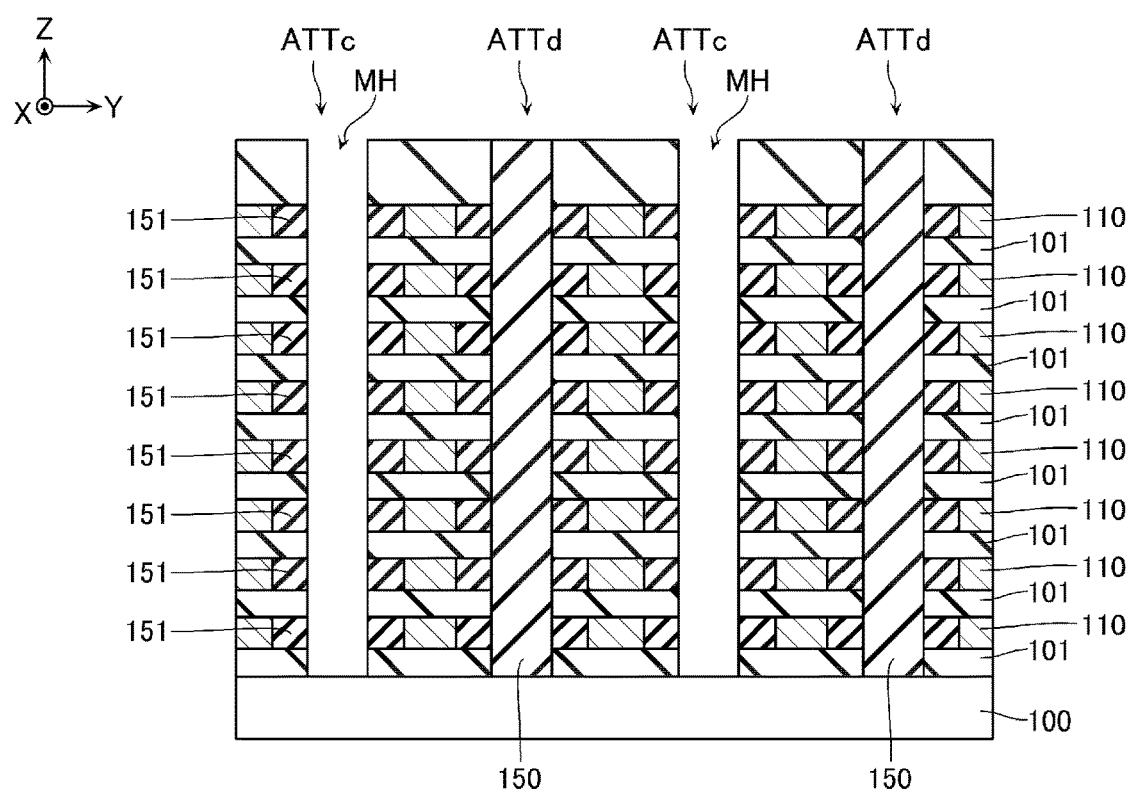
FIG. 33 is a schematic cross-sectional view illustrating the manufacturing method.

Next, as illustrated in FIGS. 32 and 33, a memory hole MH is formed in the insulating layer 150 in the trench ATTc and the trench ATTd. In this process, for example, an insulating layer having an opening in a portion corresponding to the semiconductor layer 120 is formed on the upper surface of the structure illustrated in FIGS. 30 and 31, and RIE or the like is performed by using the insulating layer as a mask. As illustrated in FIGS. 32 and 33, the plurality of memory holes MH are arranged in the X direction along the trenches ATTc and ATTd. In addition, the position of the memory hole MH formed in the trench ATTc in the X direction is different from the position of the memory hole MH formed in the trench ATTd in the X direction. In addition, as illustrated in FIG. 33, the memory hole MH extends in the Z direction and exposes the side surfaces of the plurality of insulating layers 101 and the insulating layer 151 in the Y direction and the upper surface of the semiconductor substrate 100.

Figure 34:
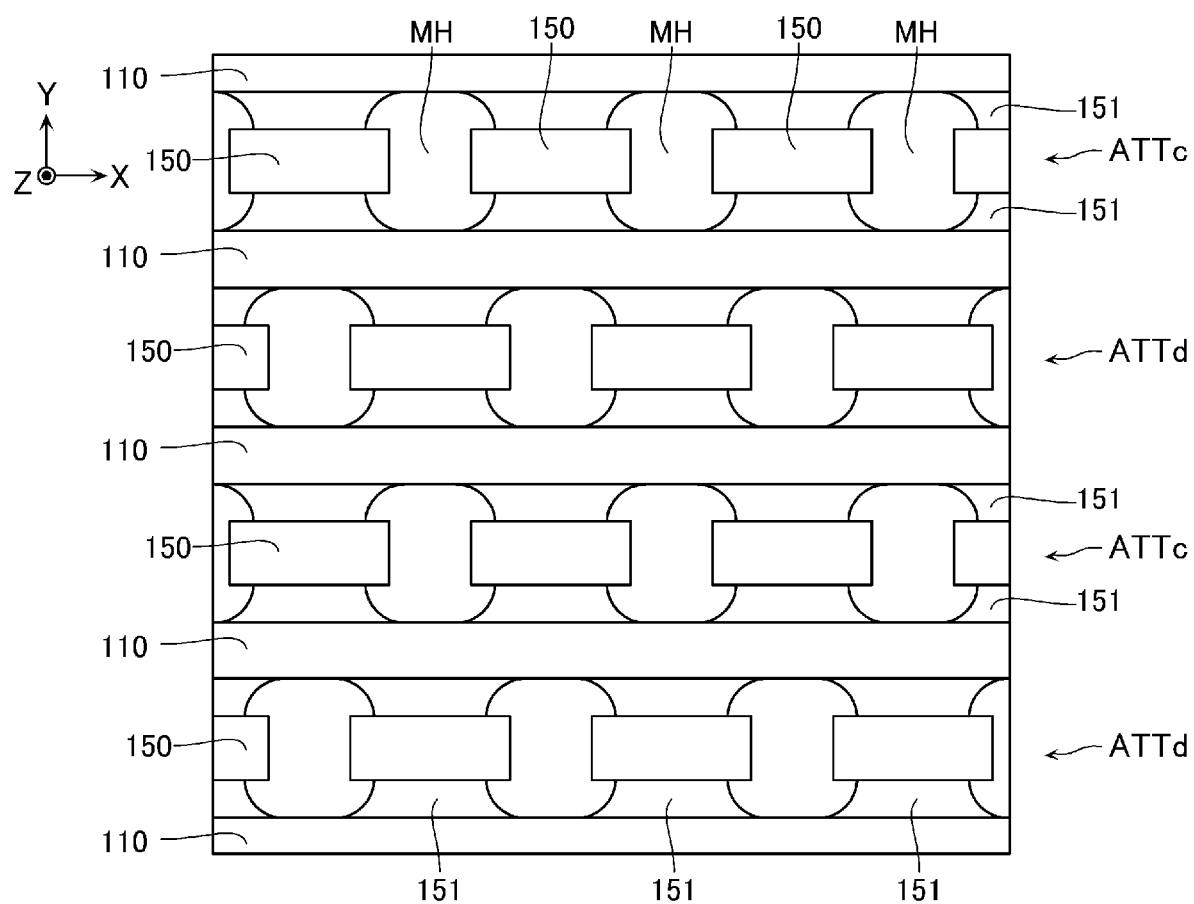
FIG. 34 is a schematic cross-sectional view illustrating the manufacturing method.
Figure 35:
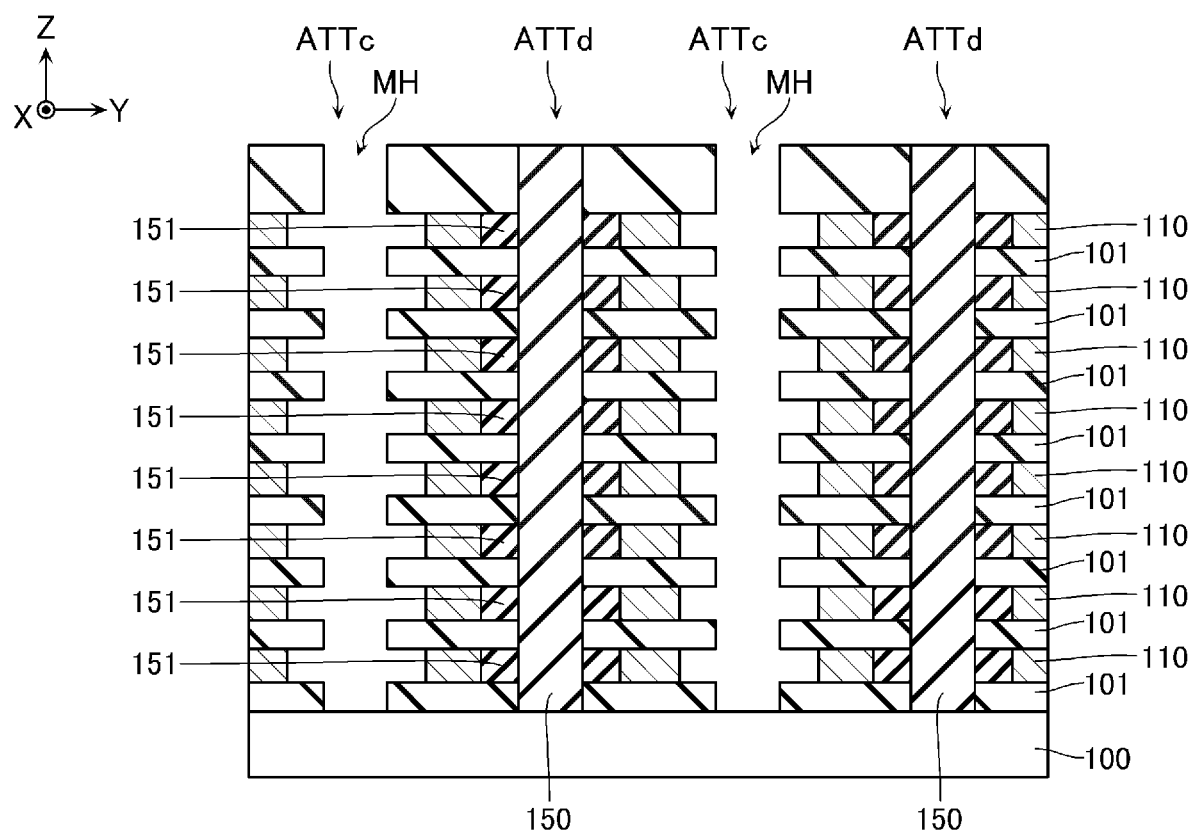
FIG. 35 is a schematic cross-sectional view illustrating the manufacturing method.

Next, as illustrated in FIGS. 34 and 35, a portion of the insulating layer 151 is removed through the memory hole MH to expose the side surface of the conductive layer 110 in the Y direction. This process is performed, for example, by wet etching or the like.

Figure 36:
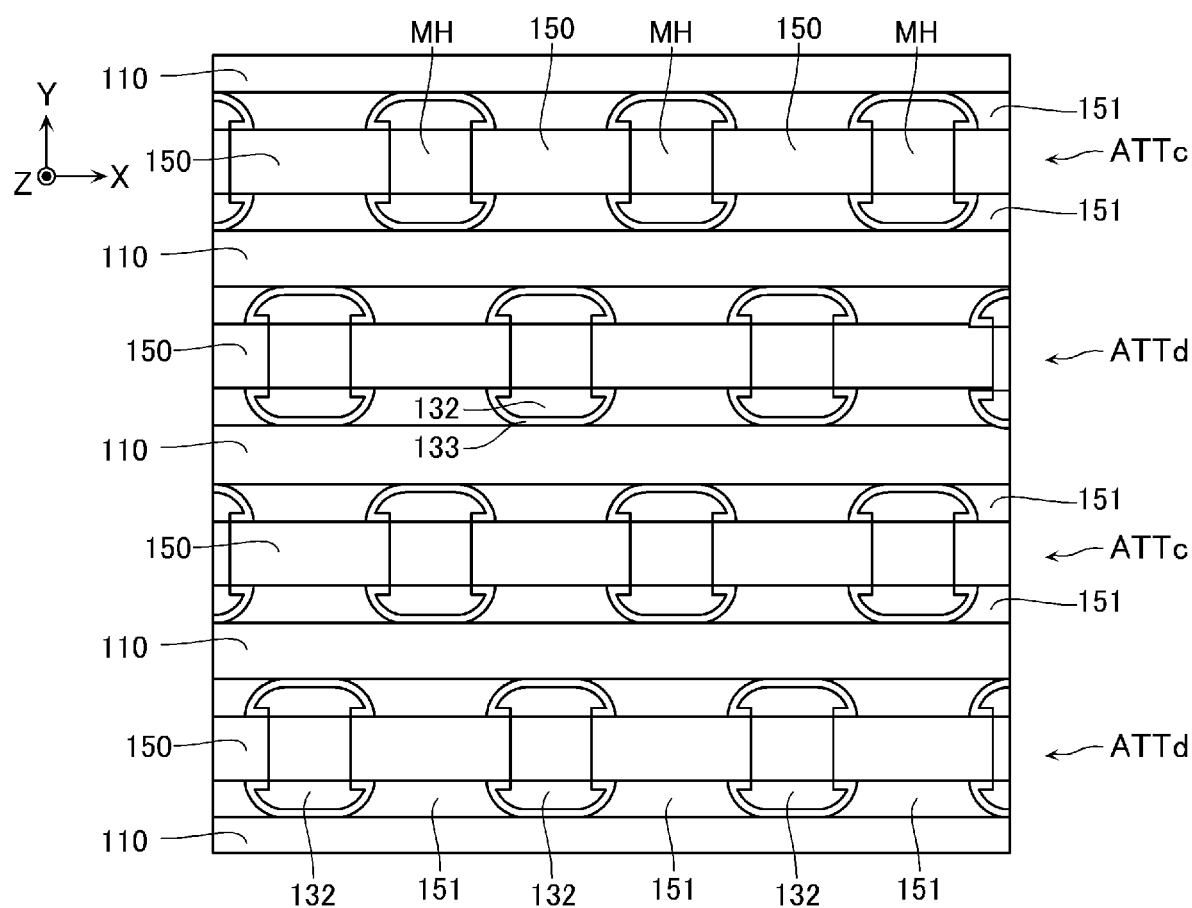
FIG. 36 is a schematic cross-sectional view illustrating the manufacturing method.
Figure 37:
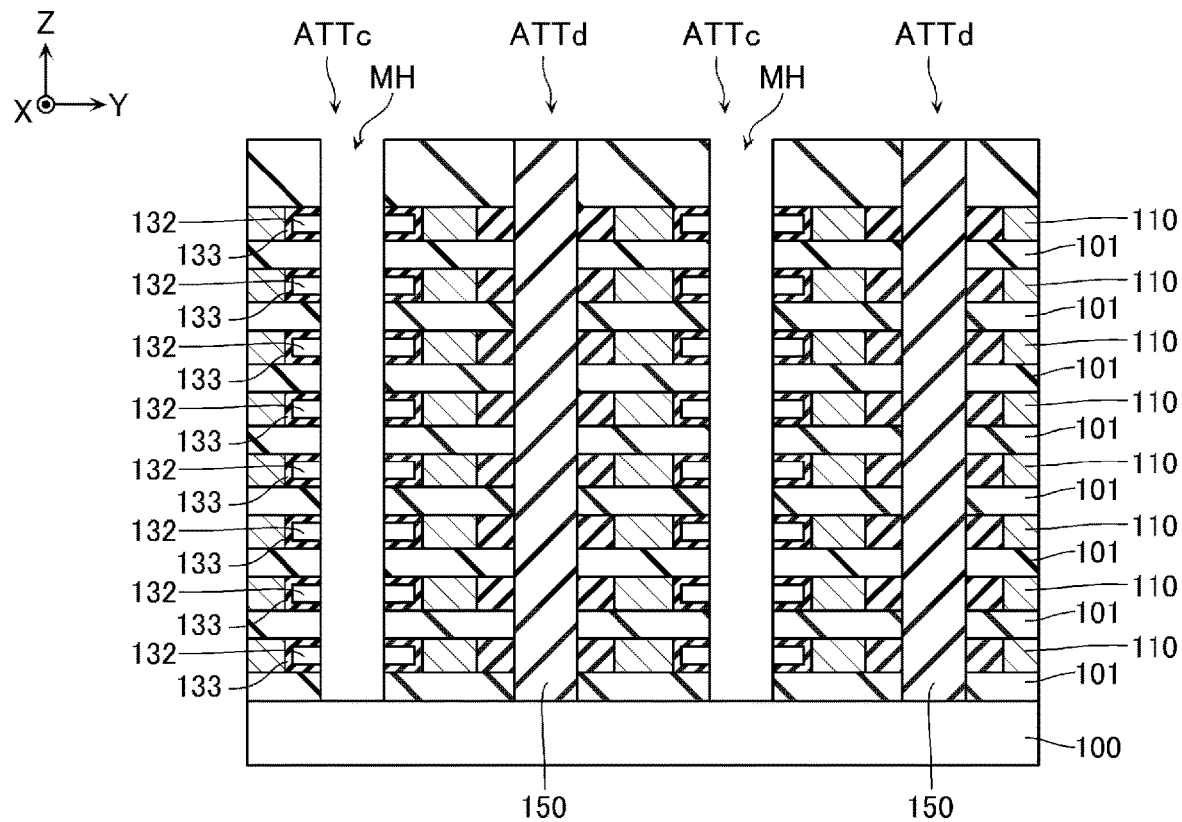
FIG. 37 is a schematic cross-sectional view illustrating the manufacturing method.

Next, as illustrated in FIGS. 36 and 37, the block insulating layer 133 and the charge storage portion 132 are formed on the upper and lower surfaces of the insulating layer 101, the side surface of the conductive layer 110 in the Y direction, and the side surface of the insulating layer 151 in the X direction via the memory hole MH. This process is performed by, for example, CVD or the like.

Figure 38:
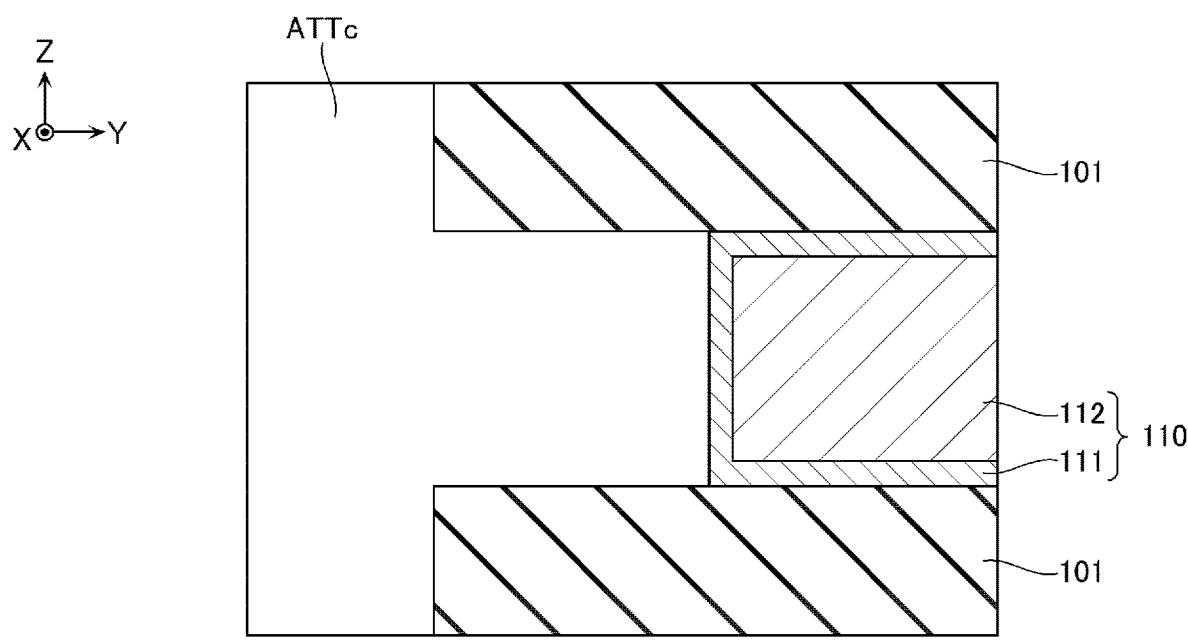
FIG. 38 is a schematic cross-sectional view illustrating the manufacturing method.
Figure 39:
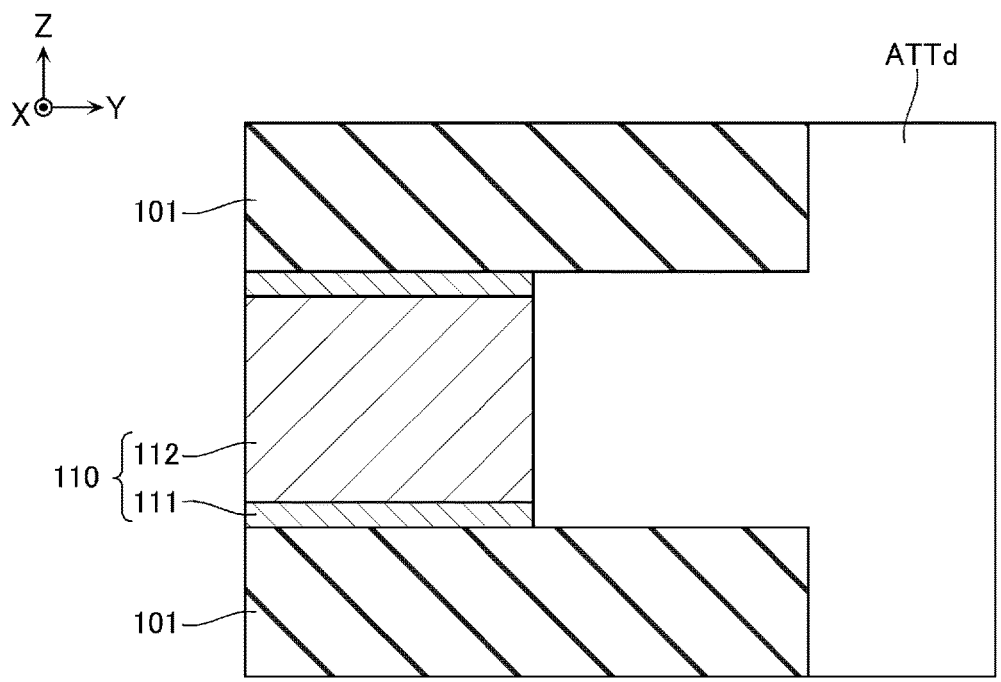
FIG. 39 is a schematic cross-sectional view illustrating the manufacturing method.
Figure 40:
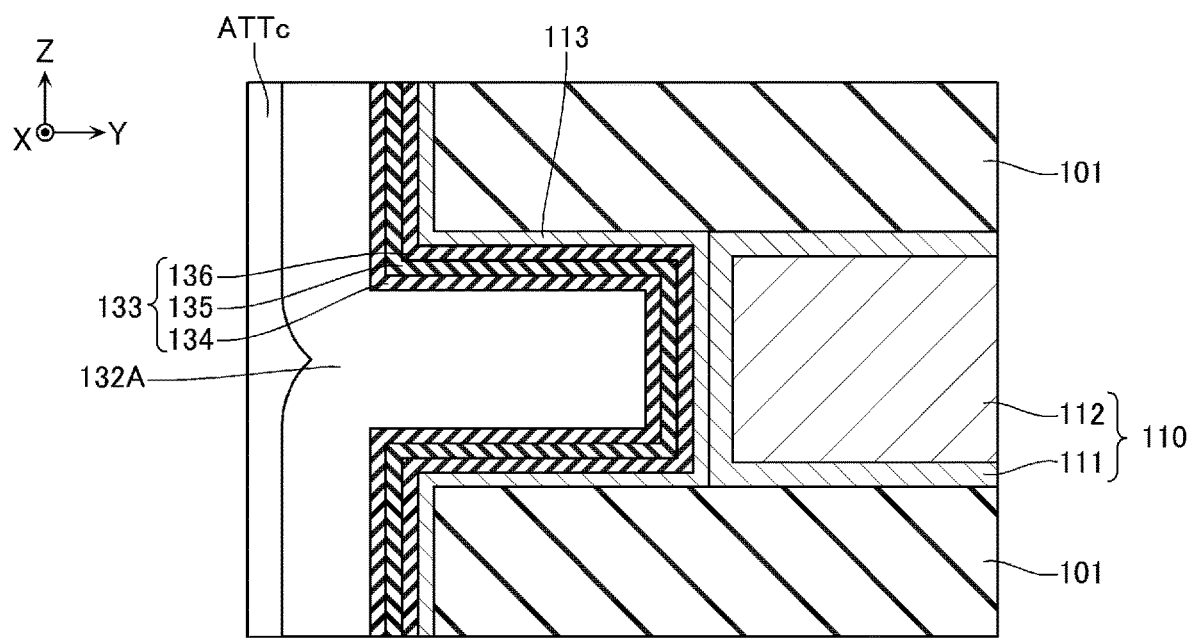
FIG. 40 is a schematic cross-sectional view illustrating the manufacturing method.
Figure 41:
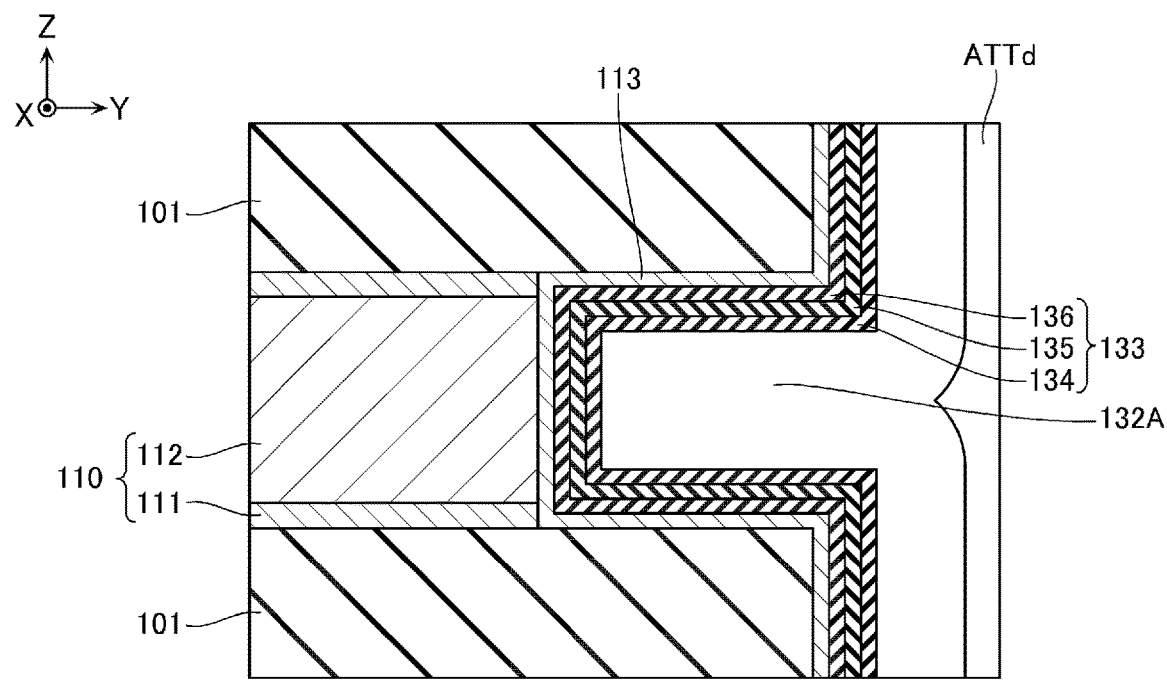
FIG. 41 is a schematic cross-sectional view illustrating the manufacturing method.
Figure 42:
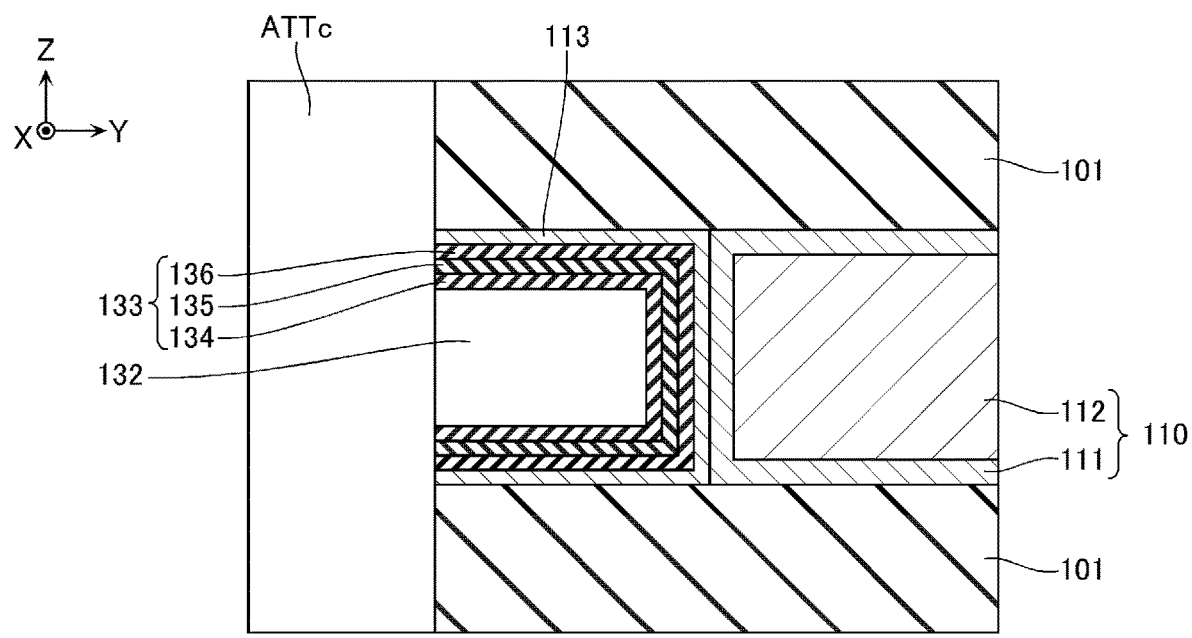
FIG. 42 is a schematic cross-sectional view illustrating the manufacturing method.
Figure 43:
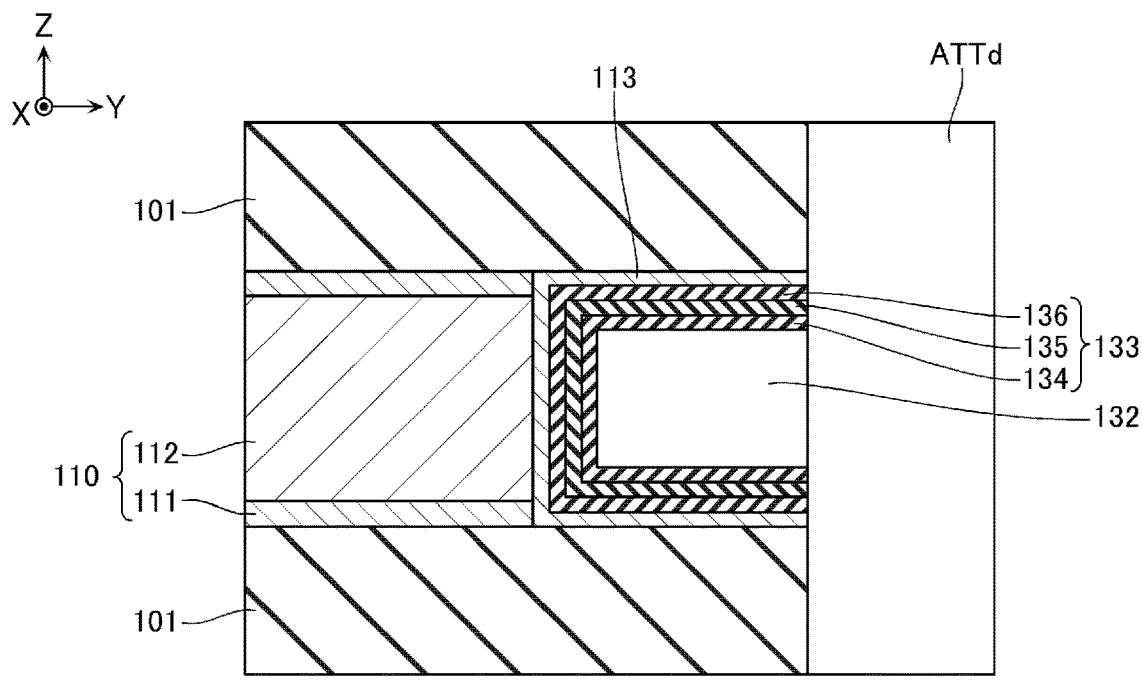
FIG. 43 is a schematic cross-sectional view illustrating the manufacturing method.

It is noted that, in this process, as illustrated in FIGS. 38 and 39, among the side surfaces of the conductive layer 110 in the Y direction, both the side surface on the trench ATTc side and the side surface on the trench ATTd side are exposed. Herein, when the block insulating layer 133 and the charge storage portion 132 are directly formed on the metal film 112, there is a concern that the electrical characteristics of the block insulating layer 133 or the charge storage portion 132 are affected by impurities and the like in the metal film 112. Therefore, in the embodiment, as illustrated in FIGS. 40 and 41, the barrier conductive film 113 is formed in advance on the side surface of the metal film 112 in the Y direction, and after that, the block insulating layer 133 and an amorphous silicon layer 132A are formed. Next, as illustrated in FIGS. 42 and 43, the portions of the barrier conductive film 113, the block insulating layer 133, and the amorphous silicon layer 132A provided on the side surface of the insulating layer 101 in the Y direction are removed. This process is performed, for example, by wet etching or the like. It is noted that the portion of the amorphous silicon layer 132A remaining in this process becomes the charge storage portion 132.

Figure 44:
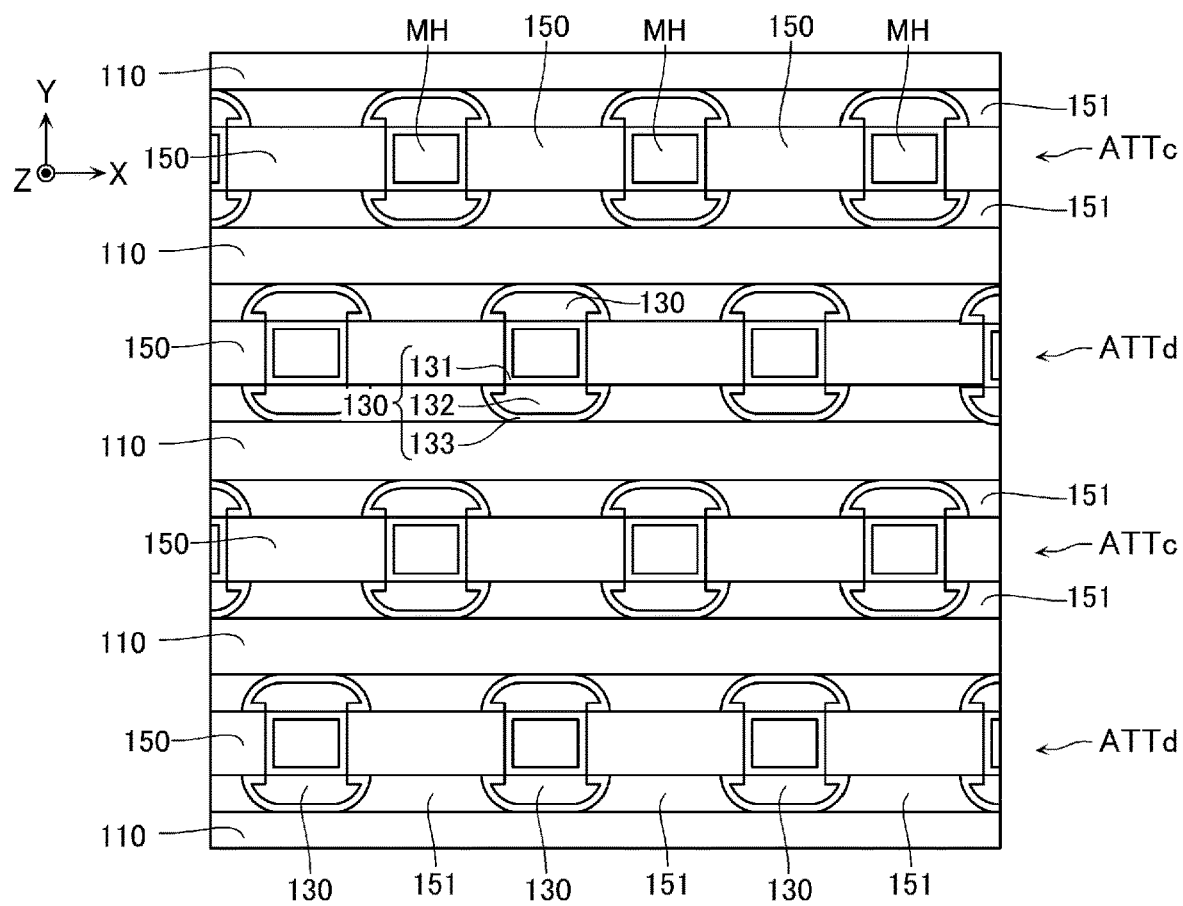
FIG. 44 is a schematic cross-sectional view illustrating the manufacturing method.
Figure 45:
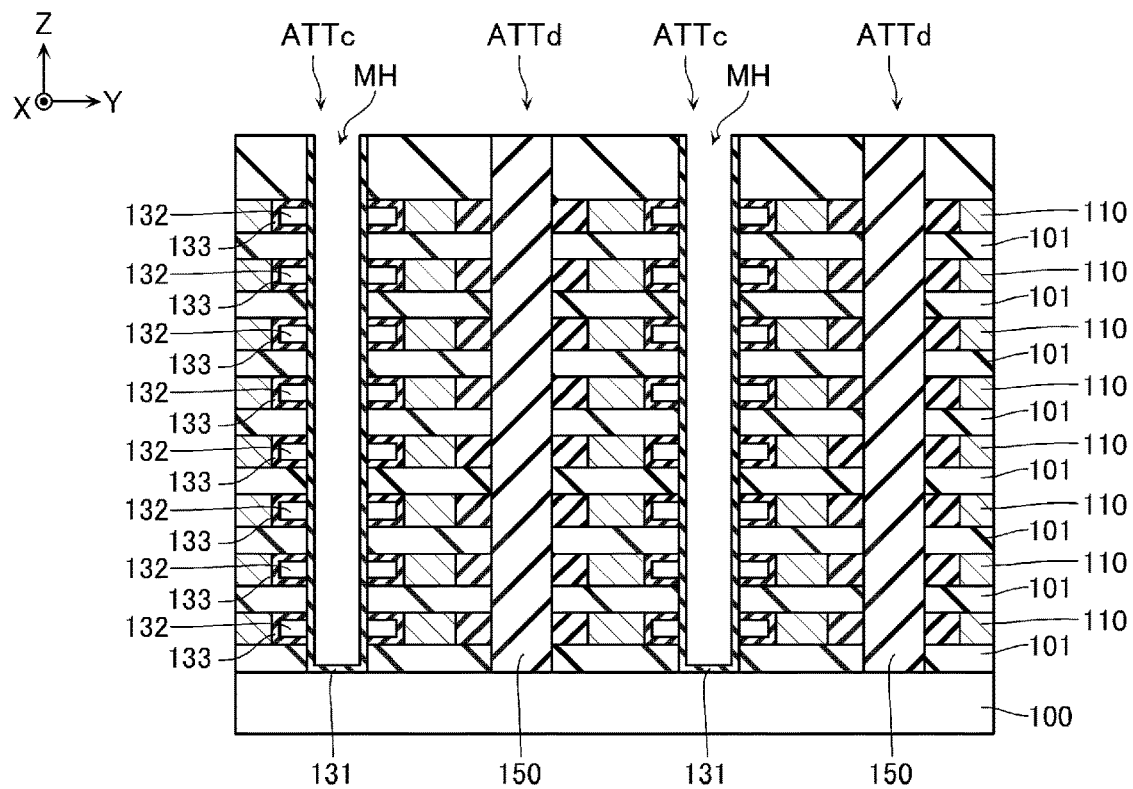
FIG. 45 is a schematic cross-sectional view illustrating the manufacturing method.

Next, as illustrated in FIGS. 44 and 45, the tunnel insulating layer 131 is formed on the inner peripheral surface of the memory hole MH. This process is performed, for example, by CVD, oxidation treatment, or the like. When the tunnel insulating layer 131 is formed by a method such as CVD, as illustrated in FIG. 45, the tunnel insulating layer 131 extends in the Z direction along the inner peripheral surface of the memory hole MH. When the tunnel insulating layer 131 is formed by a method such as an oxidation treatment, each the tunnel insulating layer 131 is formed on the side surface of the charge storage portion 132 in the Y direction.

Figure 46:
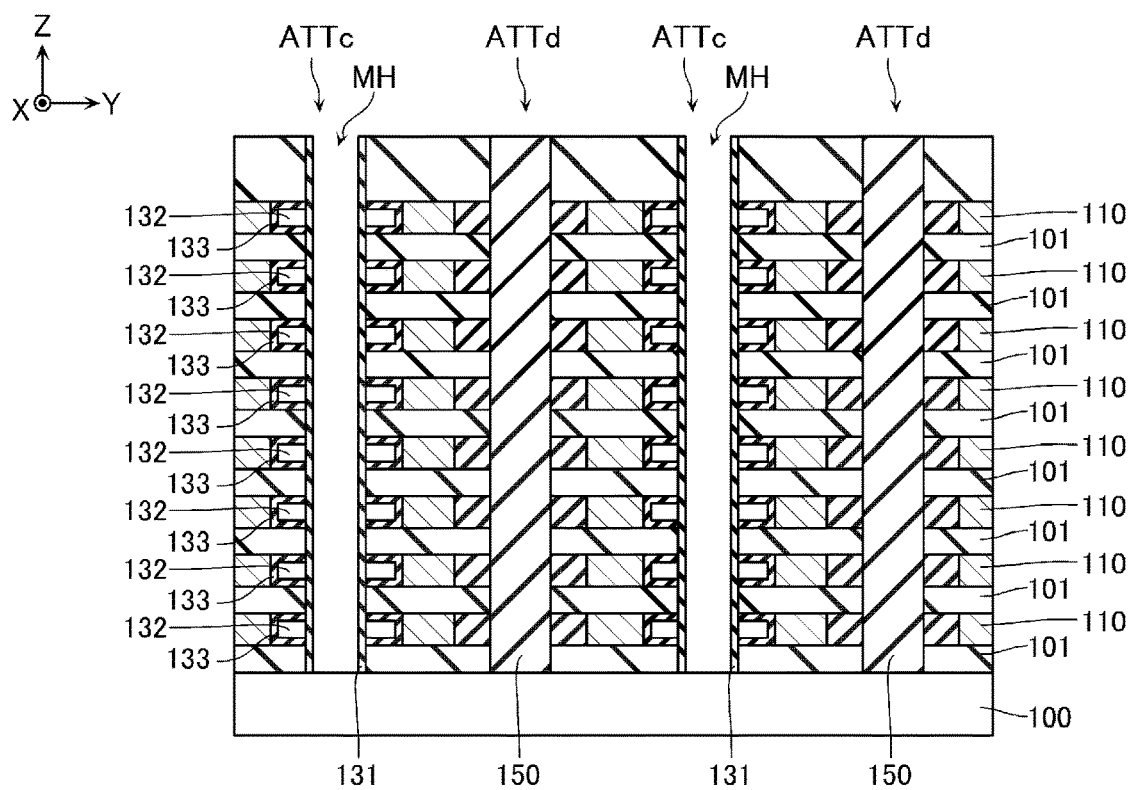
FIG. 46 is a schematic cross-sectional view illustrating the manufacturing method.

Next, as illustrated in FIG. 46, the portion of the tunnel insulating layer 131 that covers the bottom surface of the memory hole MH is removed. This process is performed by, for example, RIE or the like.

Figure 47:
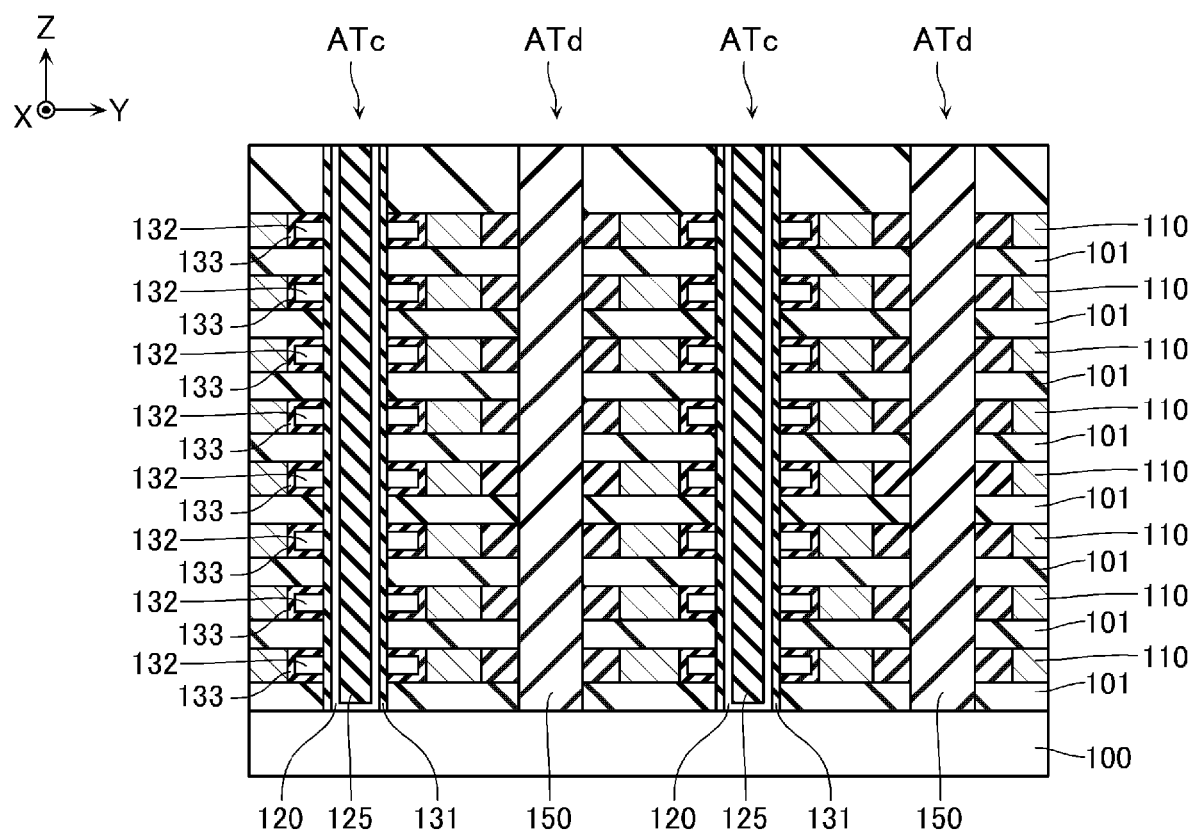
FIG. 47 is a schematic cross-sectional view illustrating the manufacturing method.

Next, as illustrated in FIG. 47, the semiconductor layer 120 and the insulating layer 125 are formed inside the memory hole MH. This process is performed by, for example, CVD or the like.

It is noted that, as illustrated in FIG. 48, at this stage, the sacrifice layers 110A remain in the hookup region $R_{HU}$. In addition, the sacrifice layers 110A remaining in the hookup region $R_{HU}$ are connected to the insulating layers 151 corresponding to the trench structures ATc.

Next, as illustrated in FIG. 49, the support structure HR is formed. This process is performed by, for example, RIE, CVD, or the like.

Next, as illustrated in FIG. 49, a trench ST extending in the X direction is formed at a position corresponding to the boundary between two adjacent memory blocks BLK in the Y direction. The trench ST extends in the X direction and the Z direction and penetrates the plurality of insulating layers 101 and the sacrifice layers 110A to separate these components in the Y direction.

Figure 50:
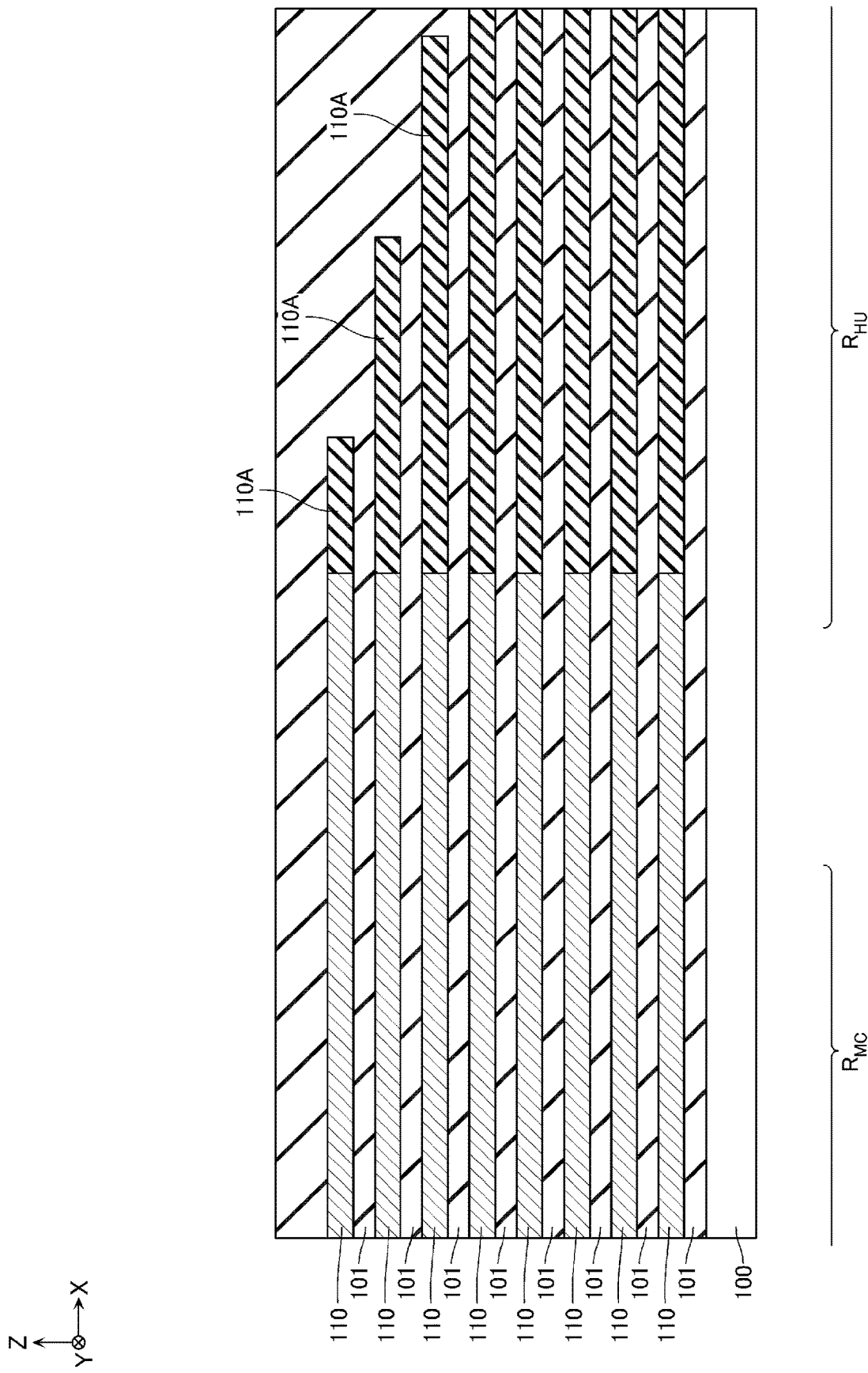
FIG. 50 is a schematic cross-sectional view illustrating the manufacturing method.
Figure 51:
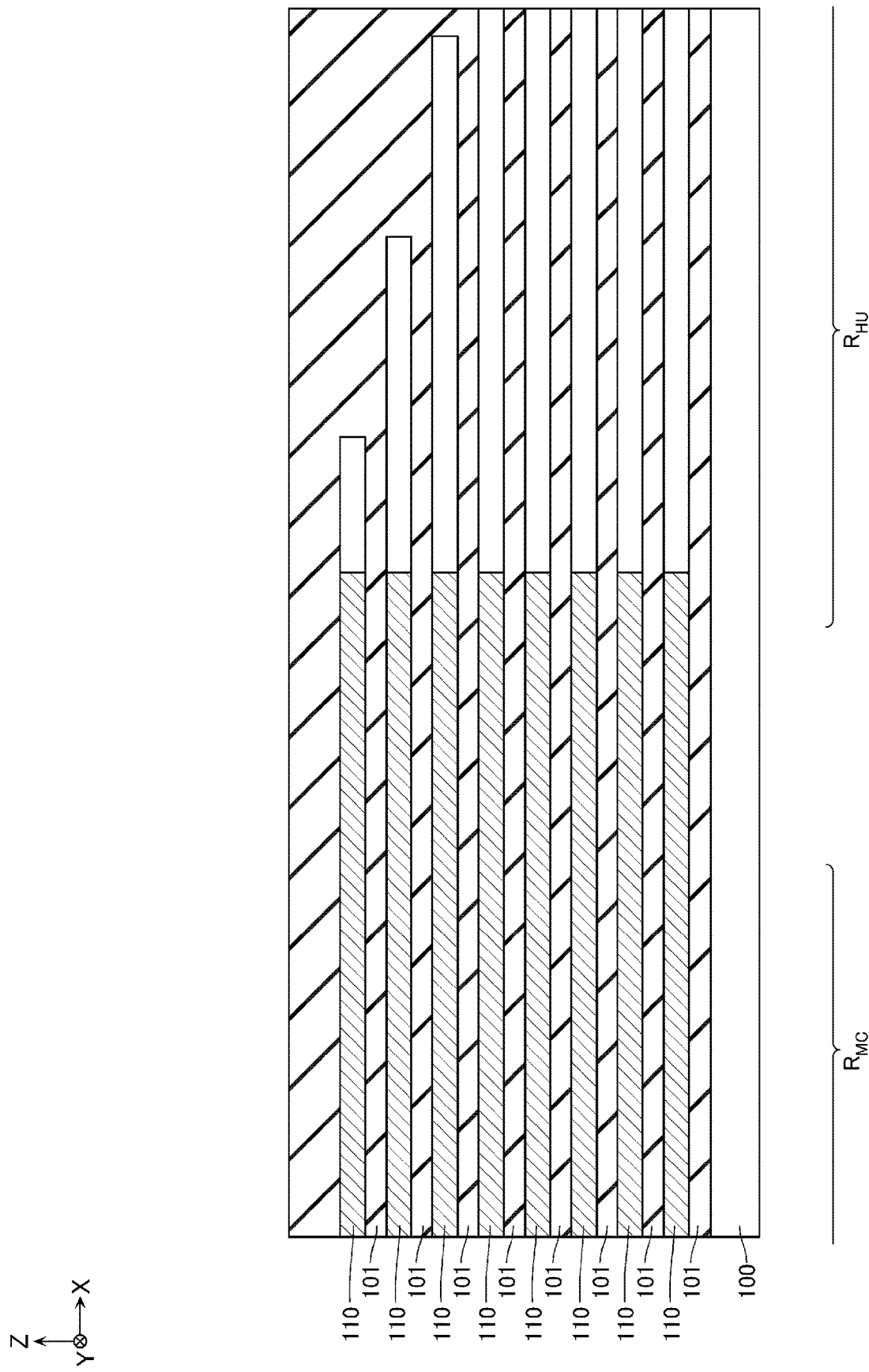
FIG. 51 is a schematic cross-sectional view illustrating the manufacturing method.

Next, as illustrated in FIGS. 50 and 51, the plurality of sacrifice layers 110A are removed through the trench ST. This process is performed, for example, by wet etching or the like.

Figure 52:
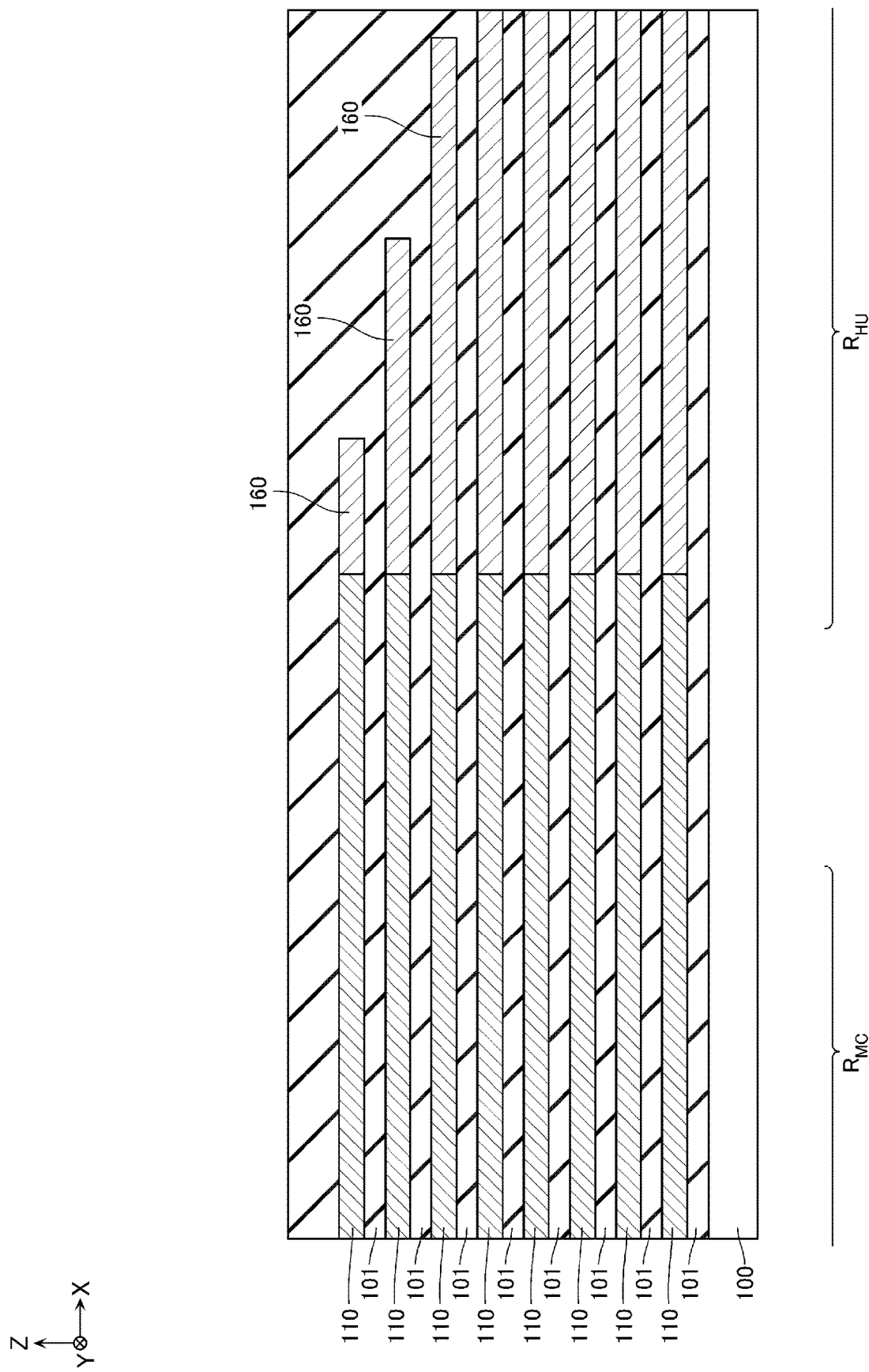
FIG. 52 is a schematic cross-sectional view illustrating the manufacturing method.

Next, as illustrated in FIG. 52, the conductive layers 160 are formed on the upper and lower surfaces of the insulating layer 101 through the trench ST. In this process, for example, the conductive layers 160 are formed by CVD and a portion of the conductive layers 160 is removed by wet etching or the like.

After that, the semiconductor storage device according to the first embodiment is manufactured by forming the contacts CC, the bit lines BL, and the like.

Comparative Example

Figure 53:
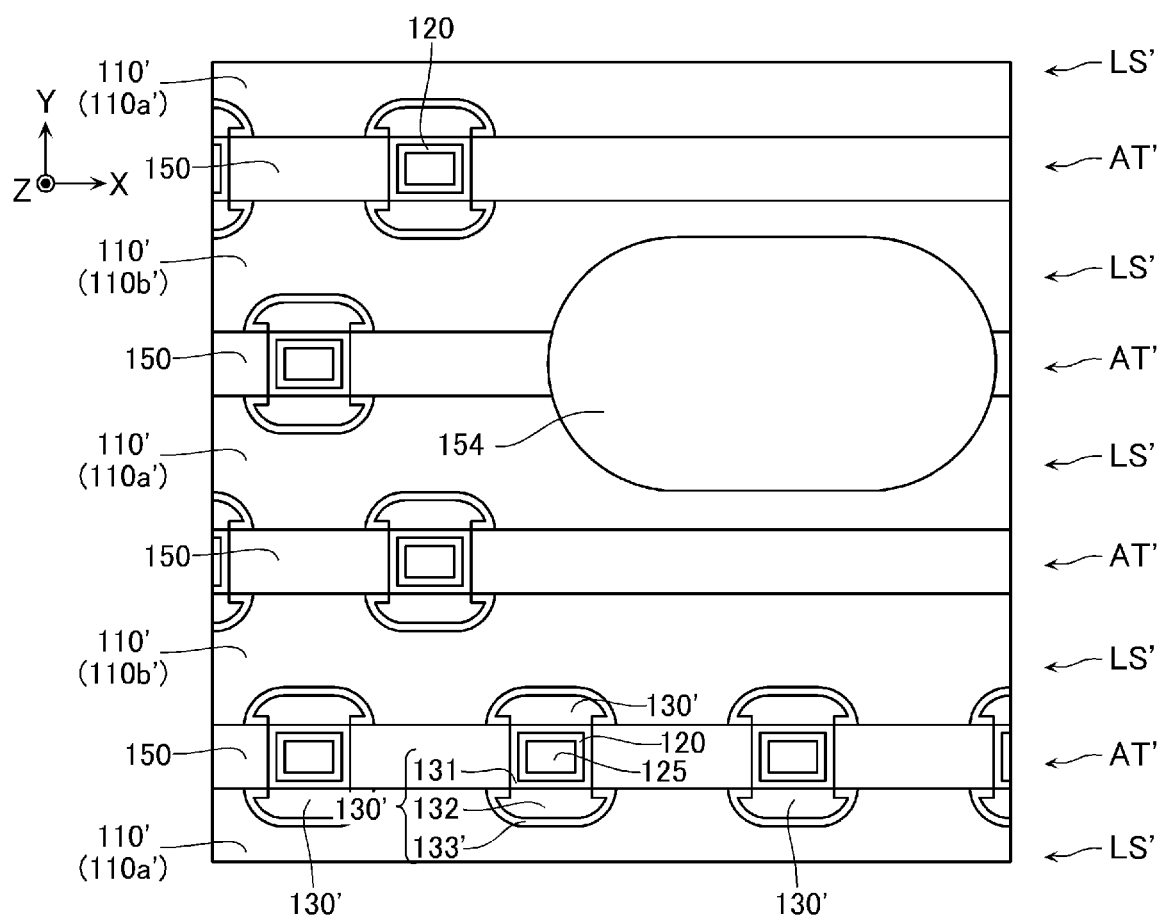
FIG. 53 is a schematic cross-sectional view of the semiconductor storage device according to Comparative Example.
Figure 54:
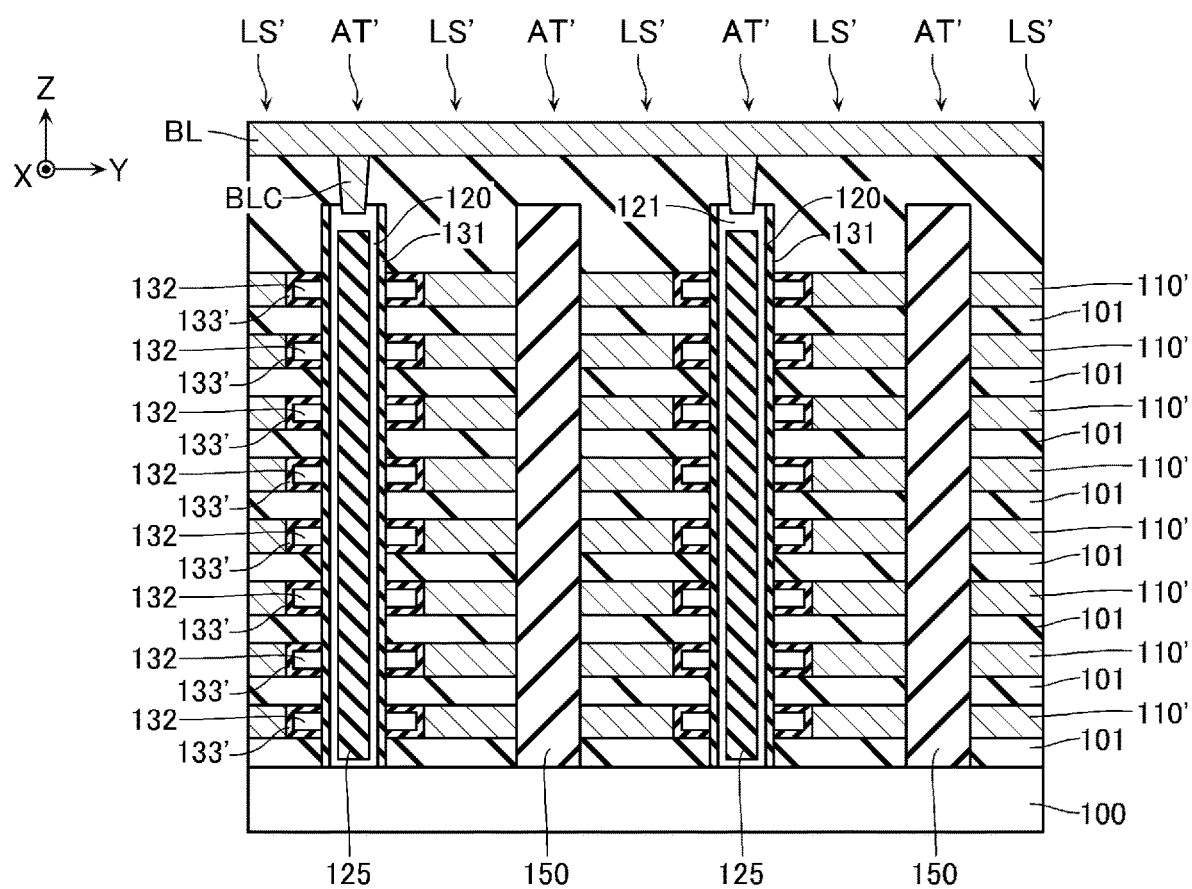
FIG. 54 is a schematic cross-sectional view of the semiconductor storage device.
Figure 55:
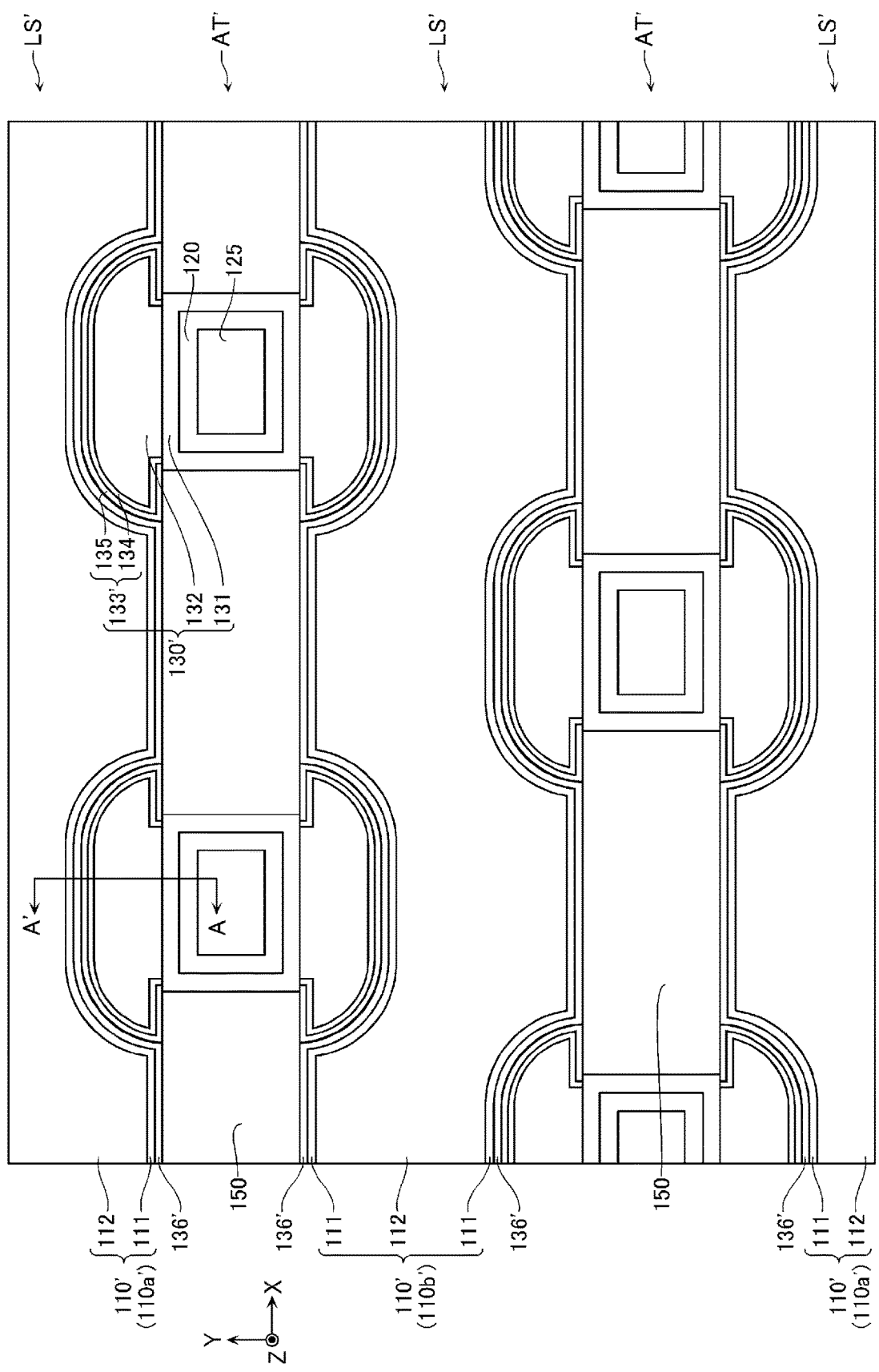
FIG. 55 is a schematic cross-sectional view of the semiconductor storage device.
Figure 56:
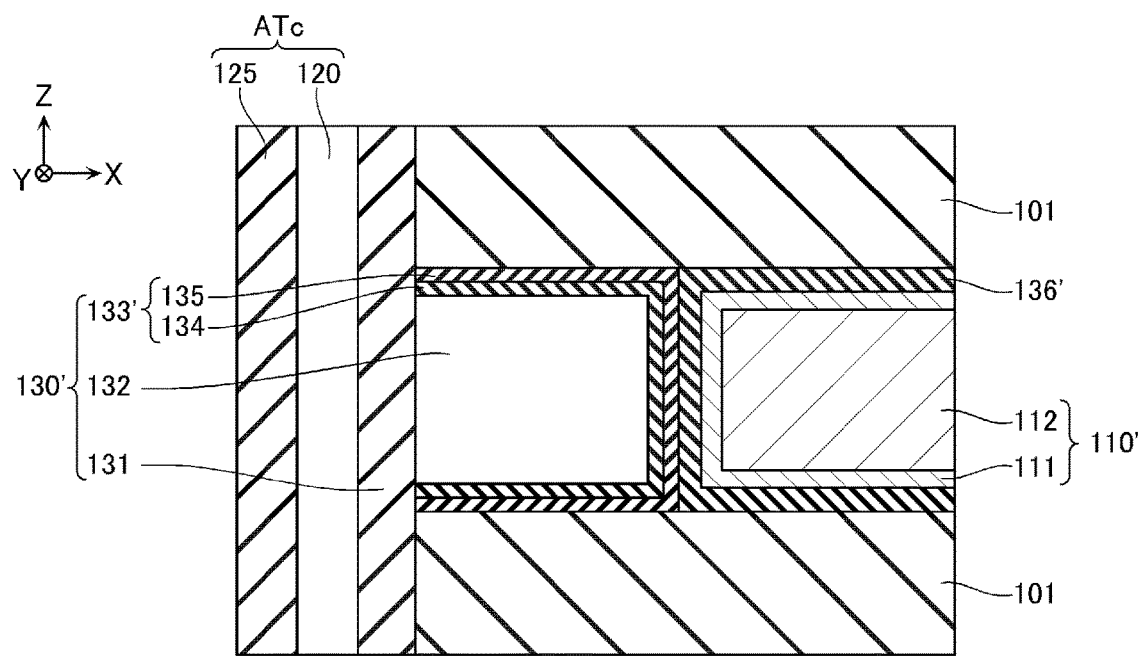
FIG. 56 is a schematic cross-sectional view of the semiconductor storage device.
Figure 57:
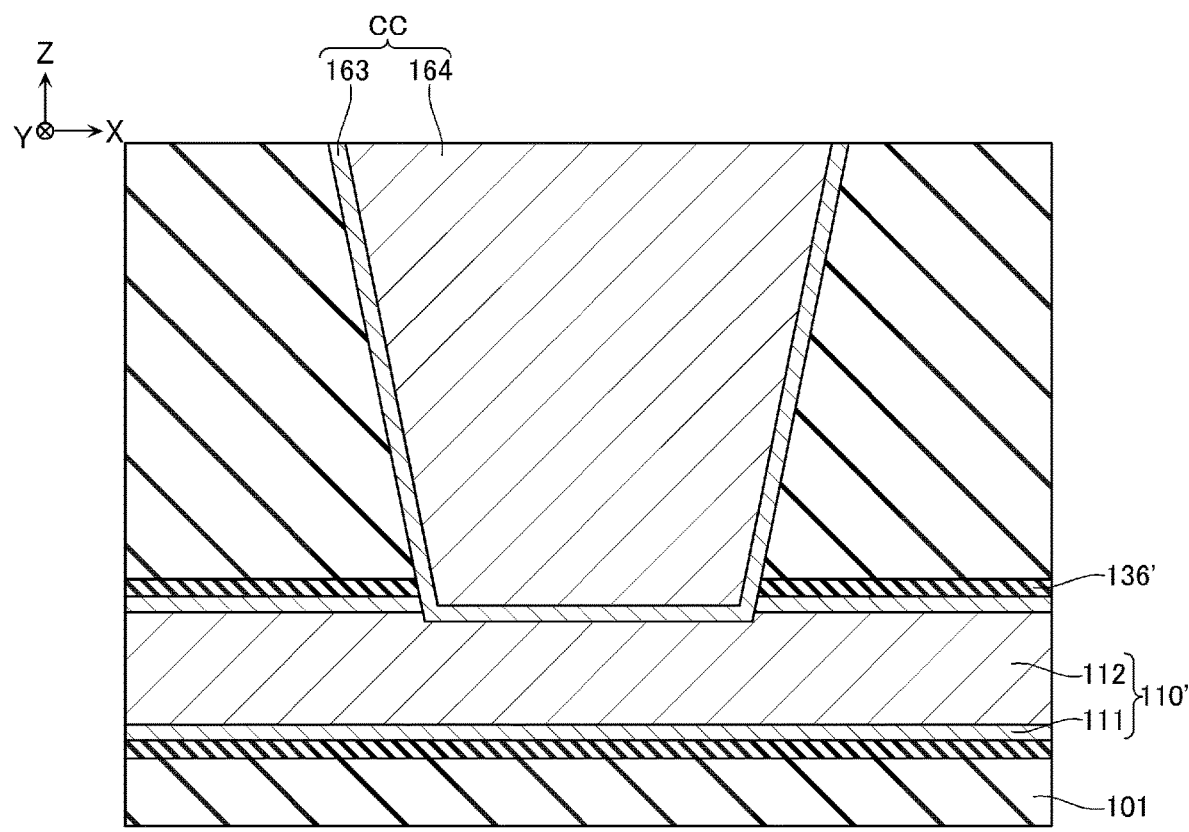
FIG. 57 is a schematic cross-sectional view of the semiconductor storage device.

FIG. 53 is a schematic XY cross-sectional view illustrating a portion of the configuration of the memory cell region $R_{MC}$ of a semiconductor storage device according to Comparative Example. FIG. 54 is a schematic YZ cross-sectional view illustrating a portion of the configuration of the memory cell region $R_{MC}$. FIG. 55 is a schematic enlarged view illustrating a portion of the configuration of FIG. 53. FIG. 56 is a schematic cross-sectional view when the configuration illustrated in FIG. 5 is taken along a line A-A' and viewed along a direction of an arrow. FIG. 57 is a schematic XZ cross-sectional view illustrating a portion of the configuration in the hookup region $R_{HU}$ of the semiconductor storage device according to Comparative Example.

As illustrated in FIG. 54, for example, the semiconductor storage device according to Comparative Example includes stacked body structures LS' and trench structures AT' instead of the stacked body structures LS and the trench structures AT. The stacked body structure LS' includes a plurality of conductive layers 110' stacked in the Z direction via the insulating layers 101. As illustrated in FIG. 53, for example, the trench structure AT' includes a plurality of semiconductor layers 120 which extend in the Z direction and are arranged in the X direction via the insulating layers 150 and an insulating layer 154 made of silicon oxide ($SiO_2$) or the like which extends in the Z direction. In addition, gate insulation layers 130' are provided between the conductive layers 110' and the semiconductor layers 120. In addition, the insulating layers 151 (FIG. 3) are not provided between the conductive layers 110' and the insulating layers 150.

The conductive layer 110' is basically configured in the same manner as the conductive layer 110 according to the first embodiment. However, as illustrated in FIGS. 55 to 57, an insulating layer 136' made of alumina (AlO) or the like are provided on the upper and lower surfaces of the conductive layer 110' and both side surfaces in the Y direction. In addition, the conductive layer 110' according to Comparative Example is provided over both the memory cell region $R_{MC}$ and the hookup region $R_{HU}$ and is connected to the contact CC in the hookup region $R_{HU}$.

One side surface of the insulating layer 154 (FIG. 53) in the Y direction is connected to the plurality of conductive layers 110a' arranged in the Z direction. In addition, the other side surface of the insulating layer 154 in the Y direction is connected to the plurality of conductive layers 110b' arranged in the Z direction. The width of the insulating layer 154 in the Y direction is larger than the width of the other components in the trench structure AT' in the Y direction.

The gate insulation layer 130' is basically configured in the same manner as the gate insulation layer 130 according to the first embodiment. However, the gate insulation layer 130' includes a block insulating layer 133' instead of the block insulating layer 133. The block insulating layer 133' is basically configured in the same manner as the block insulating layer 133 according to the first embodiment. However, the block insulating layer 133' does not include, for example, the metal oxide film 136, as illustrated in FIGS. 55 and 56.

In addition, as illustrated in FIGS. 55 and 56, the barrier conductive film 113 (FIGS. 5 to 7) is not provided between the block insulating layer 133' and the insulating layer 101 according to Comparative Example and between the block insulating layer 133' and the conductive layer 110'.

[Manufacturing Method]

Figure 72:
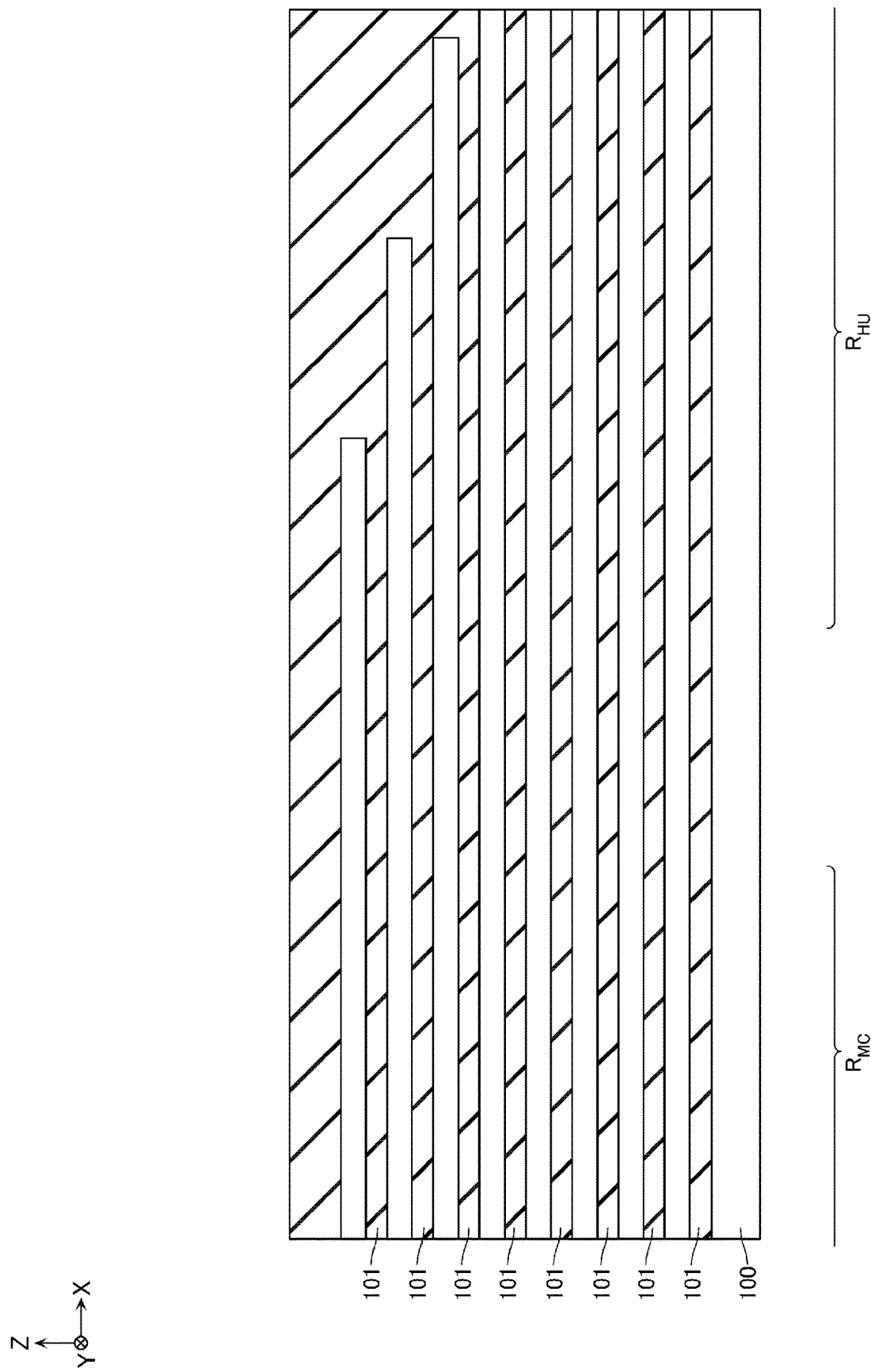
FIG. 72 is a schematic cross-sectional view illustrating the manufacturing method.
Figure 73:
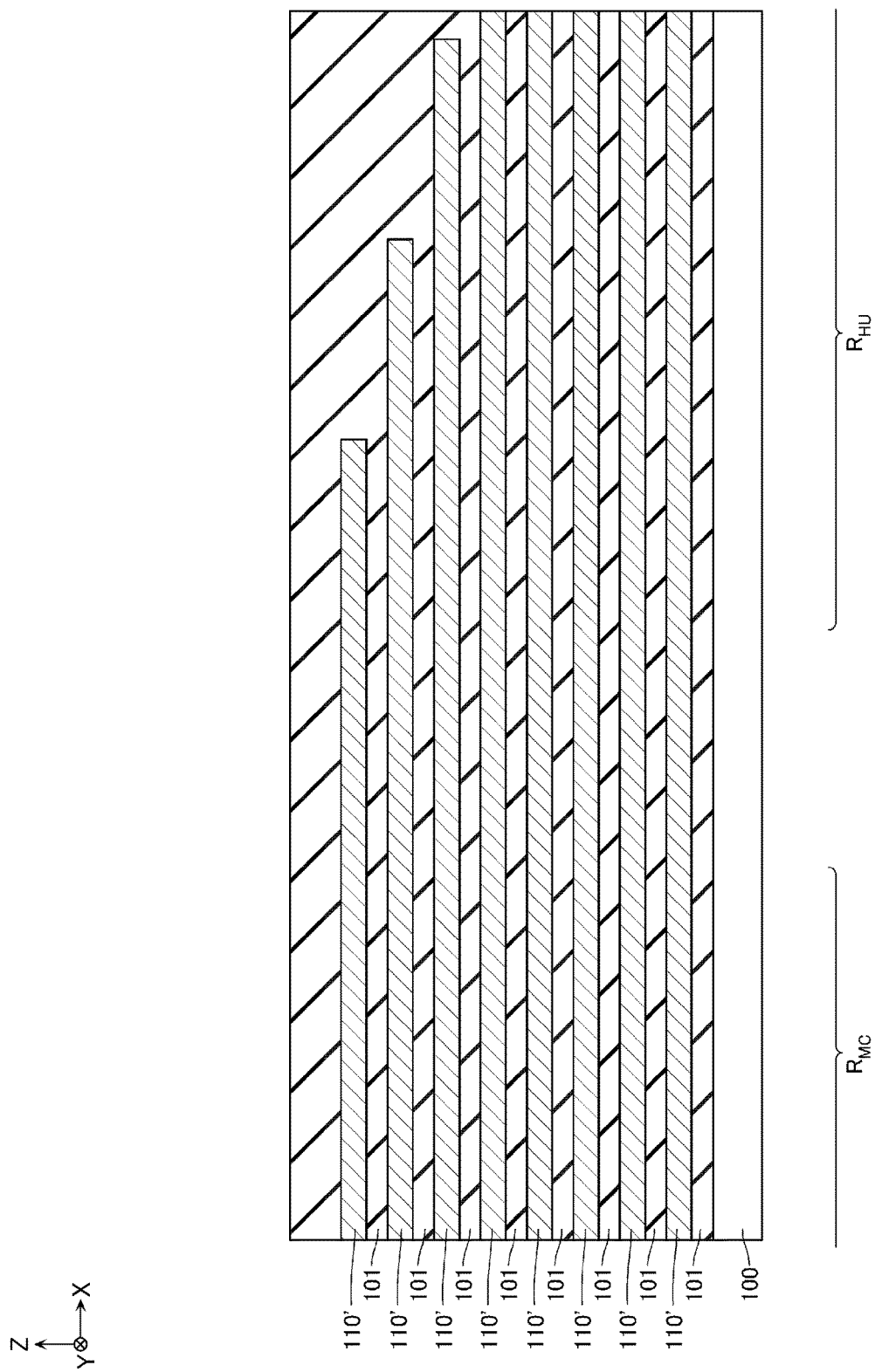
FIG. 73 is a schematic cross-sectional view illustrating the manufacturing method.

Next, a method of manufacturing the semiconductor storage device according to Comparative Example will be described with reference to FIGS. 58 to 73. FIGS. 58, 60, 62, 64, 66, 68, and 69 are schematic XY cross-sectional views illustrating the manufacturing method and correspond to the portions illustrated in FIG. 53. FIGS. 59, 61, 63, 65, 67, 70, and 71 are schematic YZ cross-sectional views illustrating the manufacturing method and correspond to the portions illustrated in FIG. 54. FIGS. 72 and 73 are schematic cross-sectional views illustrating the manufacturing method, and illustrate a structure corresponding to the hookup region $R_{HU}$ of the semiconductor storage device according to Comparative Example.

In manufacturing the semiconductor storage device according to Comparative Example, the processes described with reference to FIG. 13 are executed.

Figure 58:
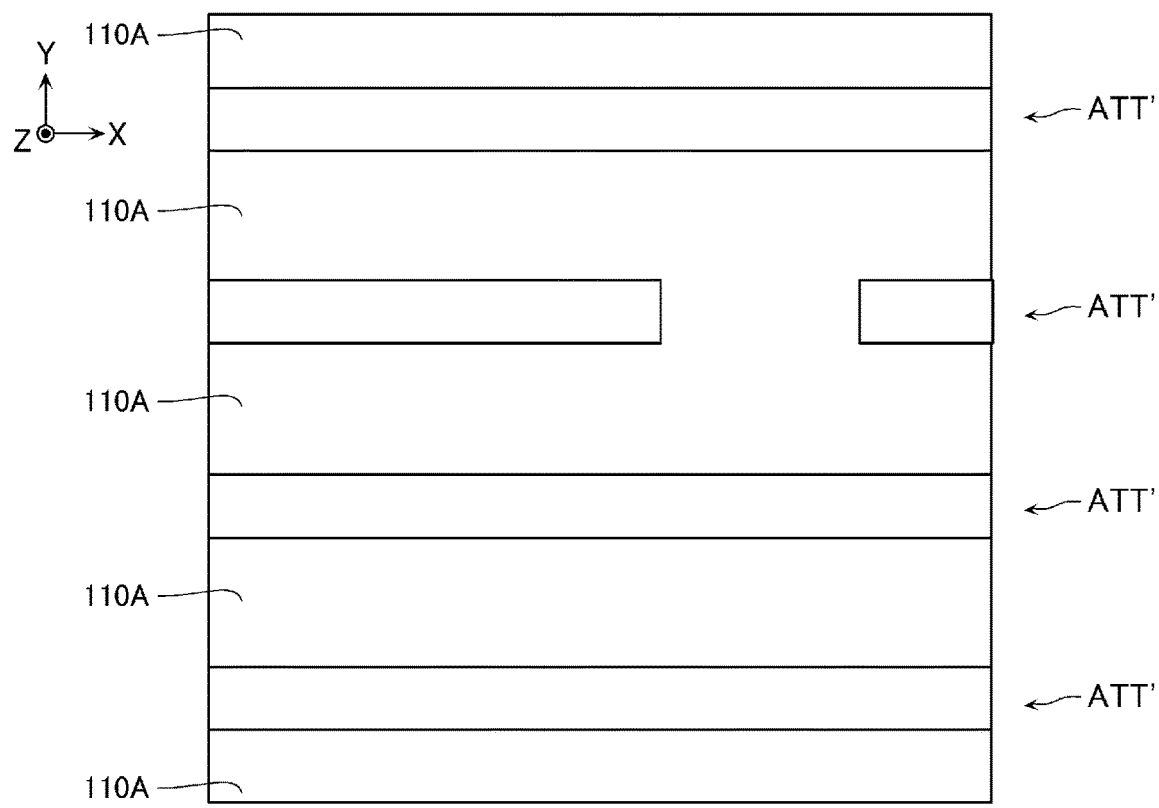
FIG. 58 is a schematic cross-sectional view illustrating a method of manufacturing the semiconductor storage device.
Figure 59:
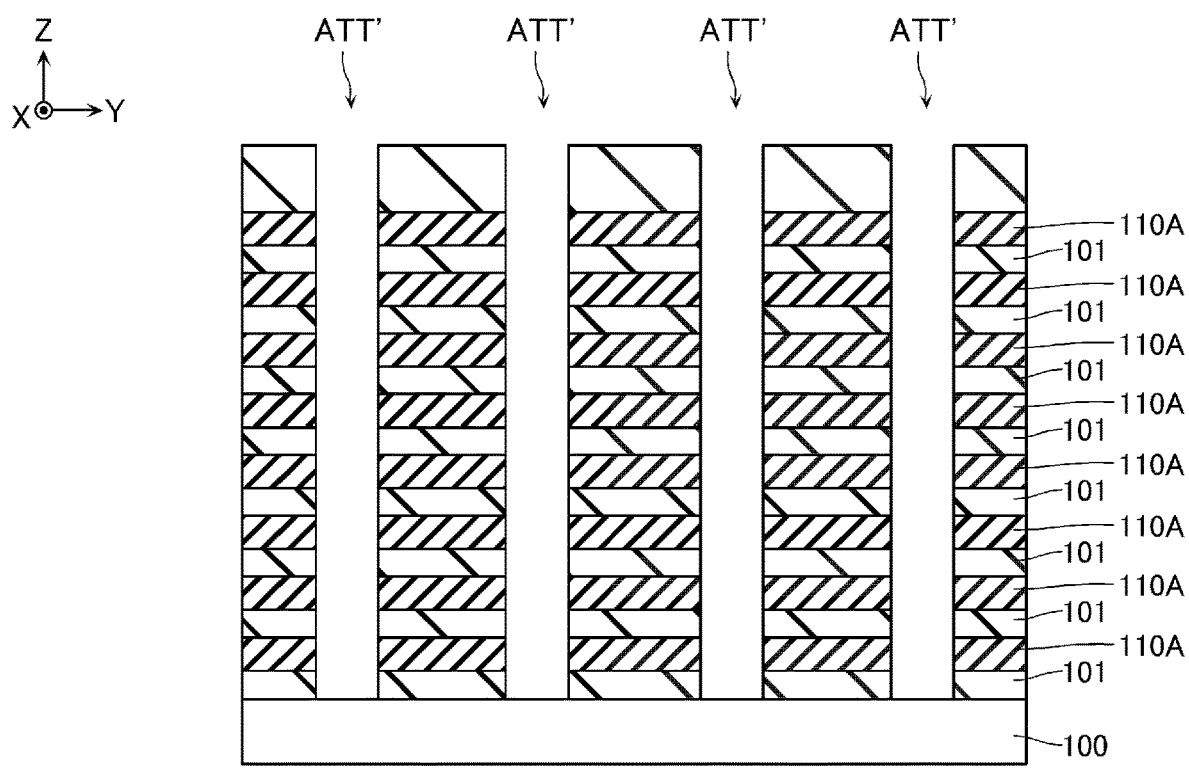
FIG. 59 is a schematic cross-sectional view illustrating the manufacturing method.

Next, as illustrated in FIGS. 58 and 59, a trench ATT' is formed in the stacked structure including the insulating layers 101 and the sacrifice layers 110A. In this process, for example, an insulating layer having an opening in a portion corresponding to the trench structure AT' is formed on the upper surface of the structure illustrated in FIG. 13, and RIE or the like is performed by using the insulating layer as a mask. As illustrated in FIG. 58, the trench ATT' extends in the X direction except for the region where the insulating layer 154 is provided. In addition, as illustrated in FIG. 59, the trench ATT' extends in the Z direction and penetrates the plurality of insulating layers 101 and the sacrifice layers 110A to separate the region of the configuration except for the region where the insulating layer 154 is provided in the Y direction.

Figure 60:
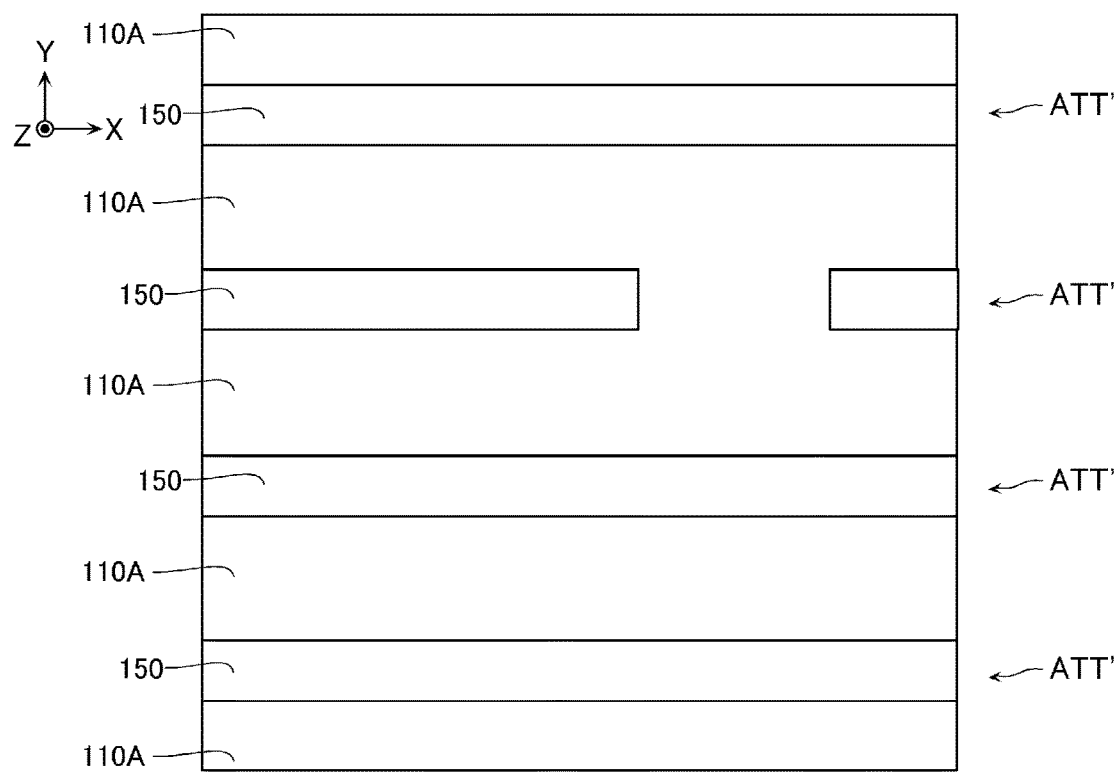
FIG. 60 is a schematic cross-sectional view illustrating the manufacturing method.
Figure 61:
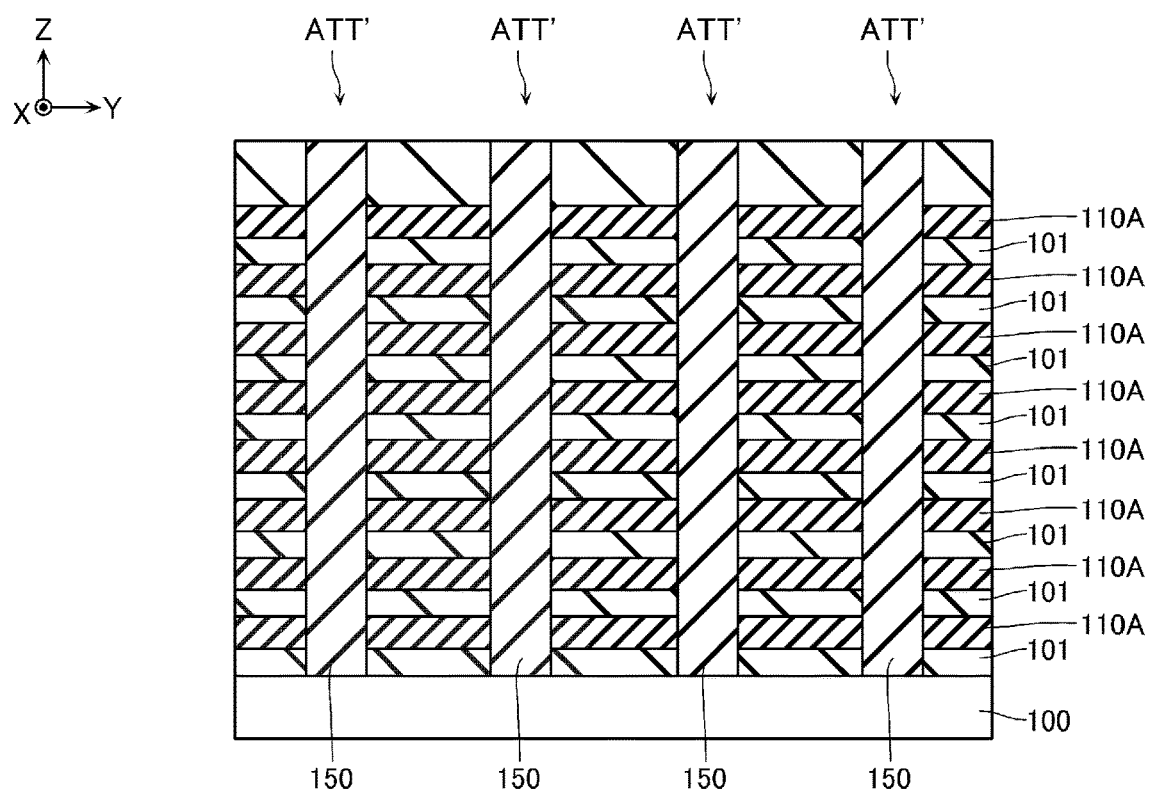
FIG. 61 is a schematic cross-sectional view illustrating the manufacturing method.

Next, as illustrated in FIGS. 60 and 61, the insulating layer 150 is formed inside the trench ATT'. This process is performed by, for example, a method such as CVD.

Figure 62:
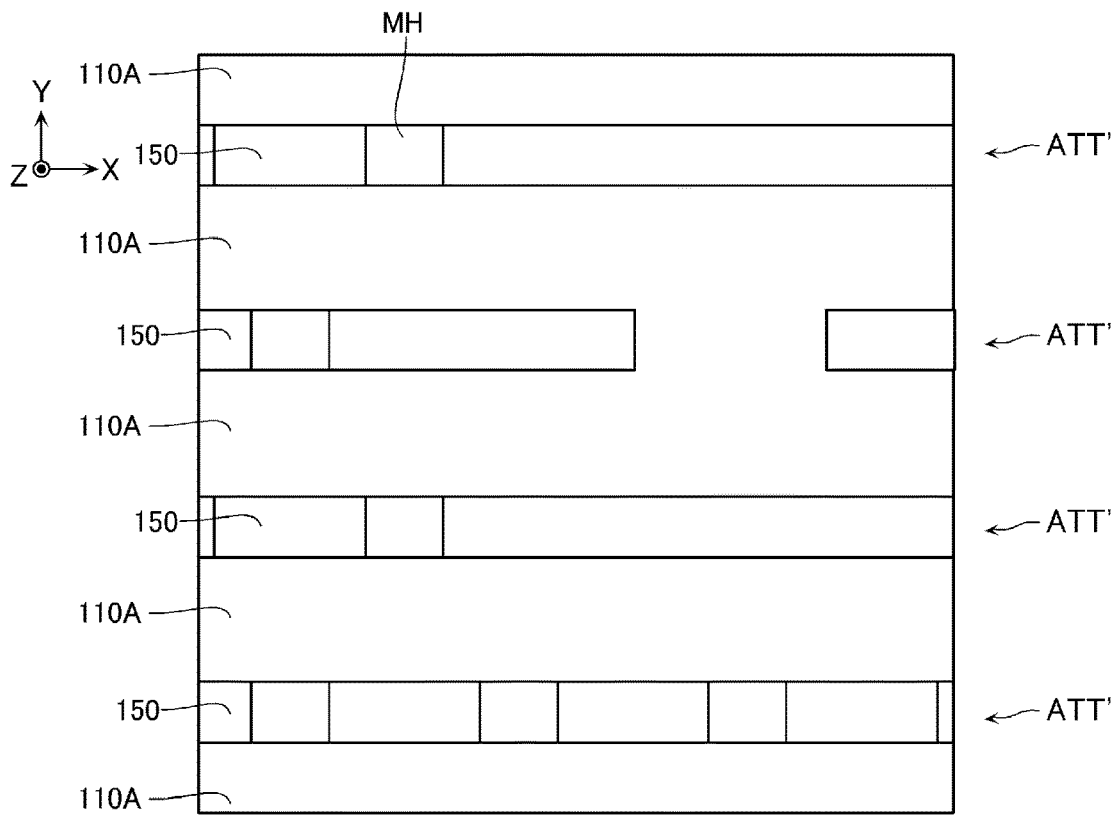
FIG. 62 is a schematic cross-sectional view illustrating the manufacturing method.
Figure 63:
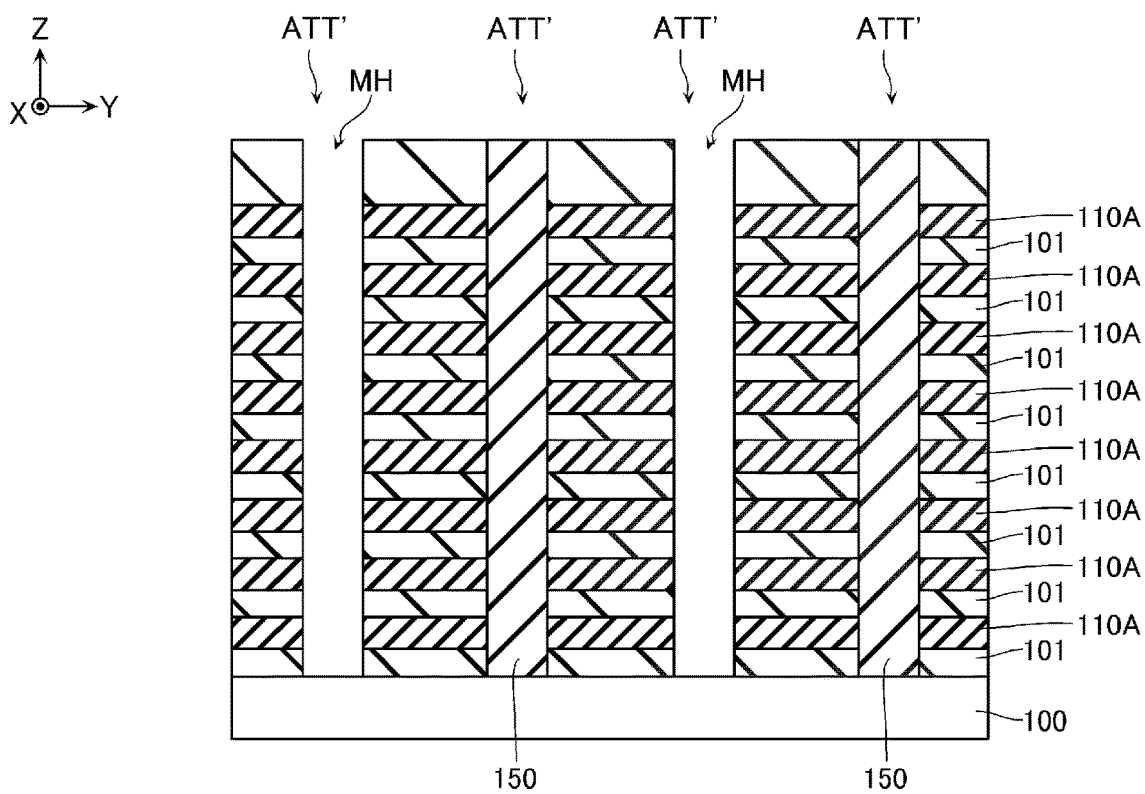
FIG. 63 is a schematic cross-sectional view illustrating the manufacturing method.

Next, as illustrated in FIGS. 62 and 63, the memory hole MH is formed in the insulating layer 150 in the trench ATT'. In this process, for example, an insulating layer having an opening in a portion corresponding to the memory hole MH is formed on the upper surface of the structure illustrated in FIGS. 60 and 61, and RIE or the like is performed by using the insulating layer as a mask. As illustrated in FIGS. 62 and 63, the plurality of memory holes MH are arranged in the X direction along the trench ATT'. In addition, as illustrated in FIG. 63, the memory hole MH extends in the Z direction and exposes the side surfaces of the plurality of insulating layers 101 and the insulating layers 151 in the Y direction and the upper surface of the semiconductor substrate 100.

Figure 64:
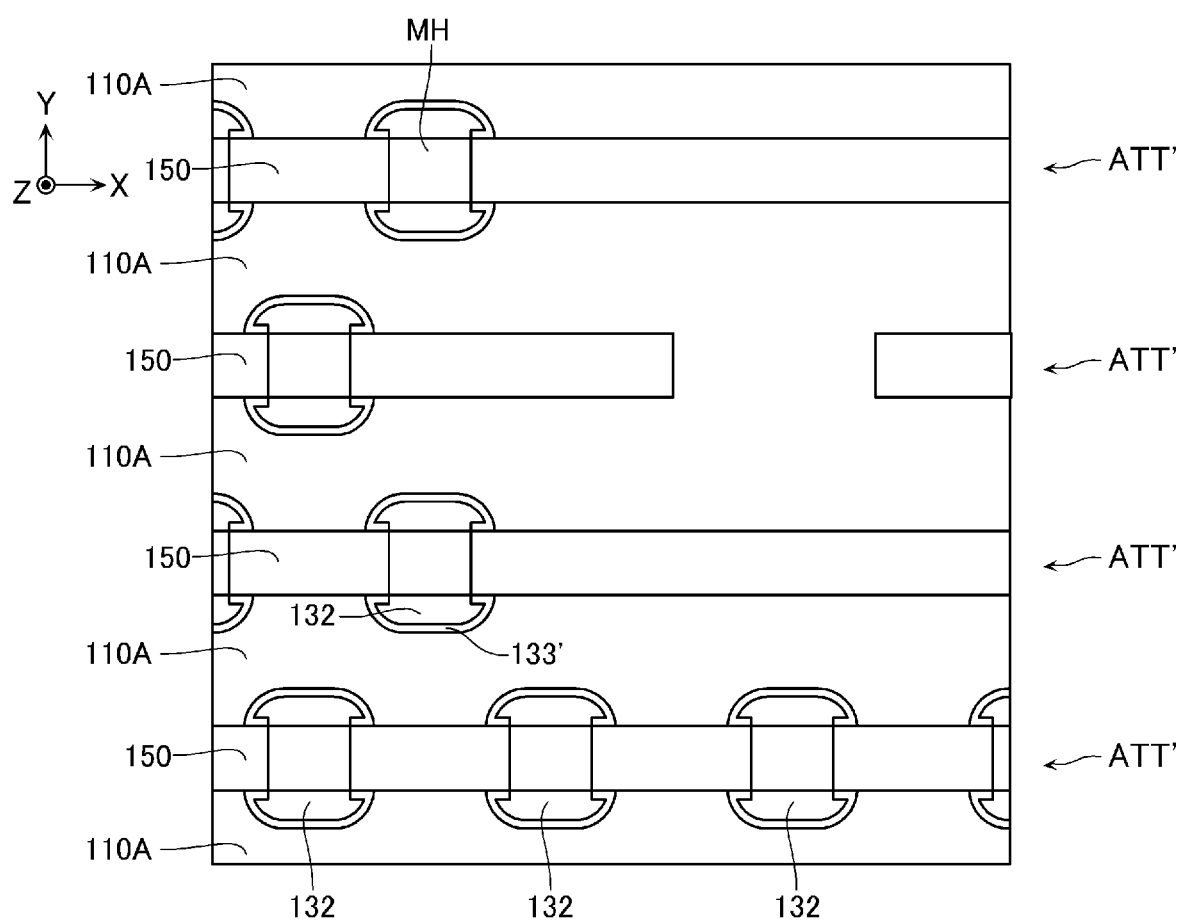
FIG. 64 is a schematic cross-sectional view illustrating the manufacturing method.
Figure 65:
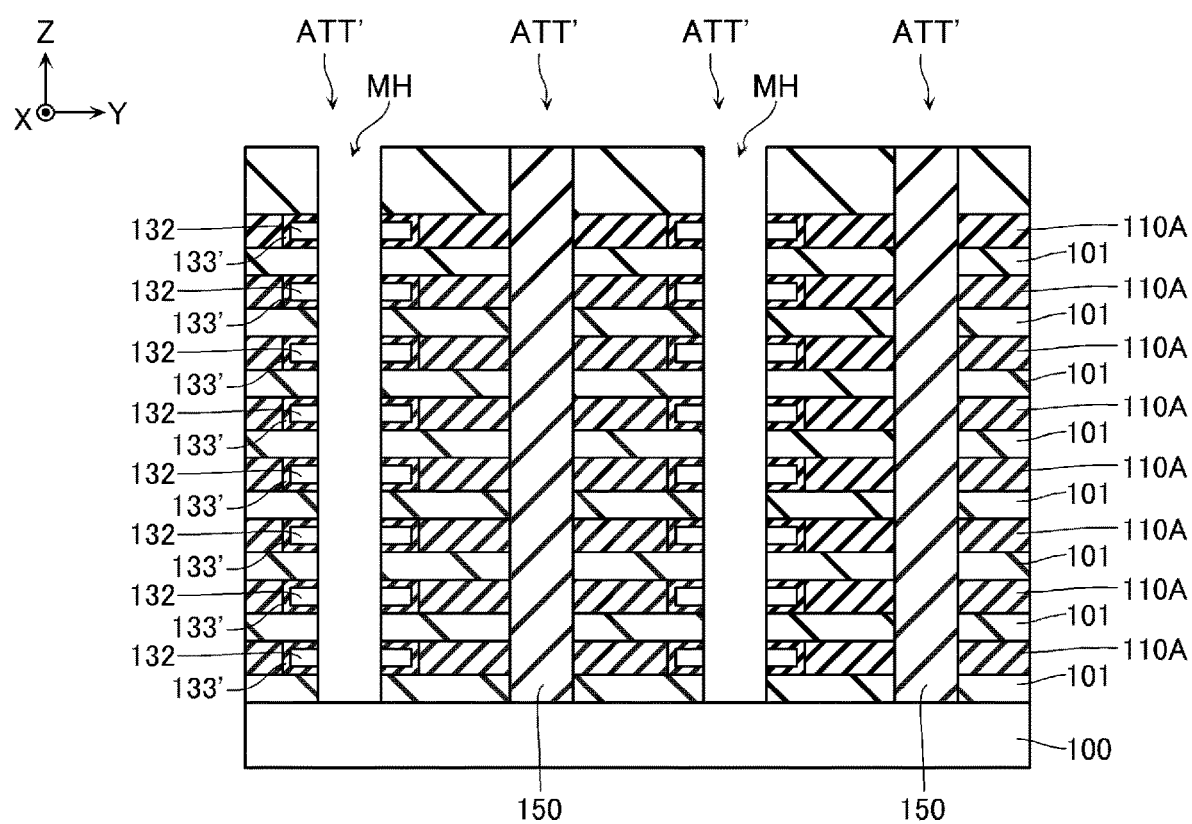
FIG. 65 is a schematic cross-sectional view illustrating the manufacturing method.

Next, the processes described with reference to FIGS. 34 to 37 are executed to form the block insulating layer 133' and the charge storage portion 132 as illustrated in FIGS. 64 and 65.

Figure 66:
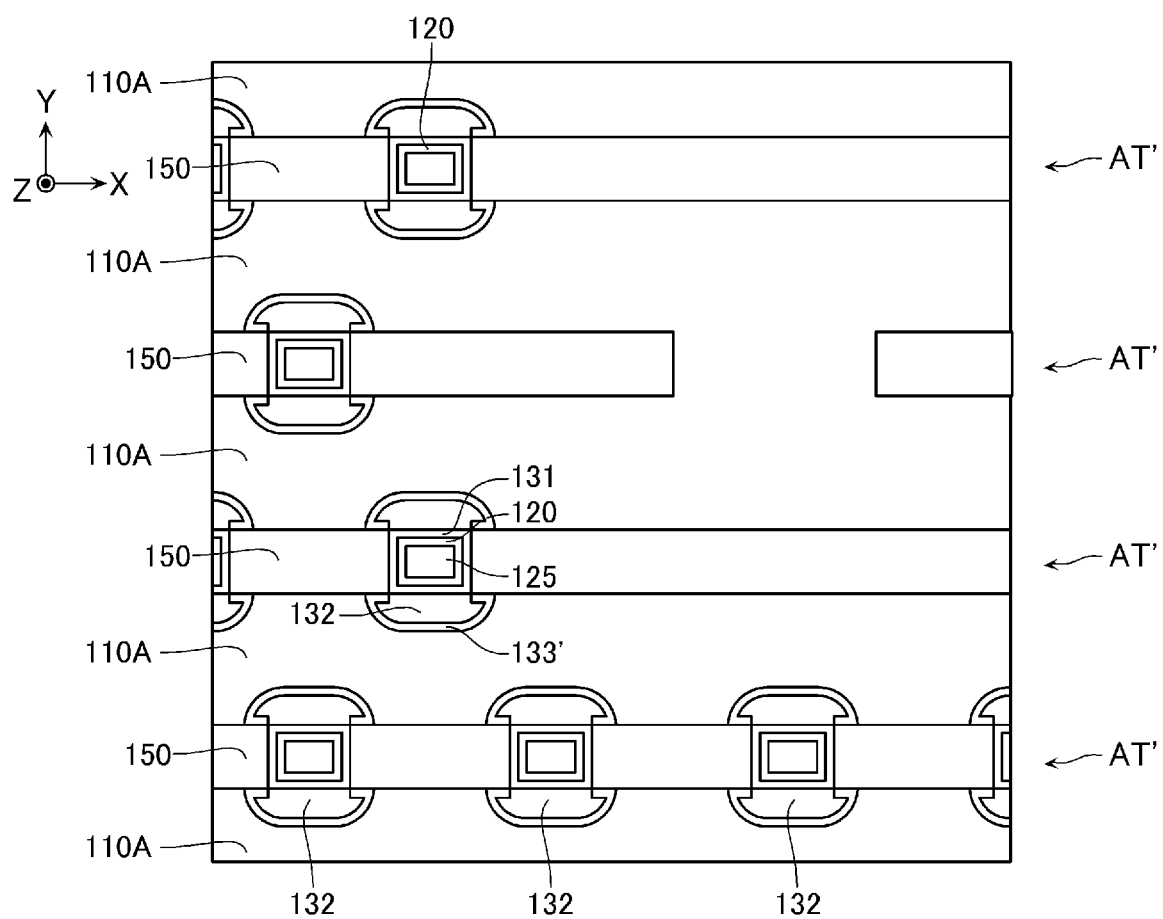
FIG. 66 is a schematic cross-sectional view illustrating the manufacturing method.
Figure 67:
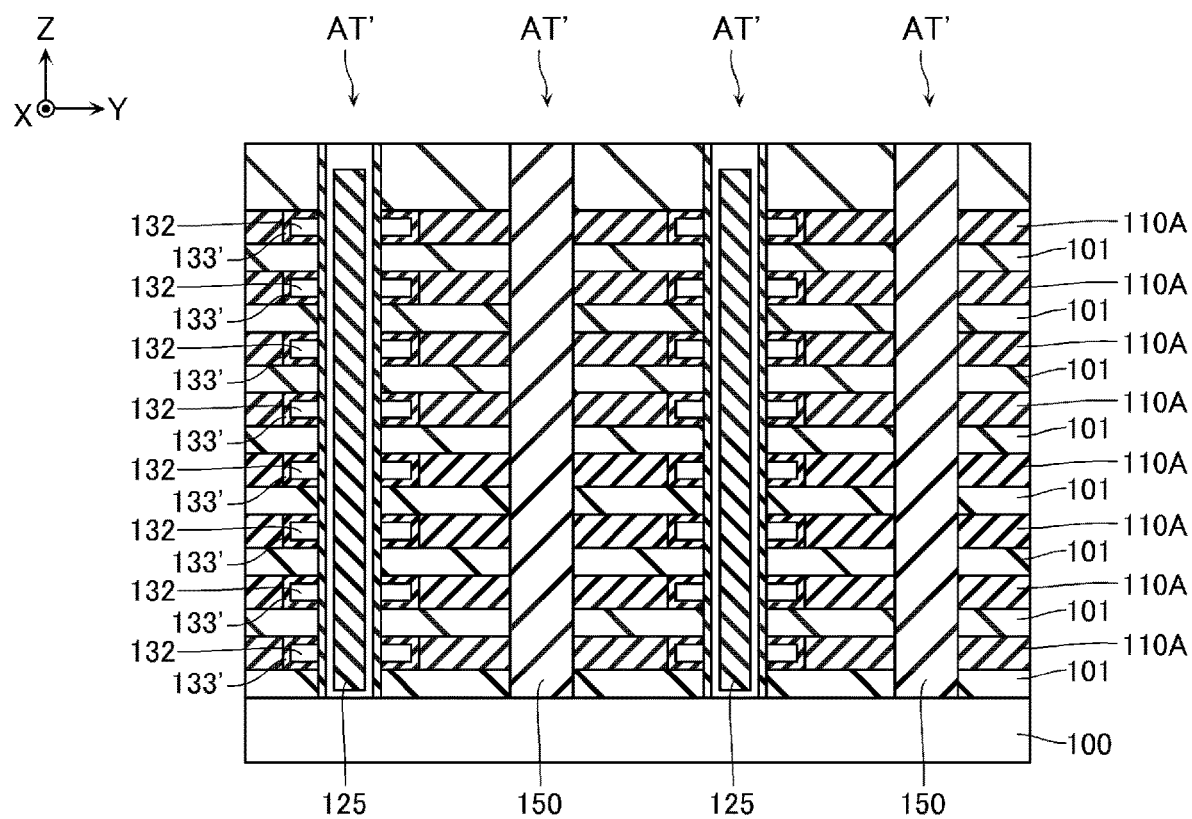
FIG. 67 is a schematic cross-sectional view illustrating the manufacturing method.

Next, the processes described with reference to FIGS. 44 to 47 are executed to form the tunnel insulating layers 131, the semiconductor layers 120, and the insulating layer 125 in the memory hole MH as illustrated in FIGS. 66 and 67.

Figure 68:
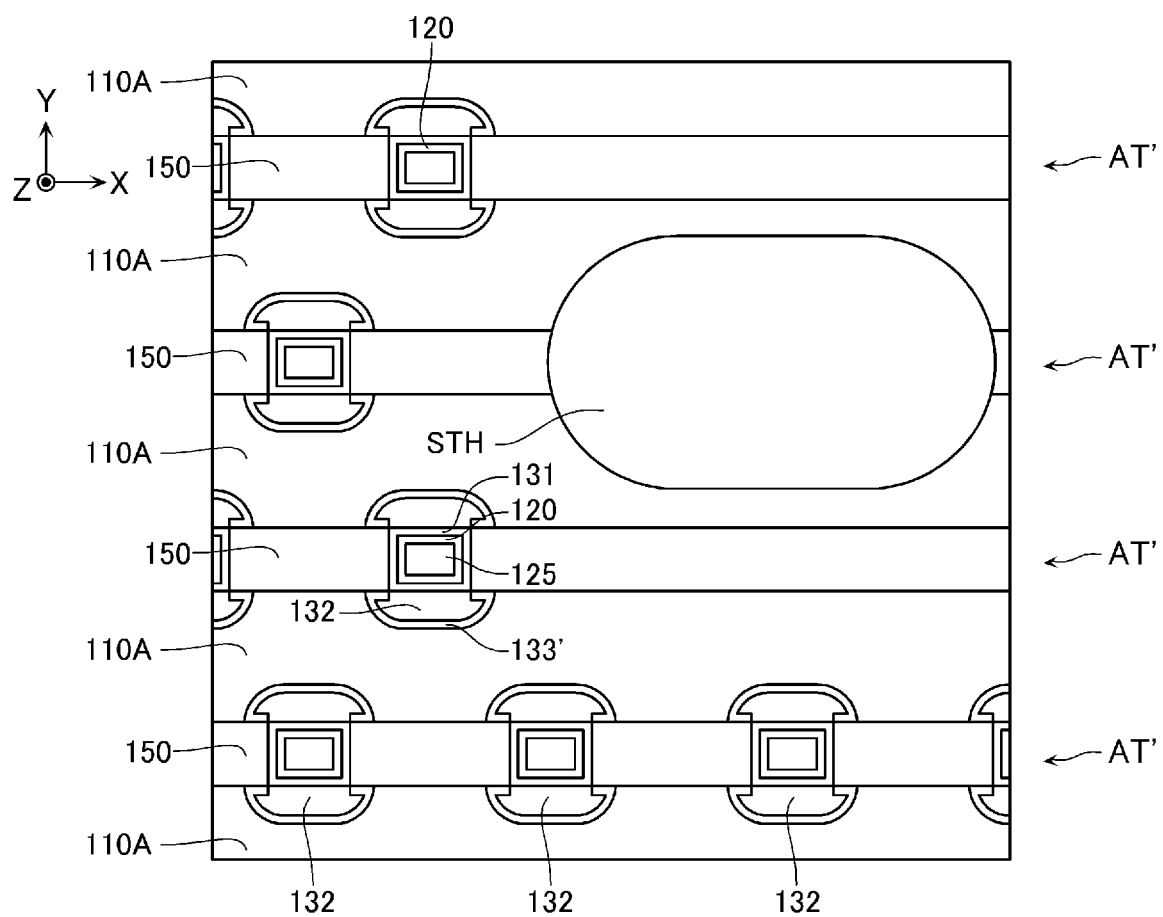
FIG. 68 is a schematic cross-sectional view illustrating the manufacturing method.

Next, as illustrated in FIG. 68, through via holes STH are formed in the structures illustrated in FIGS. 66 and 67. In this process, for example, an insulating layer having an opening in a portion corresponding to the insulating layer 154 is formed on the upper surface of the structure illustrated in FIGS. 66 and 67, and RIE or the like is performed by using the insulating layer as a mask. The through via hole STH exposes the side surfaces of the plurality of insulating layers 101 and the sacrifice layers 110A in the Y direction, the side surfaces of the insulating layers 150 in the X direction, and the upper surface of the semiconductor substrate 100. The through via hole STH penetrates the plurality of insulating layers 101 and the sacrifice layers 110A and separates these components in the Y direction.

Figure 69:
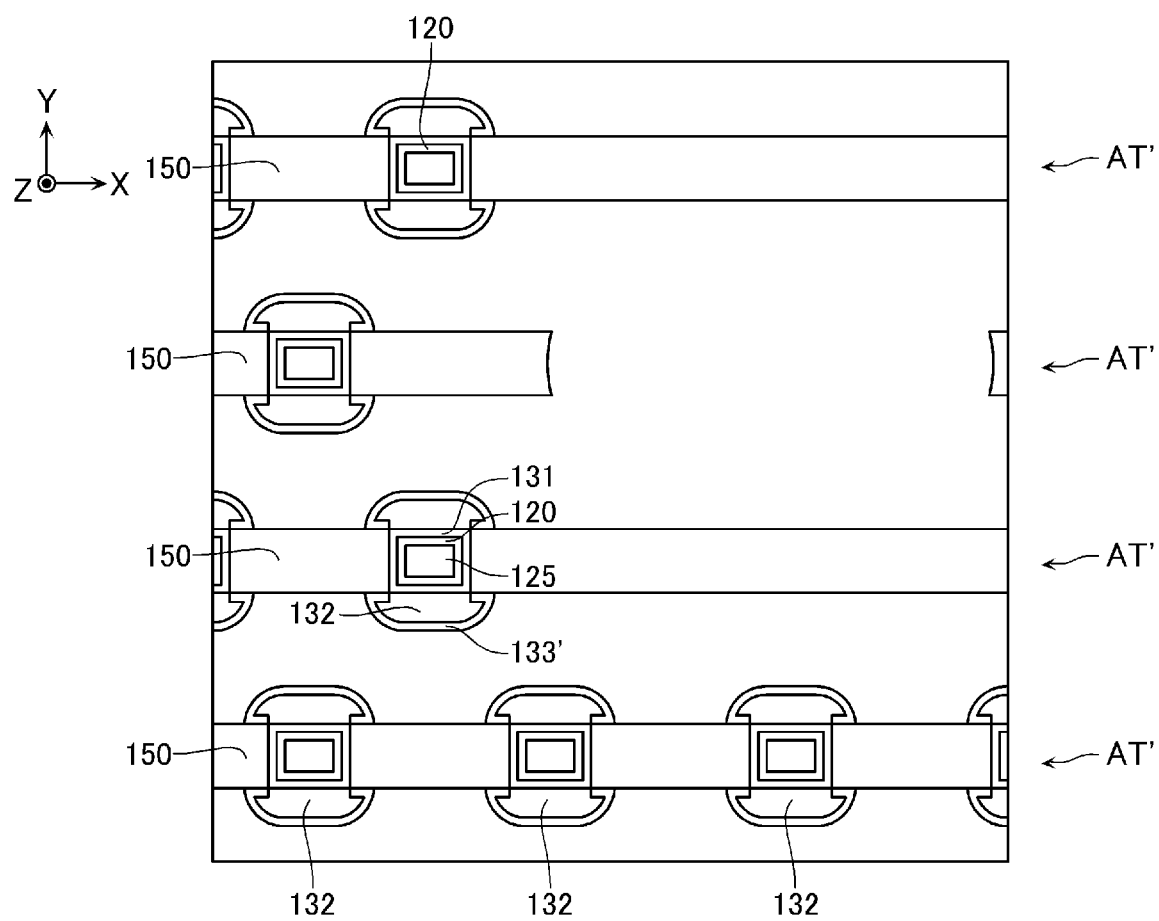
FIG. 69 is a schematic cross-sectional view illustrating the manufacturing method.
Figure 70:
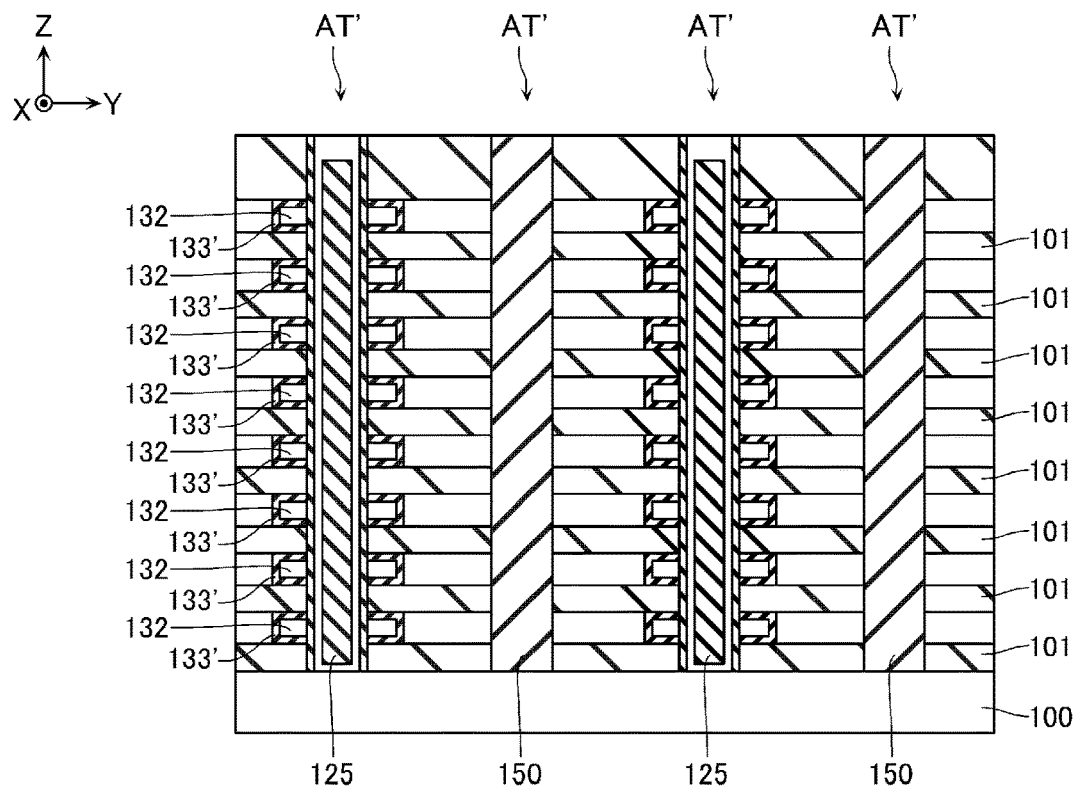
FIG. 70 is a schematic cross-sectional view illustrating the manufacturing method.

Next, as illustrated in FIGS. 69 and 70, the plurality of sacrifice layers 110A are removed through the through via holes STH. This process is performed, for example, by wet etching or the like.

Figure 71:
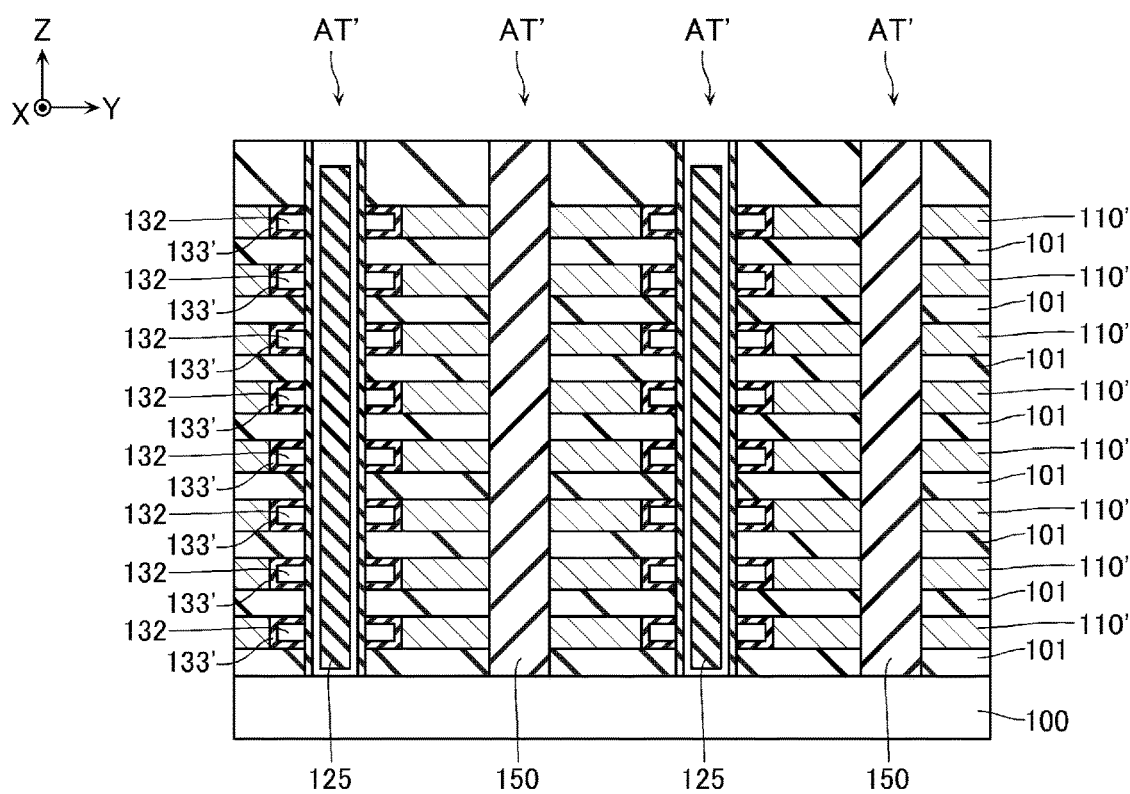
FIG. 71 is a schematic cross-sectional view illustrating the manufacturing method.

Next, as illustrated in FIG. 71, the metal oxide film 136 and the conductive layer 110' are formed on the upper and lower surfaces of the insulating layer 101 and the side surface of the block insulating layer 133' in the Y direction via the through via holes STH.

It is noted that, in the processes described with reference to FIGS. 69 and 70, as illustrated in FIG. 72, not only the portion of the sacrifice layer 110A provided in the memory cell region $R_{MC}$ but also the portion provided in the hookup region $R_{HU}$ is removed. In addition, in the processes described with reference to FIG. 71, as illustrated in FIG. 73, the conductive layer 110' is formed not only in the memory cell region $R_{MC}$ but also in the hookup region $R_{HU}$.

After that, the semiconductor storage device according to Comparative Example is manufactured by forming the contact CC, the bit line BL, and the like.

Effect of First Embodiment

With the high integration of semiconductor storage devices, the number of conductive layers 110' and insulating layers 101 arranged in the Z direction gradually increases. Along with this, the height of the stacked structure including the plurality of sacrifice layers 110A and the insulating layers 101 as illustrated in FIG. 13 in the Z direction also gradually increases. Herein, for example, as illustrated in FIG. 59, when the stacked structure is separated along a line-and-space pattern, there is a concern that the pattern may collapse. Therefore, in Comparative Example, as illustrated in FIG. 58, by interrupting a portion of the trench ATT', portions of two structures adjacent to each other in the Y direction are physically connected, and thus, the collapse of such a pattern is prevented.

Herein, when such a method is adopted, as described with reference to FIG. 68, it is necessary to completely separate the plurality of sacrifice layers 110A and the insulating layers 101 adjacent to each other in the Y direction by the through via hole STH. In such a method, when the through via hole STH is allowed to be too small, in some cases, it may be difficult to completely separate the plurality of sacrifice layers 110A and the insulating layers 101. However, when the through via hole STH has a size larger than a certain level, the sacrifice layer 110A and the insulating layer 101 are separated in the X direction according to the deviation of the position of the through via hole STH, or high resistance of the conductive layer 110 formed in this portion may occur. In consideration of this point, it is necessary to allow the interval between the trenches ATT' in the Y direction to have a certain margin, and thus, in some cases, it may be difficult to highly integrate the semiconductor storage device in the Y direction.

Therefore, in the first embodiment, the even-numbered or odd-numbered trench ATTc is formed in the processes described with reference to FIGS. 14 and 15, the insulating layer 150 is formed in the trench ATTc in the processes described with reference to FIGS. 16 and 17, and the odd-numbered or even-numbered trench ATTd is formed in the processes described with reference to FIGS. 18 and 19.

According to such a method, the size of the line-and-space pitch is doubled. Accordingly, it is possible to prevent the collapse of the pattern without using the trench ATT' having the interrupted pattern. Therefore, it is possible to achieve high integration of the semiconductor storage device in the Y direction by shortening the through via hole STH.

It is noted that, in the first embodiment, in the processes described with reference to FIGS. 20 and 21, a portion of the sacrifice layers 110A remains on the side surfaces of the insulating layers 150 formed inside the trenches ATTc. Therefore, the range in which the sacrifice layers 110A are removed in this process is a range of about the width of the conductive layer 110 in the Y direction from the trench ATTd. Therefore, as illustrated in FIG. 48, the sacrifice layers 110A remain in the hookup region $R_{HU}$.

Therefore, in the first embodiment, the trench ST is formed again in the processes described with reference to FIG. 49, the sacrifice layers 110A in the hookup region $R_{HU}$ are removed through the trench ST, and the conductive layers 160 are formed in the hookup region $R_{HU}$.

Second Embodiment

Figure 74:
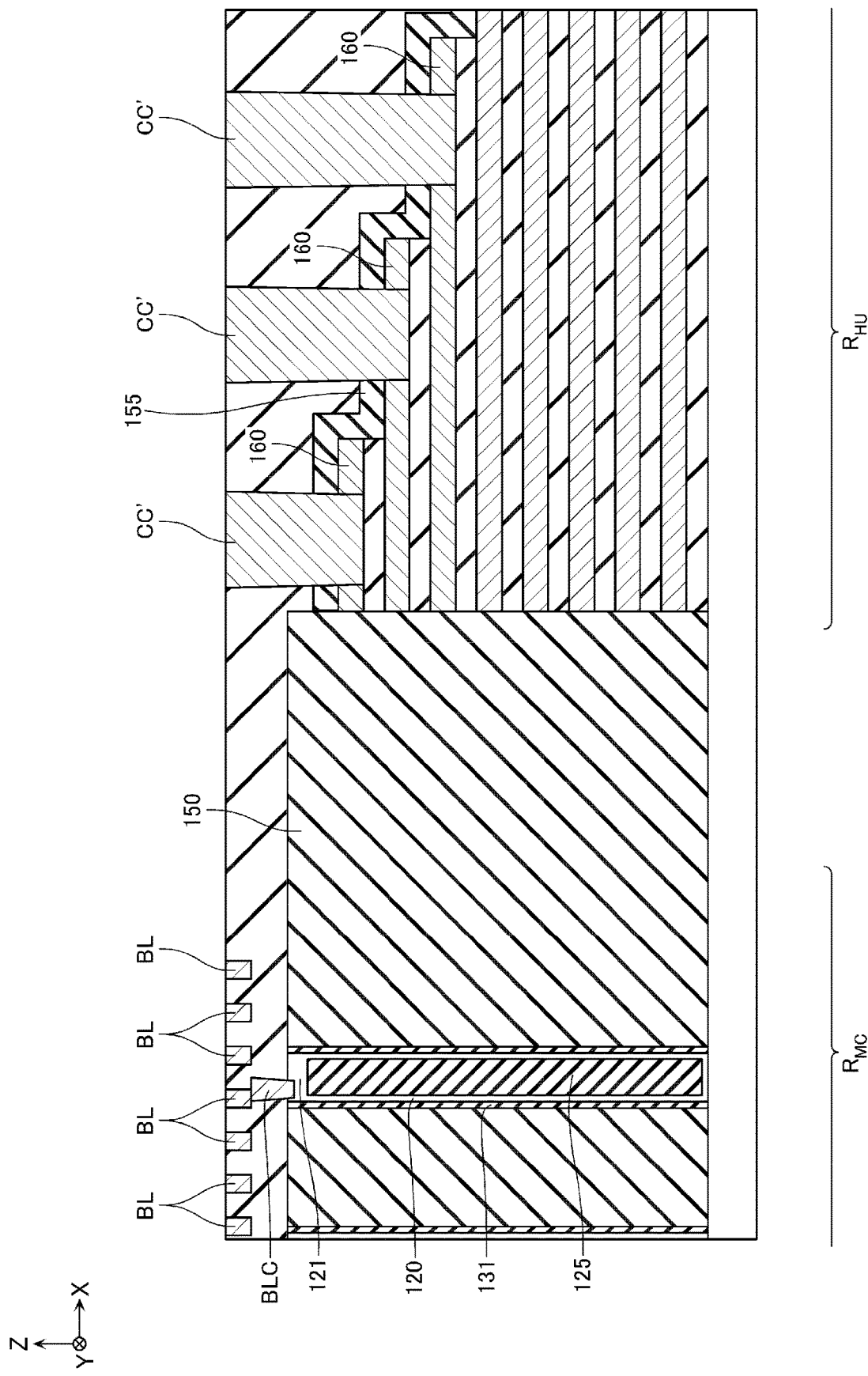
FIG. 74 is a schematic cross-sectional view of the semiconductor storage device according to the second embodiment.
Figure 75:
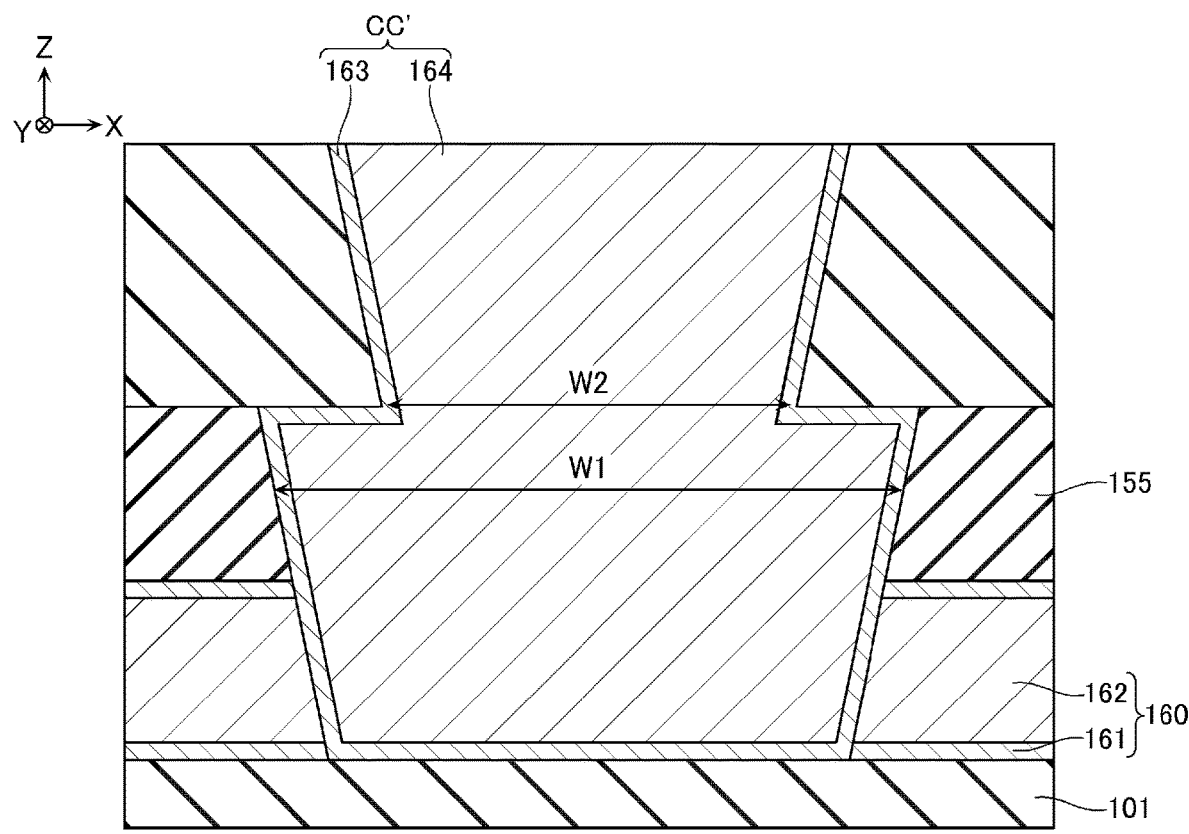
FIG. 75 is a schematic cross-sectional view of the semiconductor storage device.

Next, a semiconductor storage device according to a second embodiment will be described with reference to FIGS. 74 and 75. FIG. 74 is a schematic XZ cross-sectional view illustrating a configuration of the semiconductor storage device according to the second embodiment in a hookup region $R_{HU}$. FIG. 75 is a schematic enlarged view illustrating a portion of the configuration of FIG. 74.

The semiconductor storage device according to the second embodiment is basically configured in the same manner as the semiconductor storage device according to the first embodiment. However, the semiconductor storage device according to the second embodiment is different from that of the first embodiment in terms of a structure in the hookup region $R_{HU}$.

For example, in the second embodiment, an insulating layer 155 is provided on the upper surface of each conductive layer 160. The insulating layer 155 may be made of, for example, a metal oxide such as alumina.

In addition, the semiconductor storage device according to the second embodiment includes a contact CC' instead of the contact CC. The contact CC' is basically configured in the same manner as the contact CC according to the first embodiment. However, the contact CC' illustrated in FIG. 75 penetrates the conductive layer 160 corresponding to the contact CC'. In addition, the lower end of the contact CC' and the lower surface of the conductive layer 160 are connected to the upper surface of a common insulating layer 101. In addition, the width W1 of the portion of the contact CC' provided at the height position corresponding to the insulating layer 155 in the X direction and the Y direction is larger than the width W2 of the portion located immediately above the contact CC' in the X direction and the Y direction.

[Manufacturing Method]

Next, a method of manufacturing the semiconductor storage device according to the second embodiment will be described with reference to FIGS. 76 to 84. FIGS. 76 to 78 and 81 to 83 are schematic cross-sectional views illustrating the manufacturing method and correspond to the portions illustrated in FIG. 74. FIGS. 79, 80, 84, and 85 are schematic cross-sectional views illustrating the manufacturing method and correspond to the portions illustrated in FIG. 75.

In manufacturing the semiconductor storage device according to the second embodiment, the processes described with reference to FIG. 13 are executed.

Figure 76:
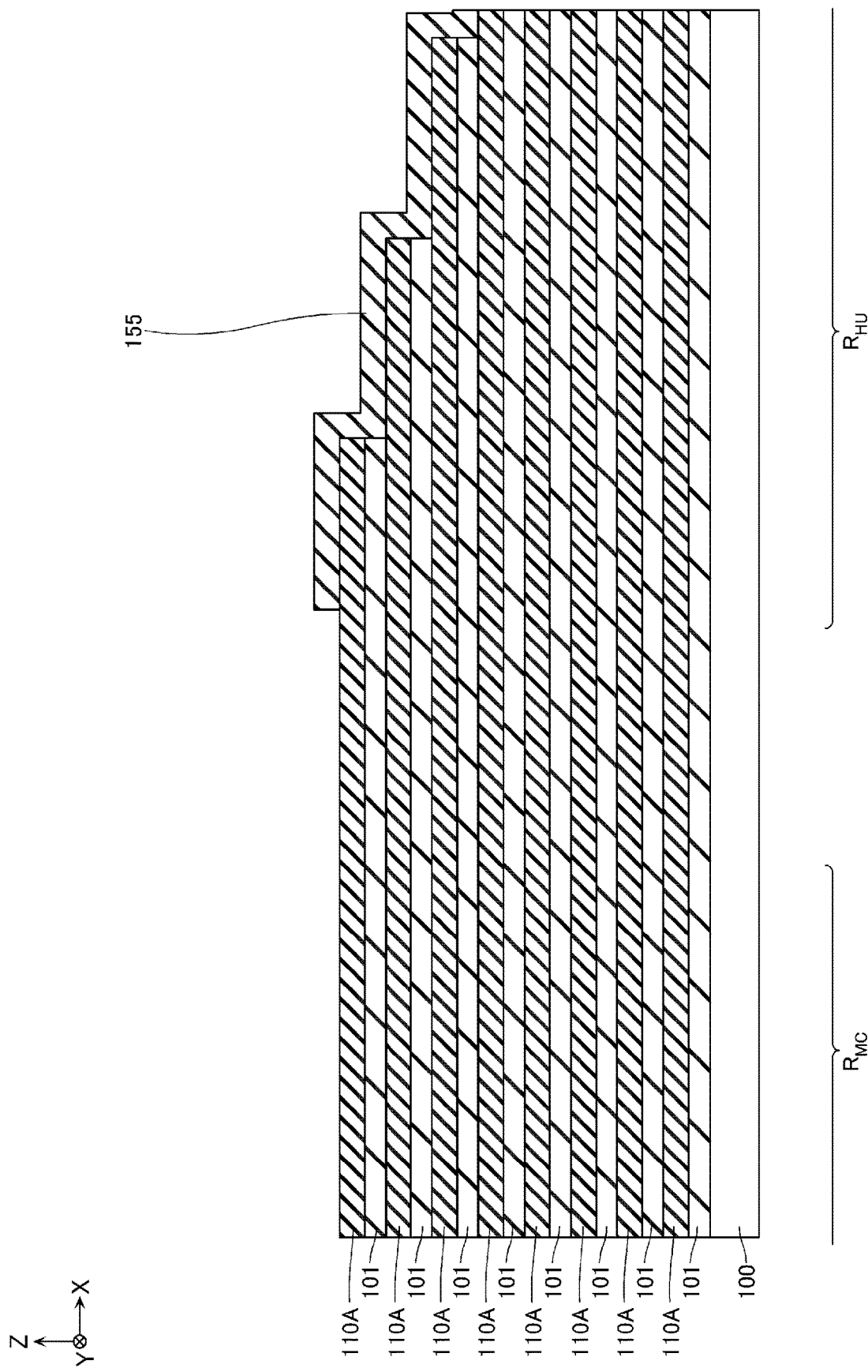
FIG. 76 is a schematic cross-sectional view illustrating a method of manufacturing the semiconductor storage device.

Next, as illustrated in FIG. 76, the insulating layer 155 is formed in the hookup region $R_{HU}$. The insulating layer 155 covers the end portions of the plurality of sacrifice layers 110A in the X direction. This process is performed, for example, by CVD, wet etching, or the like.

Figure 77:
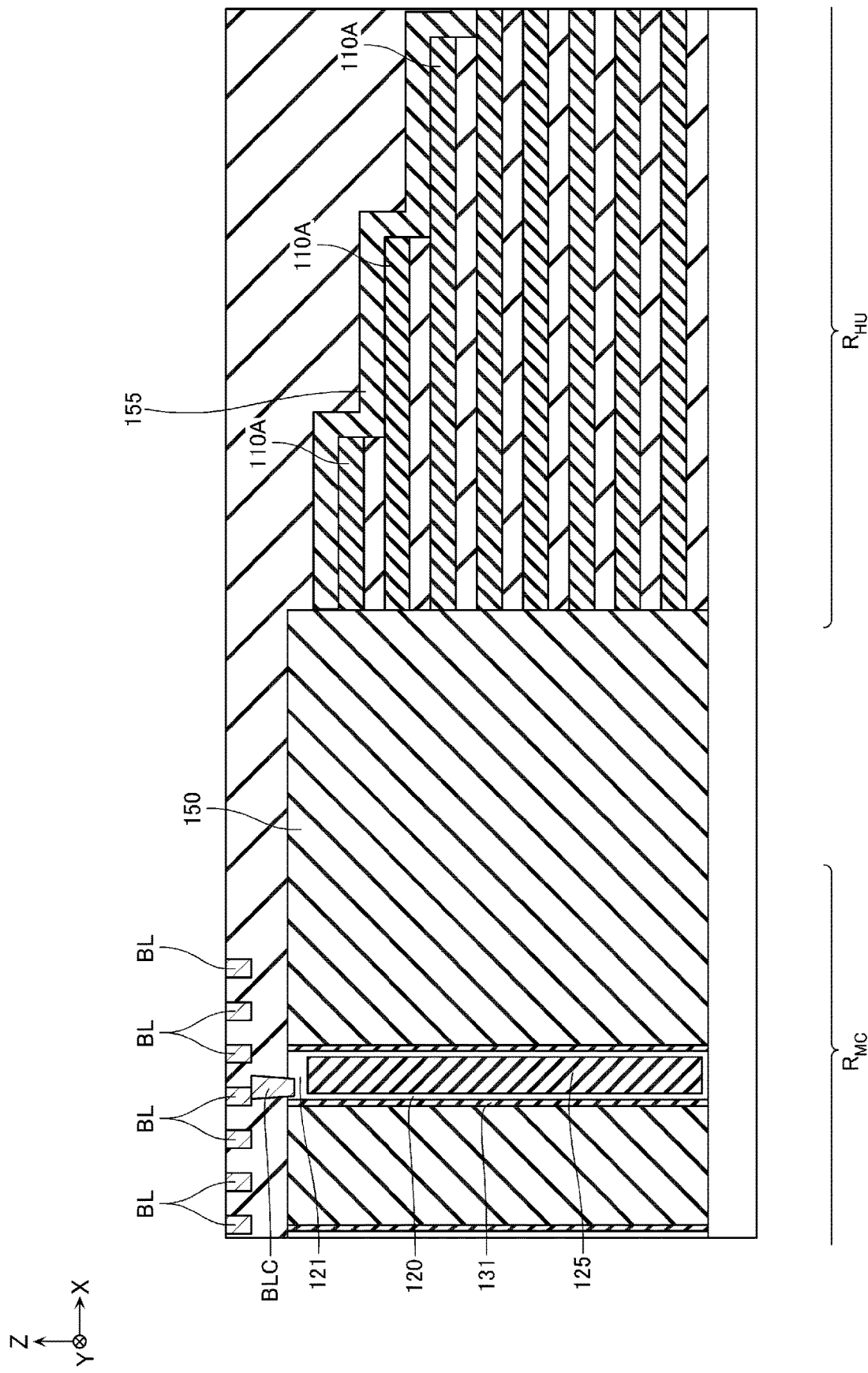
FIG. 77 is a schematic cross-sectional view illustrating the manufacturing method.

Next, the processes described with reference to FIGS. to 48 are executed. Accordingly, the structure as illustrated in FIG. 77 is formed.

Figure 78:
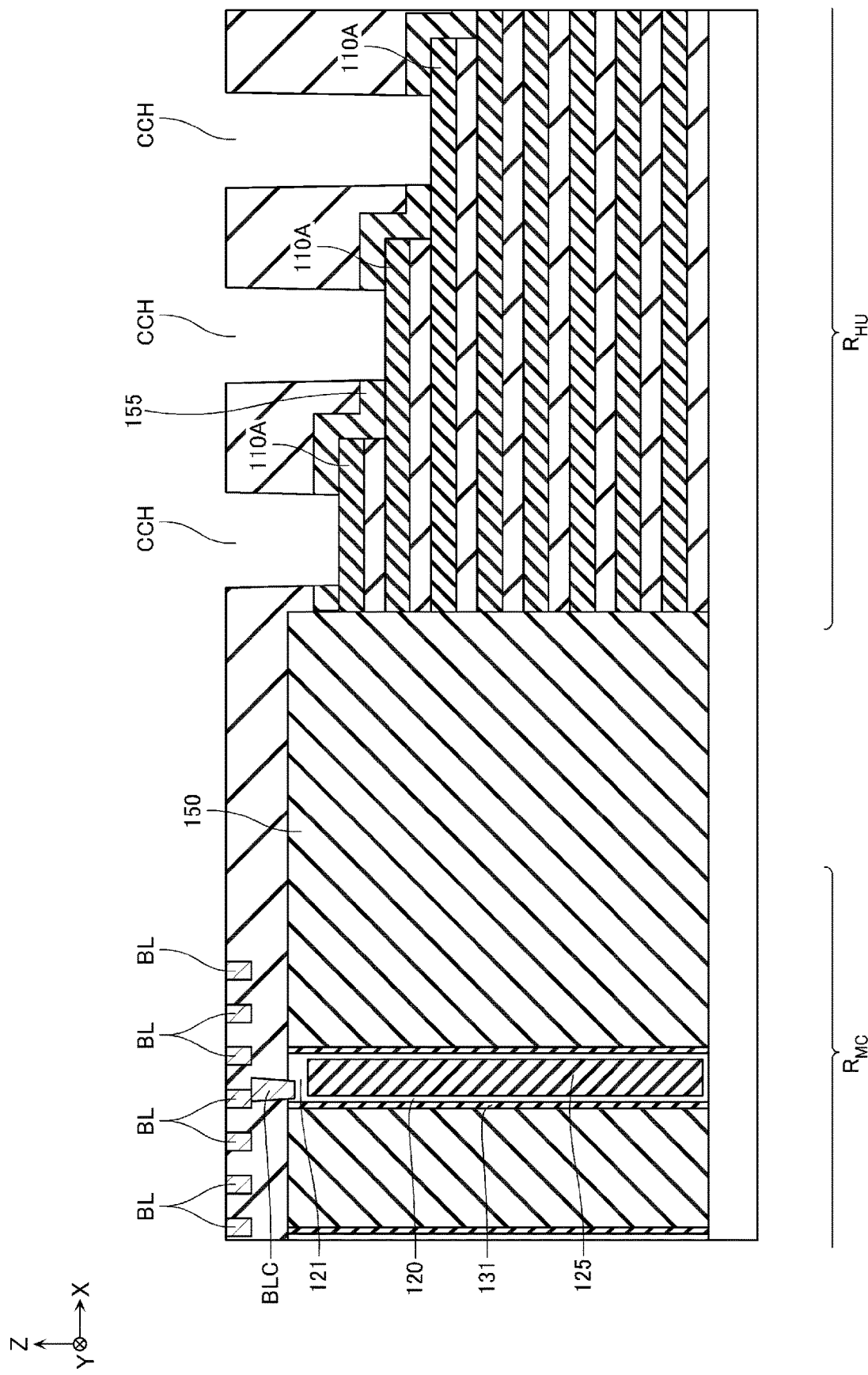
FIG. 78 is a schematic cross-sectional view illustrating the manufacturing method.
Figure 79:
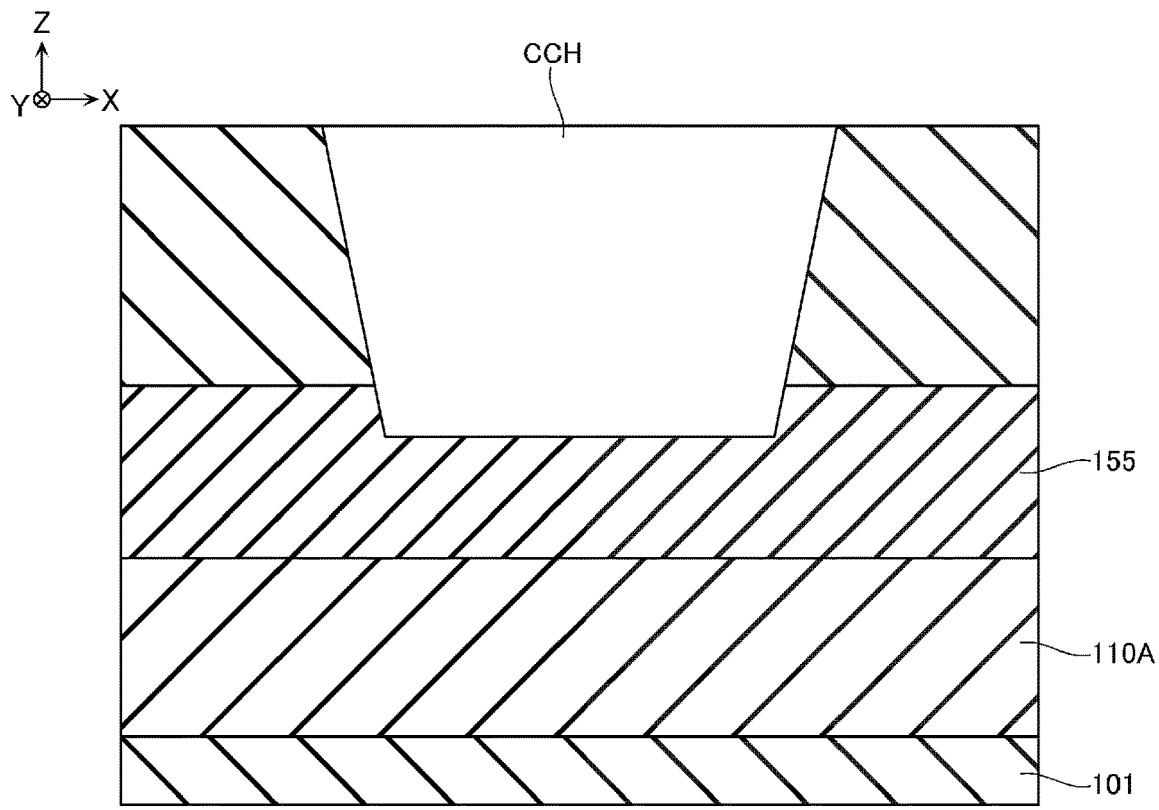
FIG. 79 is a schematic cross-sectional view illustrating the manufacturing method.
Figure 80:
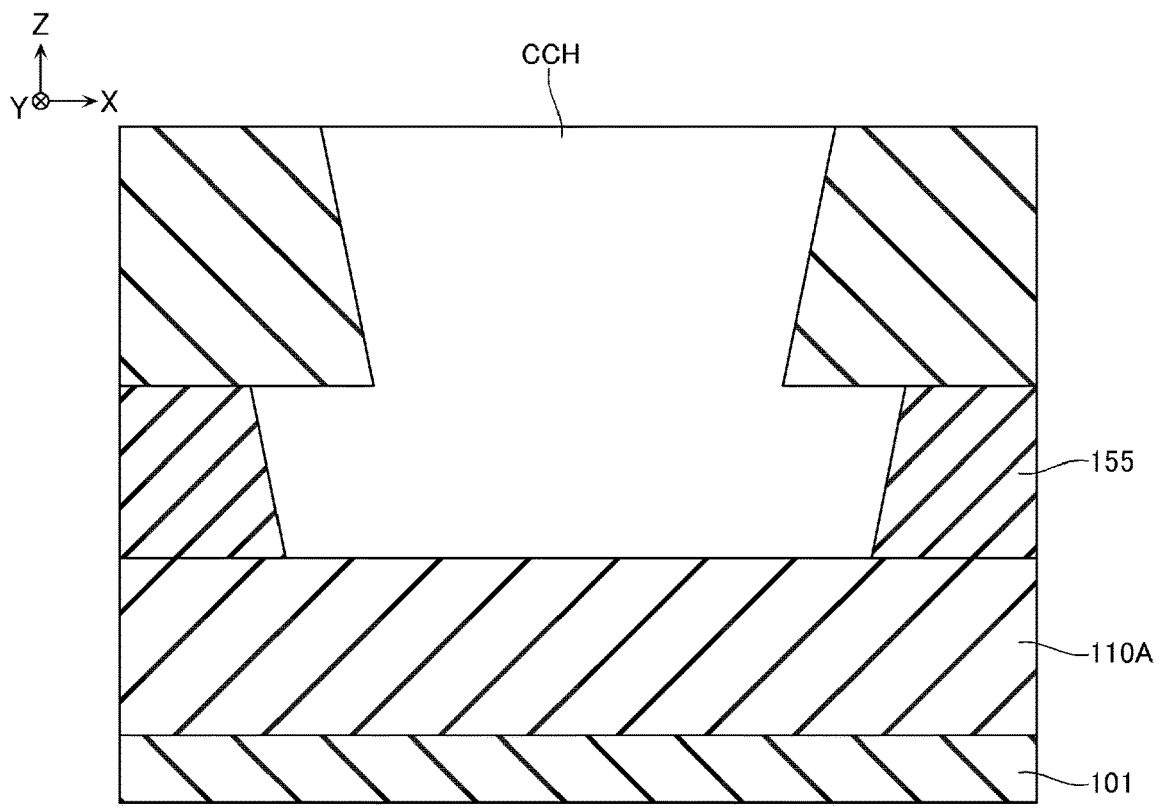
FIG. 80 is a schematic cross-sectional view illustrating the manufacturing method.

Next, as illustrated in FIG. 78, a contact hole CCH is formed. In this process, for example, an insulating layer having an opening in a portion corresponding to the contact CC' is formed on the upper surface of the structure illustrated in FIG. 77, and RIE or the like is performed by using the insulating layer as a mask. Accordingly, for example, as illustrated in FIG. 79, the upper surface of the insulating layer 155 is exposed. Next, a portion of the insulating layer 155 is removed by a method such as wet etching to expose the upper surface of the sacrifice layer 110A. Accordingly, for example, as illustrated in FIG. 80, the diameter of the lower end portion of the contact hole CCH is increased.

Figure 81:
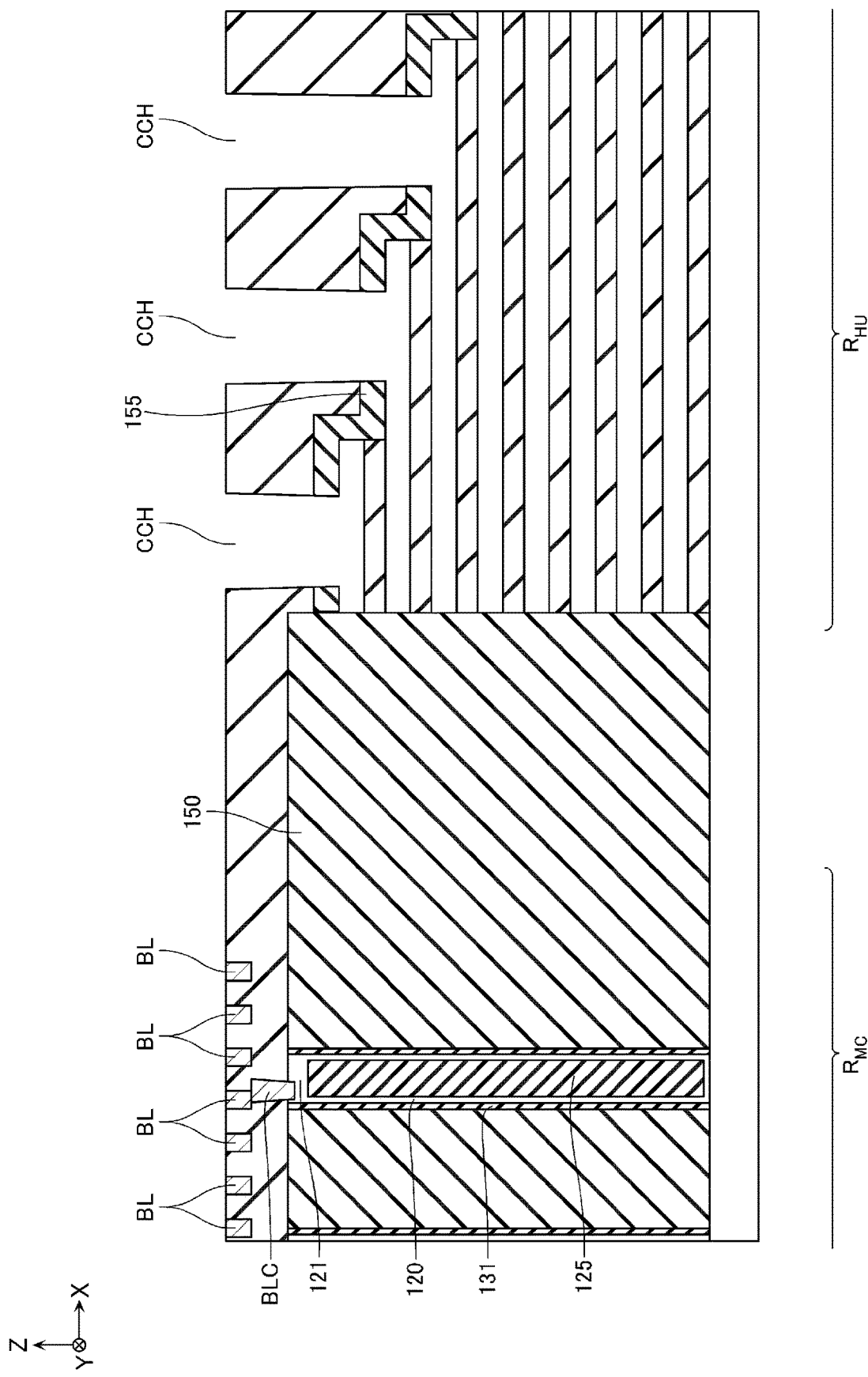
FIG. 81 is a schematic cross-sectional view illustrating the manufacturing method.
Figure 82:
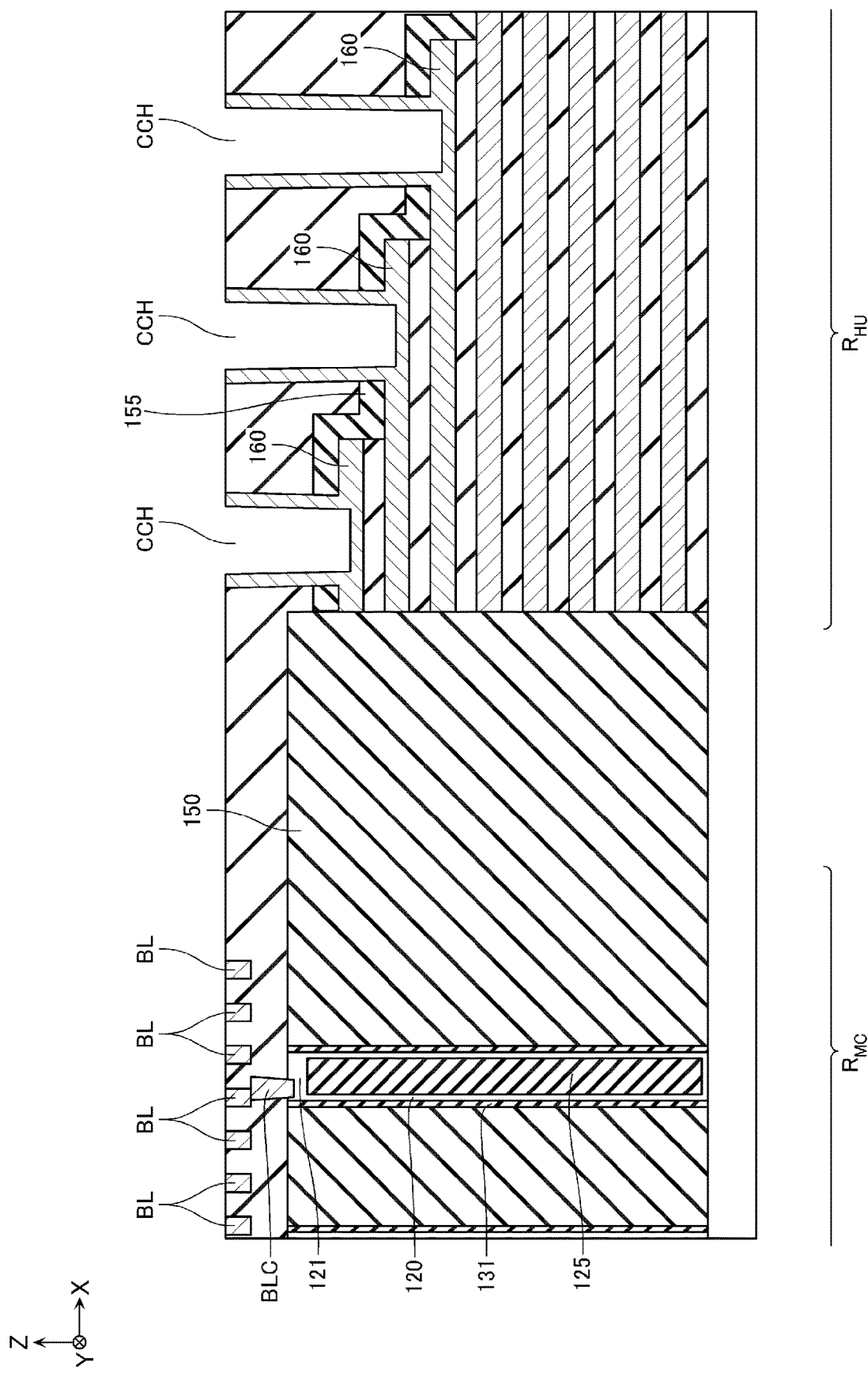
FIG. 82 is a schematic cross-sectional view illustrating the manufacturing method.

Next, as illustrated in FIG. 81, the plurality of sacrifice layers 110A are removed through the contact holes CCH. This process is performed, for example, by wet etching or the like.

Next, as illustrated in FIGS. 82 to 85, the conductive layer 160 is formed on the upper and lower surfaces of the insulating layer 101 via the contact hole CCH. In this process, for example, the conductive layer 160 is formed by CVD, and a portion of the conductive layer 160 is removed by wet etching or the like.

Next, as illustrated in FIGS. 74 and 75, the contact CC' is formed in the contact hole CCH. This process is performed by, for example, CVD or the like.

After that, the semiconductor storage device according to the second embodiment is manufactured by forming the bit line BL or the like.

Third Embodiment

Figure 86:
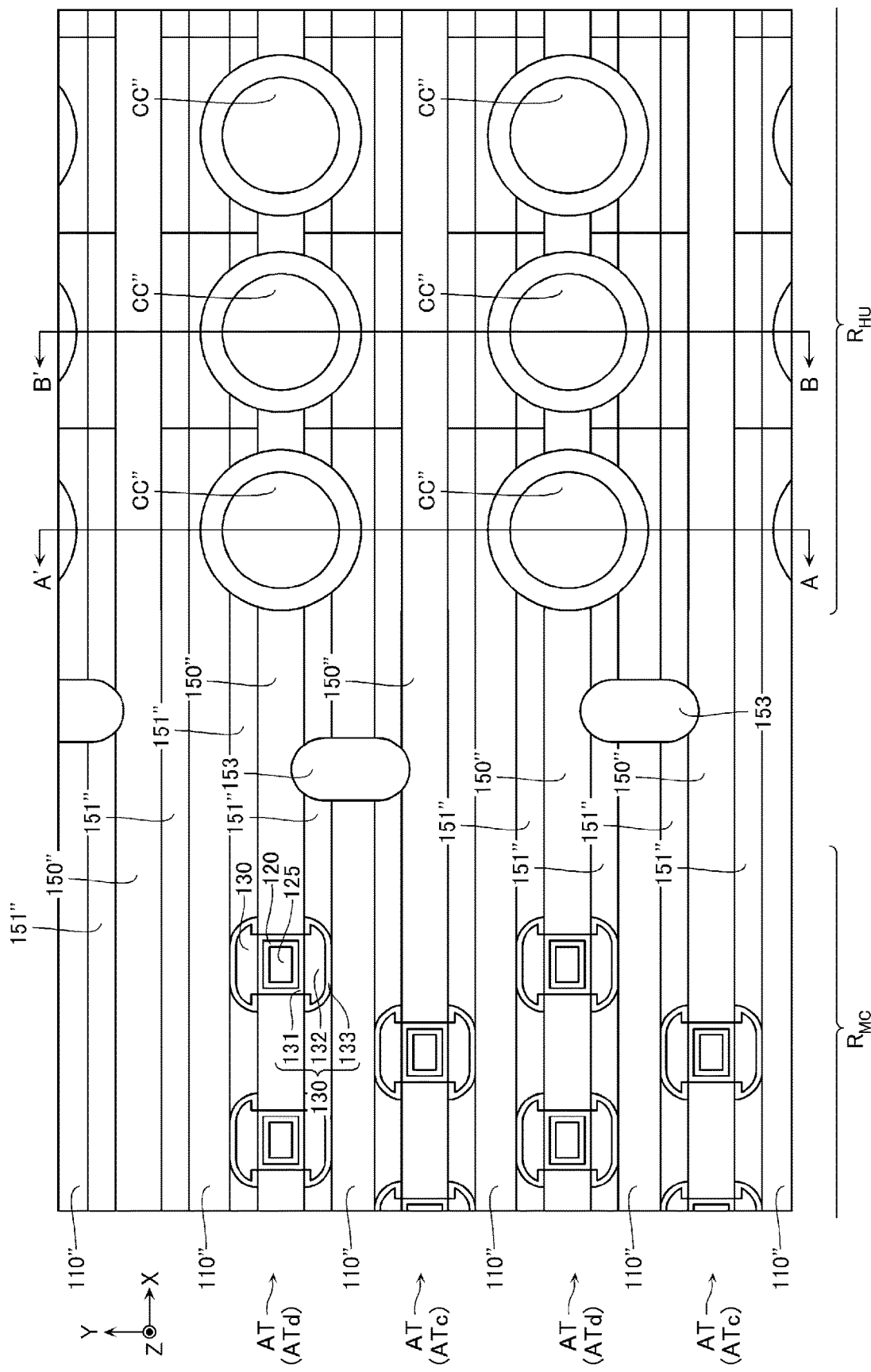
FIG. 86 is a schematic cross-sectional view of the semiconductor storage device according to the third embodiment.

Next, a semiconductor storage device according to a third embodiment will be described with reference to FIGS. 86 to

Figure 87:
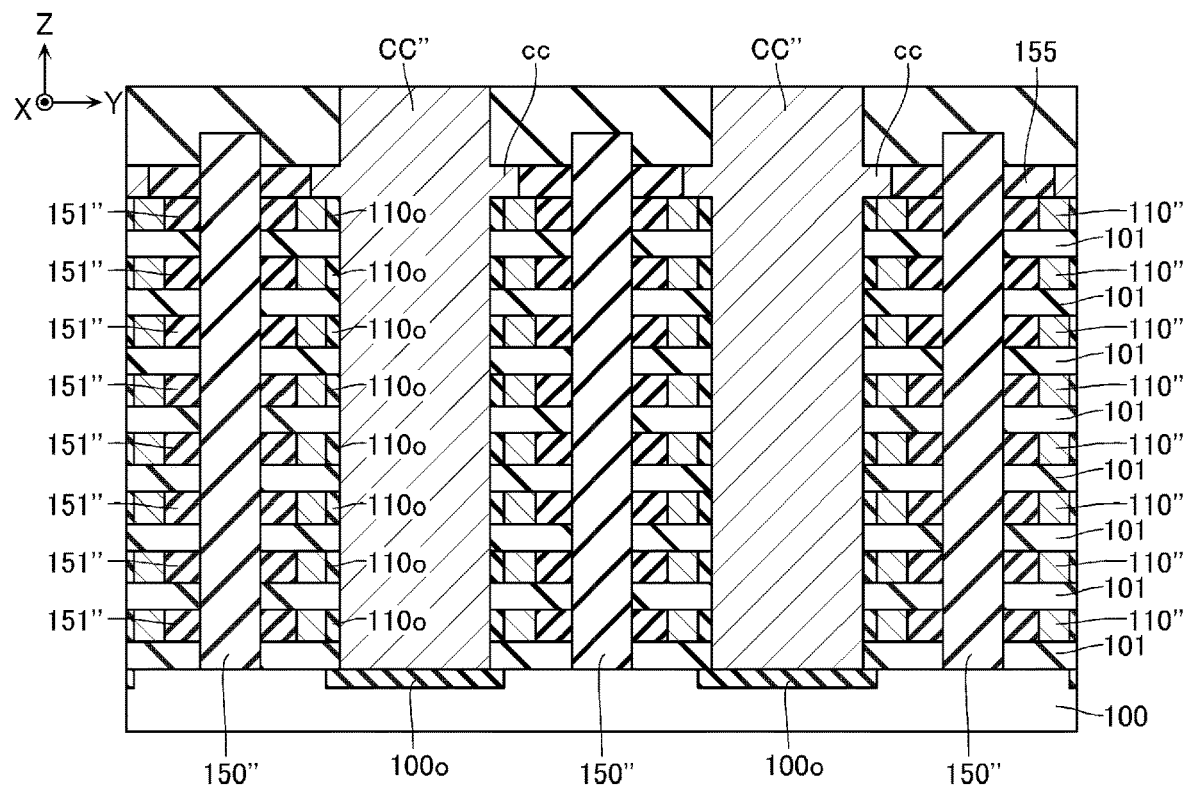
FIG. 87 is a schematic cross-sectional view of the semiconductor storage device.
Figure 88:
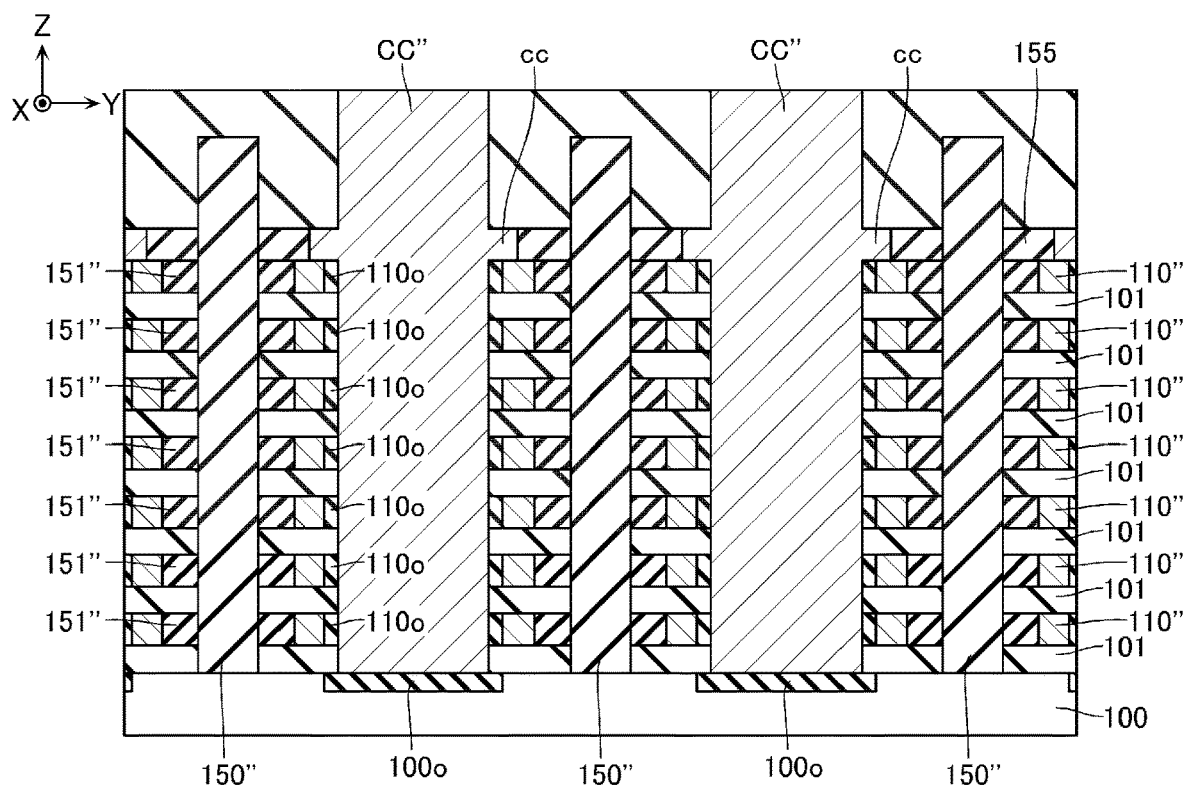
FIG. 88 is a schematic cross-sectional view of the semiconductor storage device.

88. FIG. 86 is a schematic plan view illustrating a configuration of the semiconductor storage device according to the third embodiment in the hookup region $R_{HU}$. FIG. 87 is a schematic cross-sectional view when the structure illustrated in FIG. 86 is taken along a line A-A' and viewed along a direction of an arrow. FIG. 88 is a schematic cross-sectional view when the structure illustrated in FIG. 86 is taken along a line B-B' and viewed along a direction of an arrow.

The semiconductor storage device according to the third embodiment is basically configured in the same manner as the semiconductor storage device according to the first embodiment. However, the semiconductor storage device according to the third embodiment is different from that of the first embodiment in terms of a structure in the hookup region $R_{HU}$.

For example, the semiconductor storage device according to the third embodiment includes a conductive layer 110", an insulating layer 150", an insulating layer 151", and a contact CC" instead of the conductive layer 110, the insulating layer 150, the insulating layer 151 and the contact CC.

The conductive layer 110", the insulating layer 150", and the insulating layer 151" are basically configured in the same manner as the conductive layer 110, the insulating layer 150, and the insulating layer 151 according to the first embodiment. However, the conductive layer 110", the insulating layer 150", and the insulating layer 151, according to the embodiment extend in the X direction not only in the memory cell region $R_{MC}$ but also in the memory cell region $R_{MC}$ and the hookup region $R_{HU}$.

In addition, as illustrated in FIGS. 87 and 88, in the third embodiment, the insulating layer 155 is provided on the upper surface of the portion of the conductive layer 110" provided in the hookup region $R_{HU}$.

The contact CC" is basically configured in the same manner as the contact CC according to the first embodiment. However, as illustrated in FIGS. 87 and 88, the contact CC" penetrates the plurality of conductive layers 110" to extend in the Z direction. In addition, an insulating layer 110o made of tungsten oxide (WO) or the like is provided between the contact CC" and the conductive layer 110". In addition, an insulating layer 100o made of silicon oxide ($SiO_2$) or the like is provided between the contact CC" and the semiconductor substrate 100.

In addition, in the contact CC", an enlarged diameter portion cc is provided at a height position corresponding to the insulating layer 155. The widths of the enlarged diameter portion cc in the X direction and the Y direction are larger than the widths of the other portion in the X direction and the Y direction. Each lower surface of the enlarged diameter portion cc is connected to the upper surface of the conductive layer 110".

[Manufacturing Method]

Next, a method of manufacturing the semiconductor storage device according to the third embodiment will be described with reference to FIGS. 89 to 96. FIGS. 89, 91, 93, and 95 are schematic cross-sectional views illustrating the manufacturing method and correspond to the portions illustrated in FIG. 87. FIGS. 90, 92, 94, and 96 are schematic cross-sectional views illustrating the manufacturing method and correspond to the portions illustrated in FIG. 88.

In manufacturing the semiconductor storage device according to the third embodiment, the processes described with reference to FIG. 13 and the processes described with reference to FIG. 76 are executed.

Figure 89:
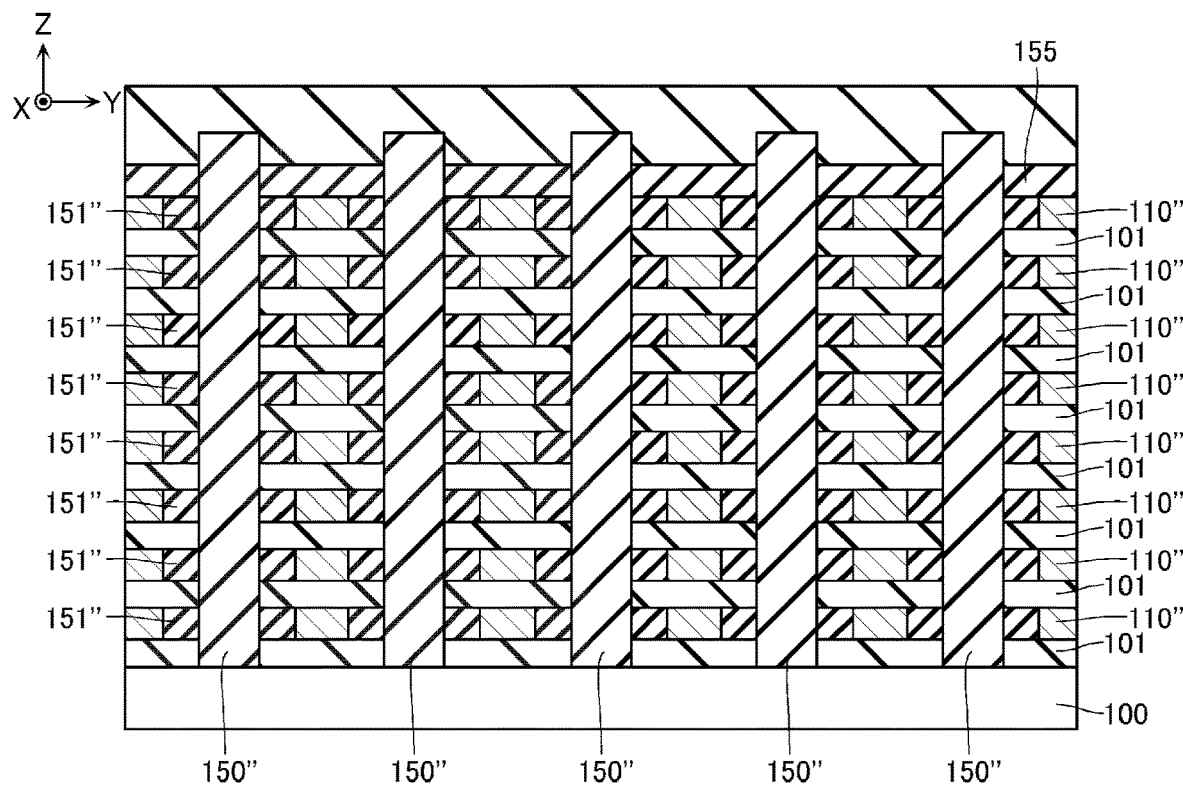
FIG. 89 is a schematic cross-sectional view illustrating a method of manufacturing the semiconductor storage device.
Figure 90:
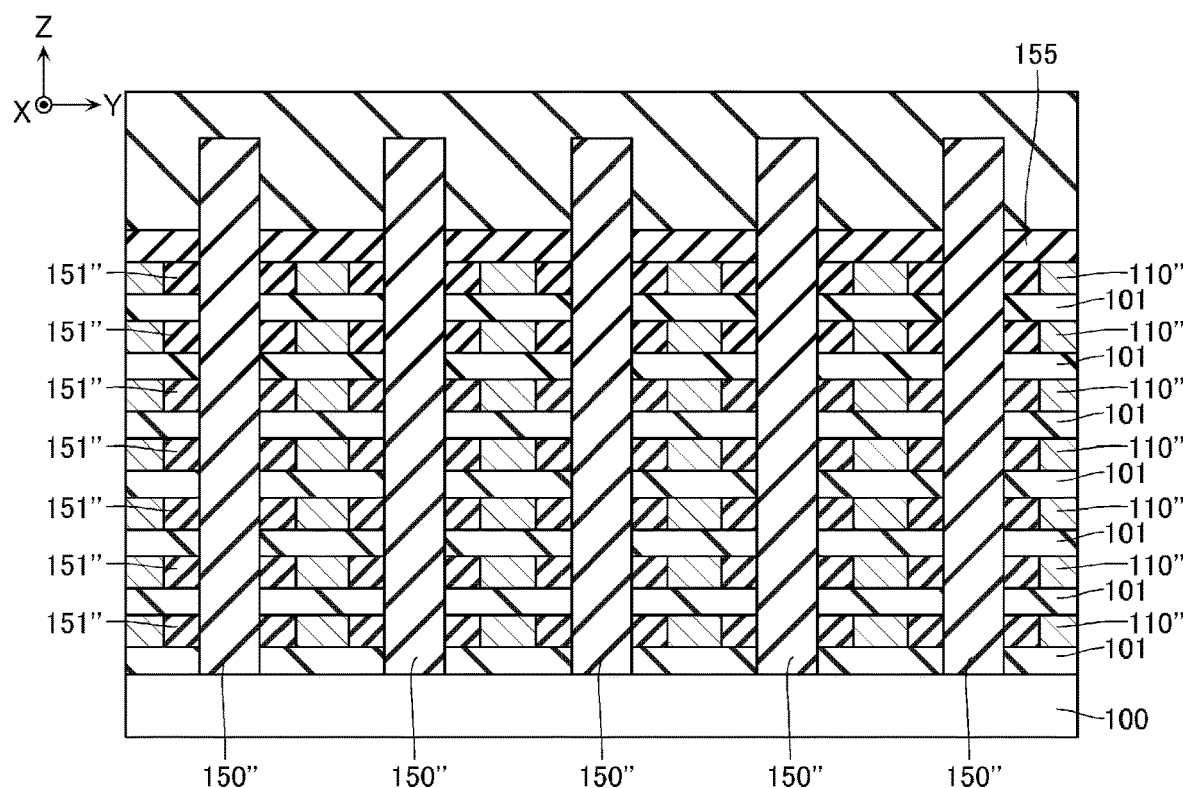
FIG. 90 is a schematic cross-sectional view illustrating the manufacturing method.

Next, processes substantially similar to the processes described with reference to FIGS. 14 to 47 are executed. However, in the processes with reference to FIGS. 14 and 15, the trench ATTc is formed not only in the memory cell region $R_{MC}$ but also in the end portion of the hookup region $R_{HU}$. In addition, in the processes with reference to FIGS. 18 and 19, the trench ATTd is formed not only in the memory cell region $R_{MC}$ but also in the end portion of the hookup region $R_{HU}$. Accordingly, a structure as illustrated in FIGS. 89 and 90 is formed in the hookup region $R_{HU}$.

Figure 91:
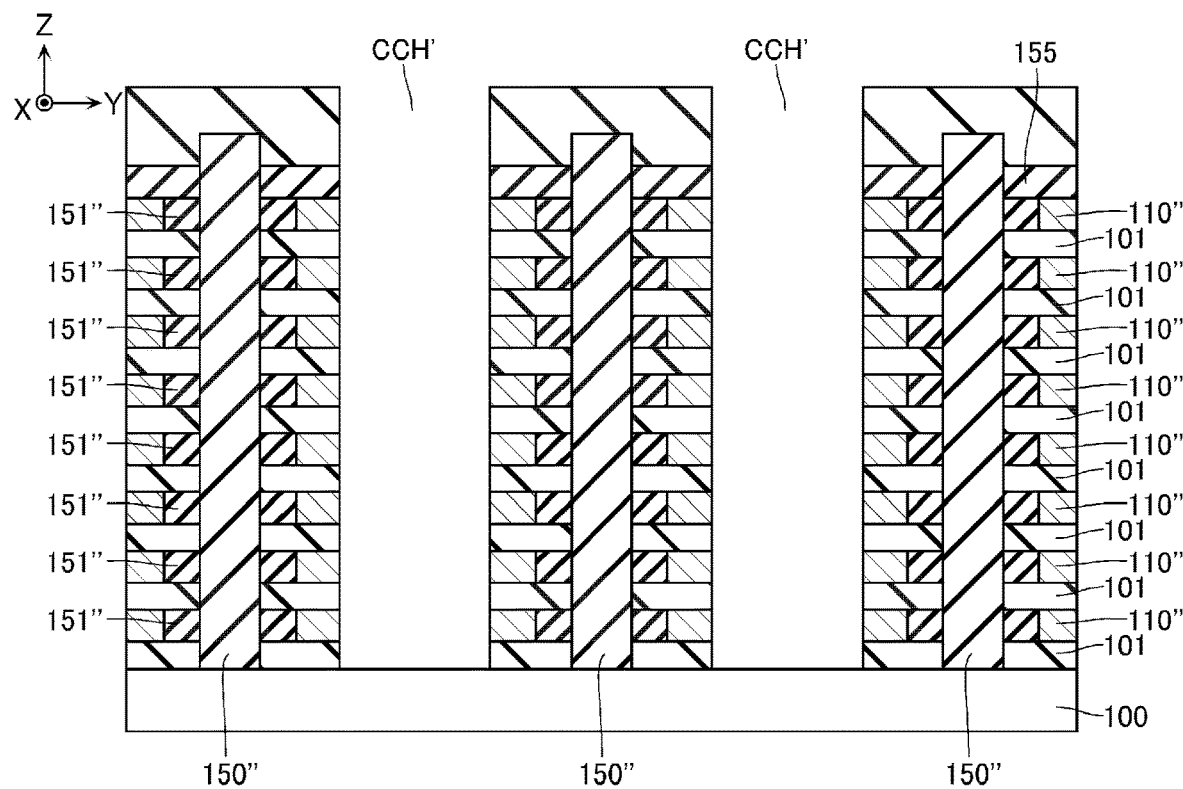
FIG. 91 is a schematic cross-sectional view illustrating the manufacturing method.
Figure 92:
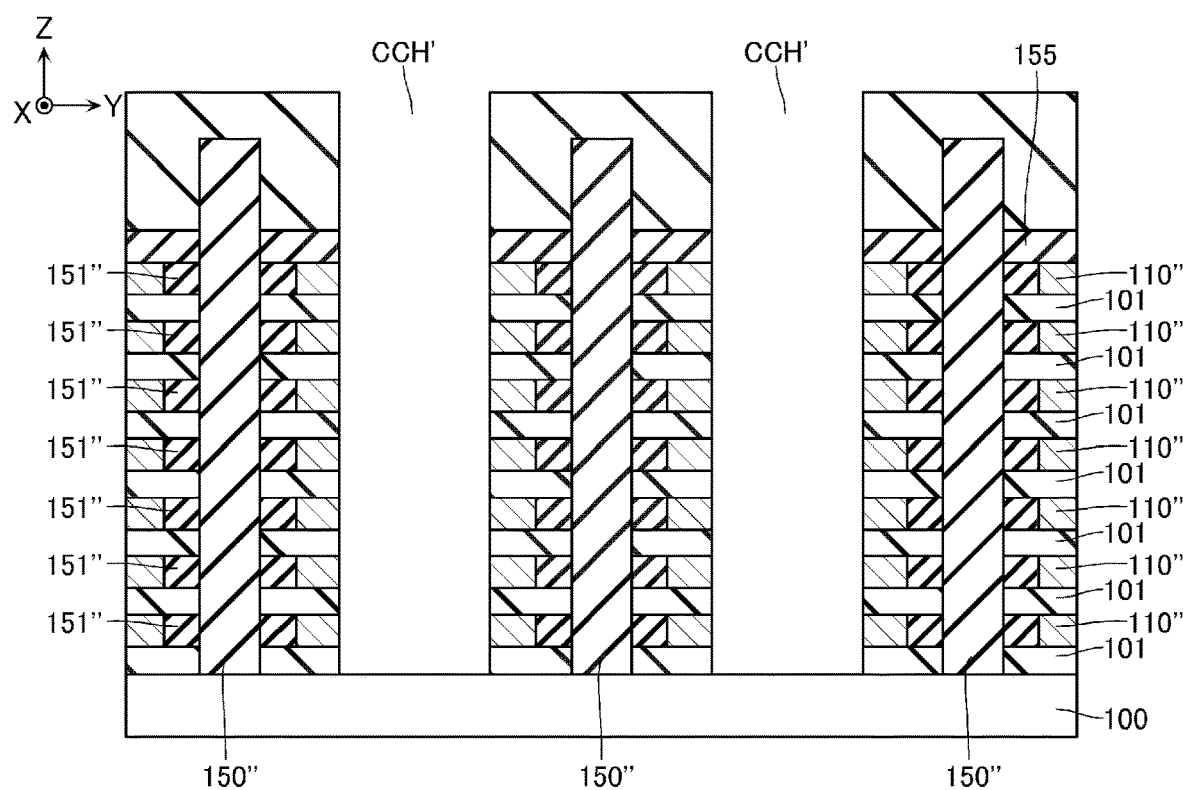
FIG. 92 is a schematic cross-sectional view illustrating the manufacturing method.

Next, as illustrated in FIGS. 91 and 92, a contact hole CCH' is formed. In this process, for example, an insulating layer having an opening is formed in a portion corresponding to the contact CC", and RIE or the like is performed by using the insulating layer as a mask.

Figure 93:
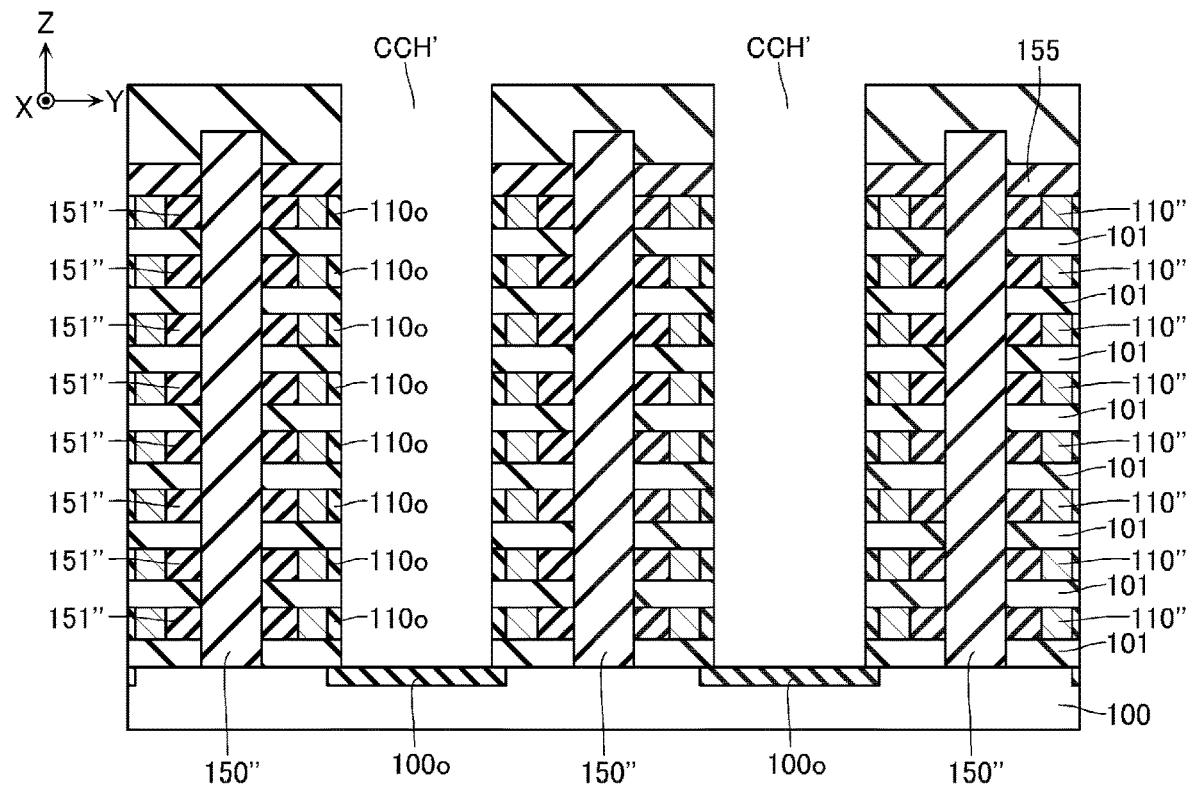
FIG. 93 is a schematic cross-sectional view illustrating the manufacturing method.
Figure 94:
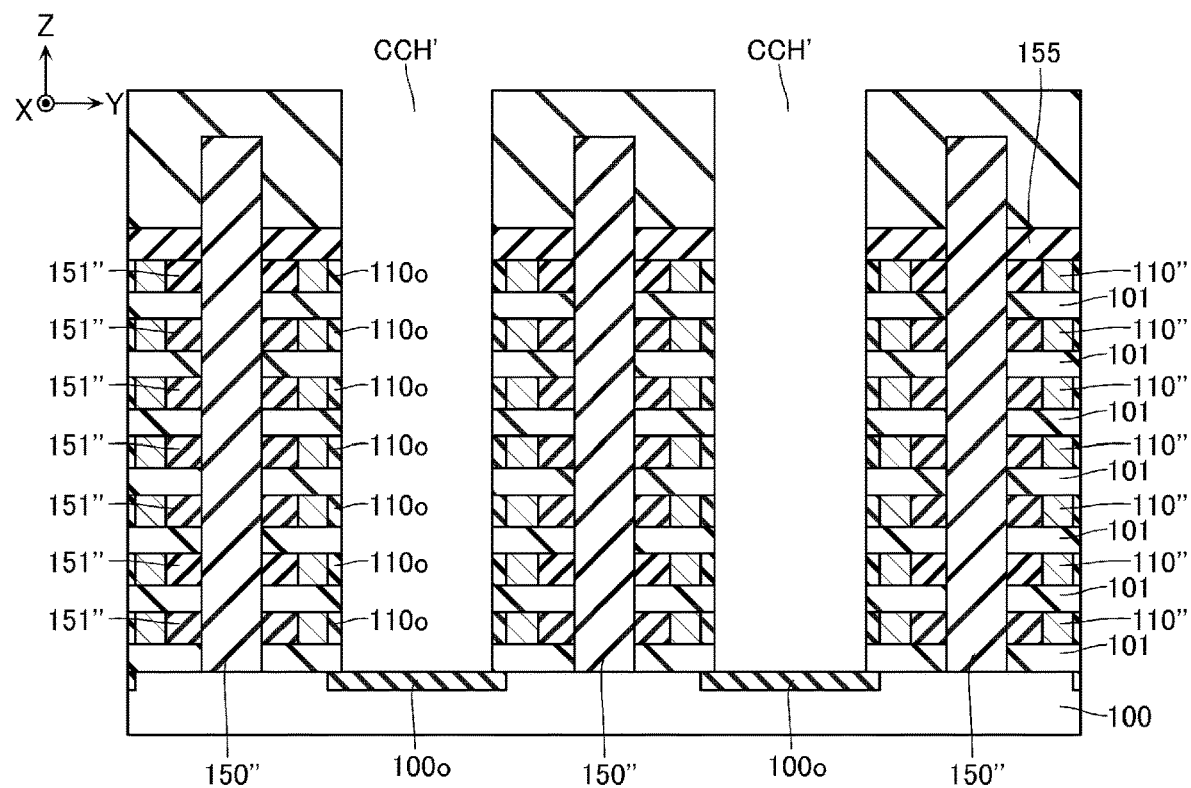
FIG. 94 is a schematic cross-sectional view illustrating the manufacturing method.

Next, as illustrated in FIGS. 93 and 94, oxidation treatment is performed on the portion of the upper surface of the semiconductor substrate 100 and the side surface of the conductive layer 110" in the Y direction exposed to the contact hole CCH'. Accordingly, the insulating layer 100o and the insulating layer 110o are formed.

Figure 95:
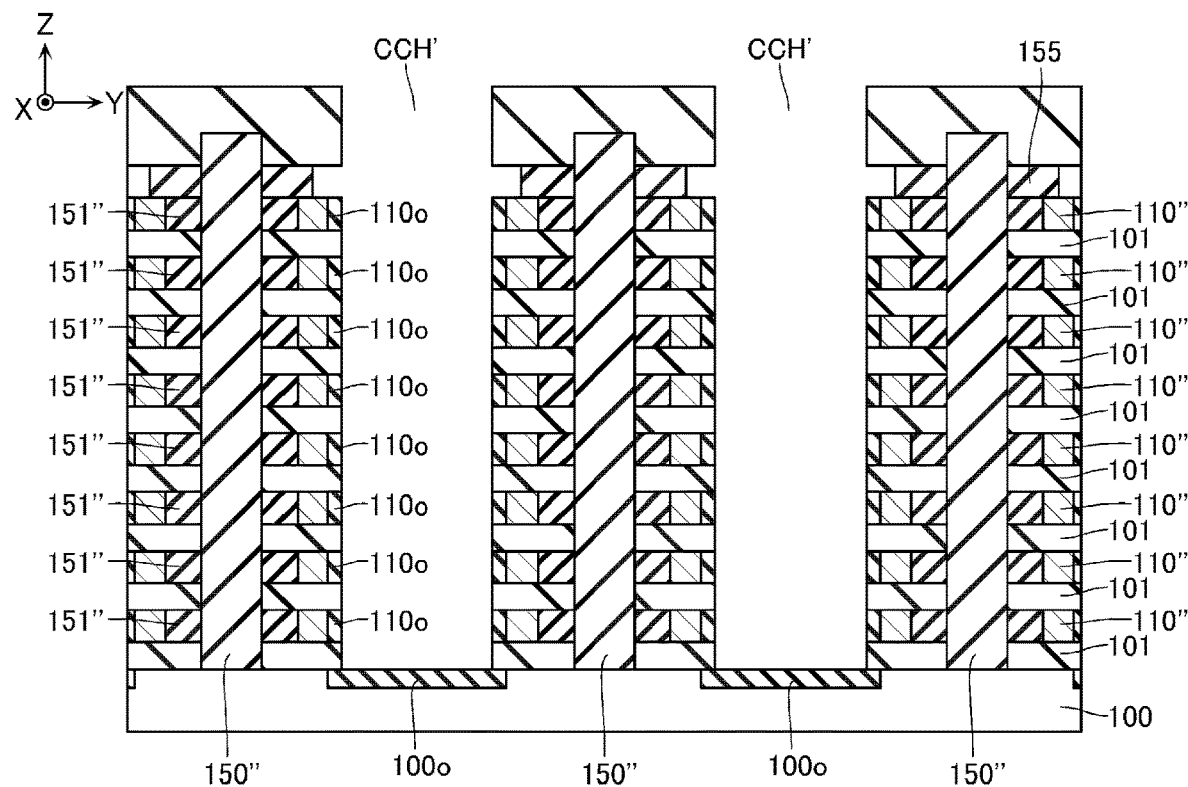
FIG. 95 is a schematic cross-sectional view illustrating the manufacturing method.
Figure 96:
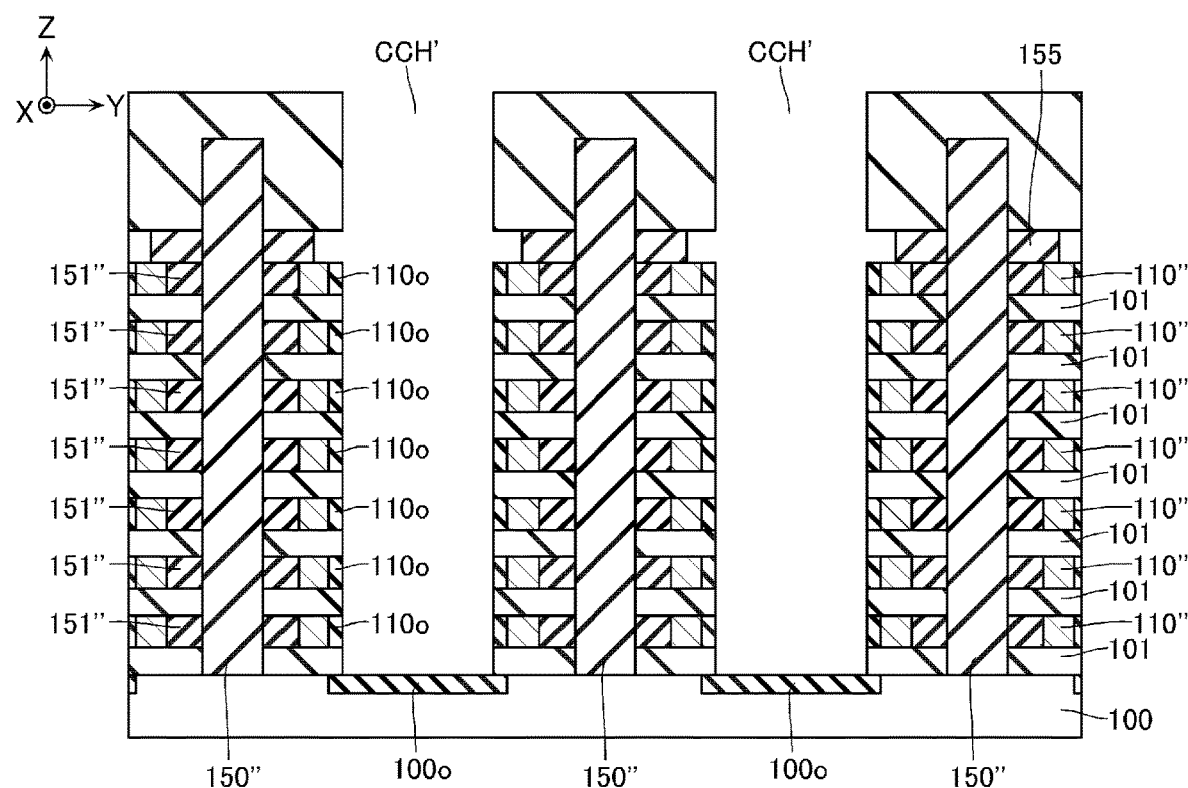
FIG. 96 is a schematic cross-sectional view illustrating the manufacturing method.

Next, as illustrated in FIGS. 95 and 96, a portion of the insulating layer 155 exposed to the contact hole CCH' is removed to expose the upper surface of the conductive layer 110". This process is performed, for example, by wet etching or the like.

Next, as illustrated in FIGS. 87 and 88, the contact CC' is formed in the contact hole CCH'. This process is performed by, for example, CVD or the like.

After that, the semiconductor storage device according to the third embodiment is manufactured by forming the bit line BL or the like.

Fourth Embodiment

Figure 97:
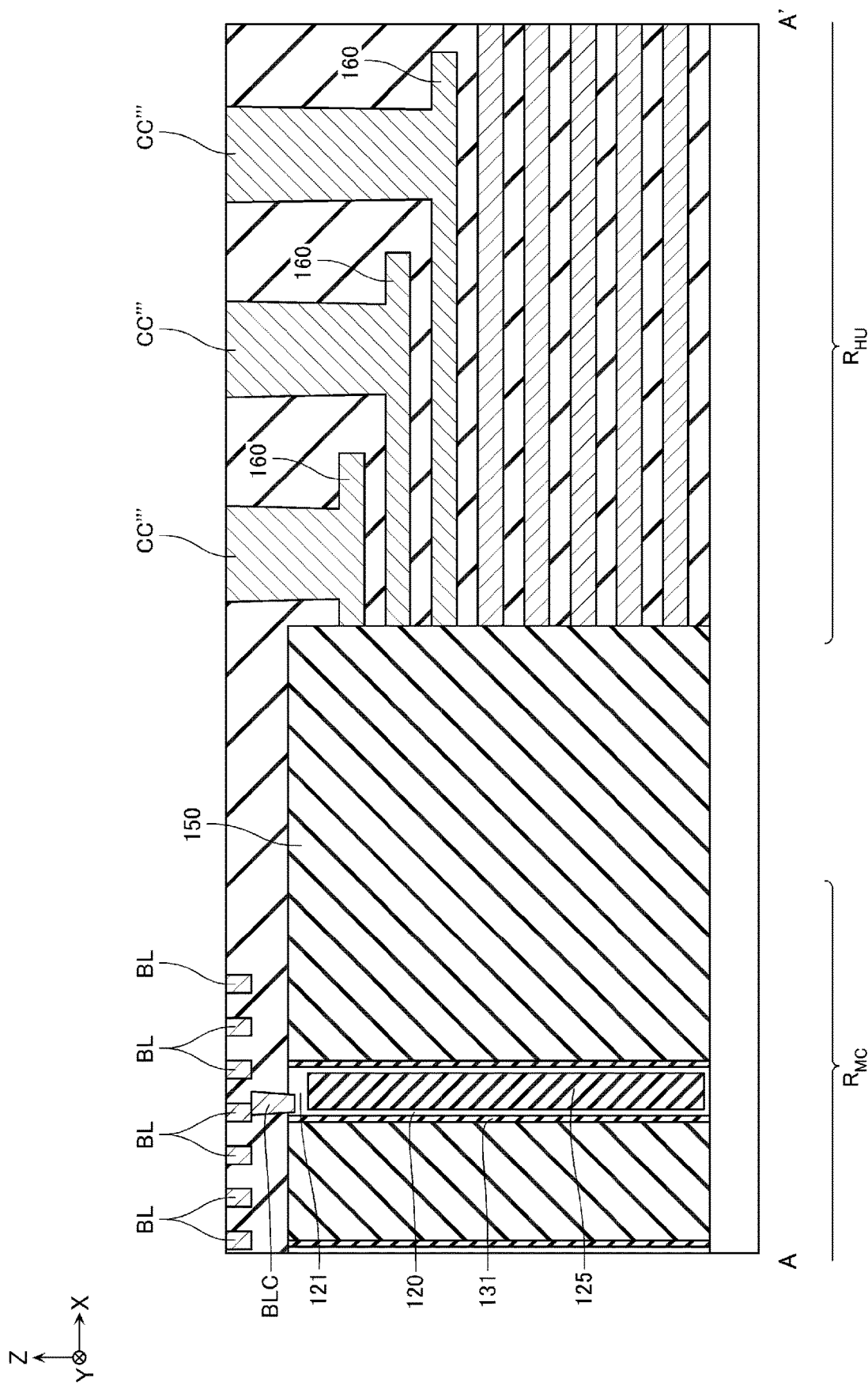
FIG. 97 is a schematic cross-sectional view of the semiconductor storage device according to the fourth embodiment.
Figure 98:
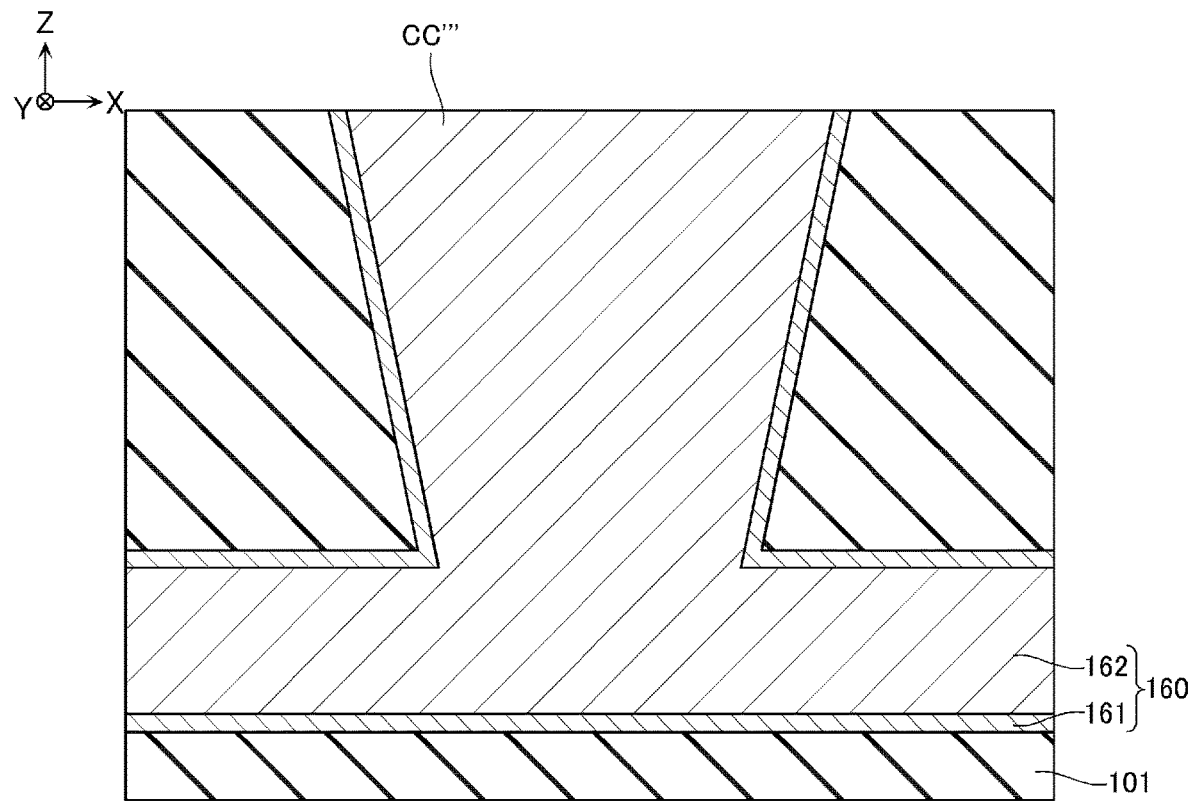
FIG. 98 is a schematic cross-sectional view of the semiconductor storage device.

Next, a semiconductor storage device according to a fourth embodiment will be described with reference to FIGS. 97 and 98. FIG. 97 is a schematic cross-sectional view illustrating a configuration in the hookup region $R_{HU}$ of the semiconductor storage device according to the fourth embodiment. FIG. 98 is a schematic enlarged view illustrating a portion of the configuration of FIG. 97.

The semiconductor storage device according to the fourth embodiment is basically configured in the same manner as the semiconductor storage device according to the second embodiment. However, the semiconductor storage device according to the fourth embodiment includes a contact CC'" instead of the contact CC'. In addition, the semiconductor storage device according to the fourth embodiment does not include the insulating layer 155.

Figure 99:
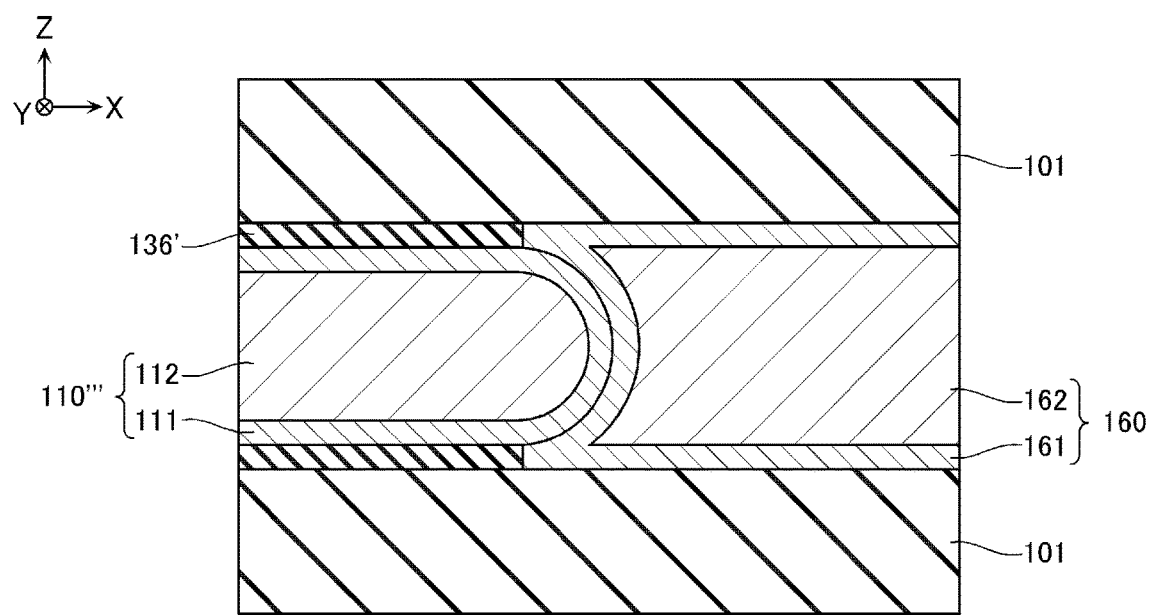
FIG. 99 is a schematic cross-sectional view of the semiconductor storage device according to the fifth embodiment.

The contact CC'" is basically configured in the same manner as the contact CC according to the first embodiment. However, as illustrated in FIG. 99, the contact CC'" includes a portion of the barrier conductive film 161 in the conductive layer 160 and a portion of the metal film 162 in the conductive layer 160 instead of the barrier conductive film 163 and the metal film 164. That is, the barrier conductive film 161 in the contact CC'" is formed to be continuous with the barrier conductive film 161 in the conductive layer 160. Similarly, the metal film 162 in the contact CC'" is formed to be continuous with the metal film 162 in the conductive layer 160.

[Manufacturing Method]

Figure 83:
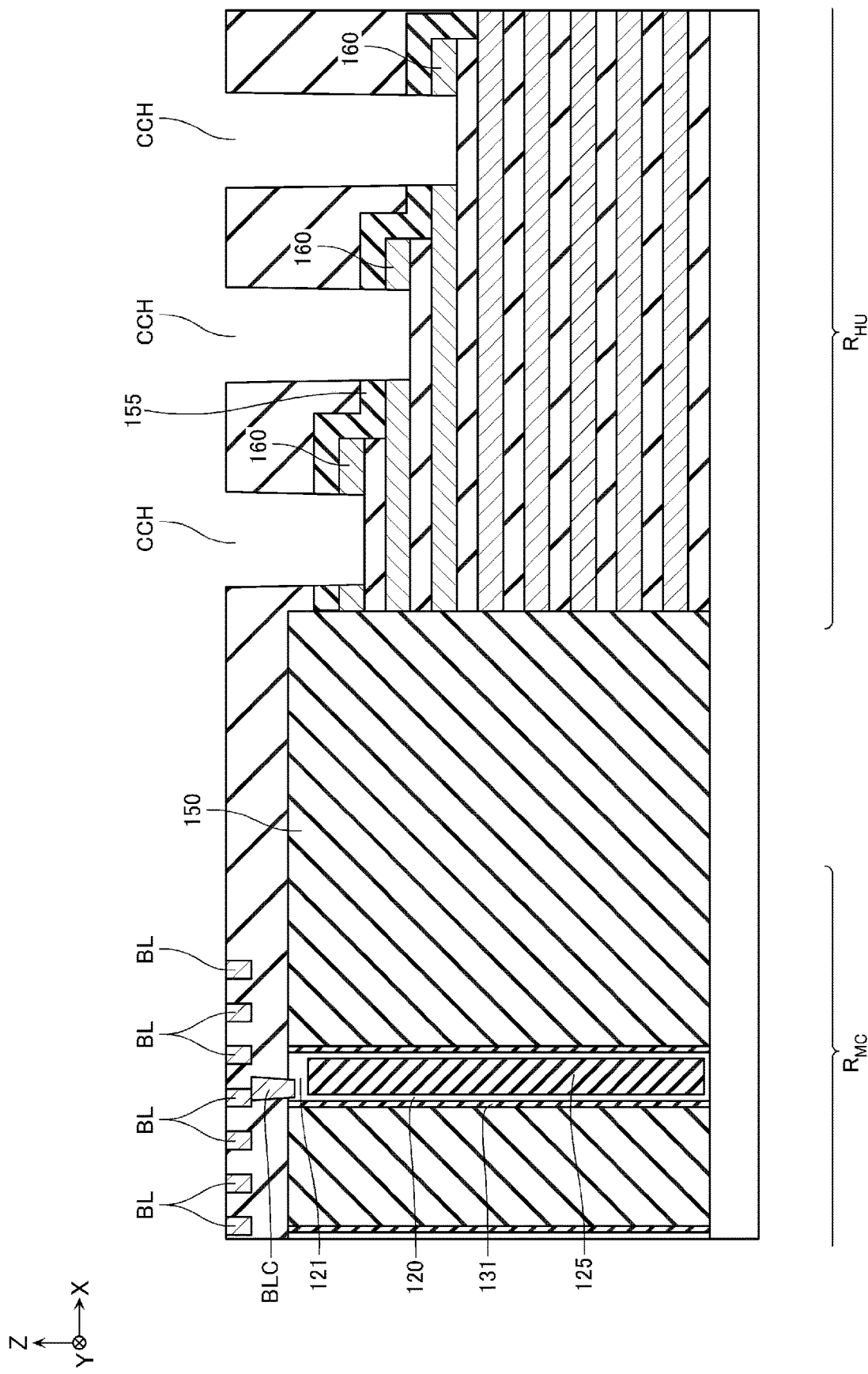
FIG. 83 is a schematic cross-sectional view illustrating the manufacturing method.
Figure 84:
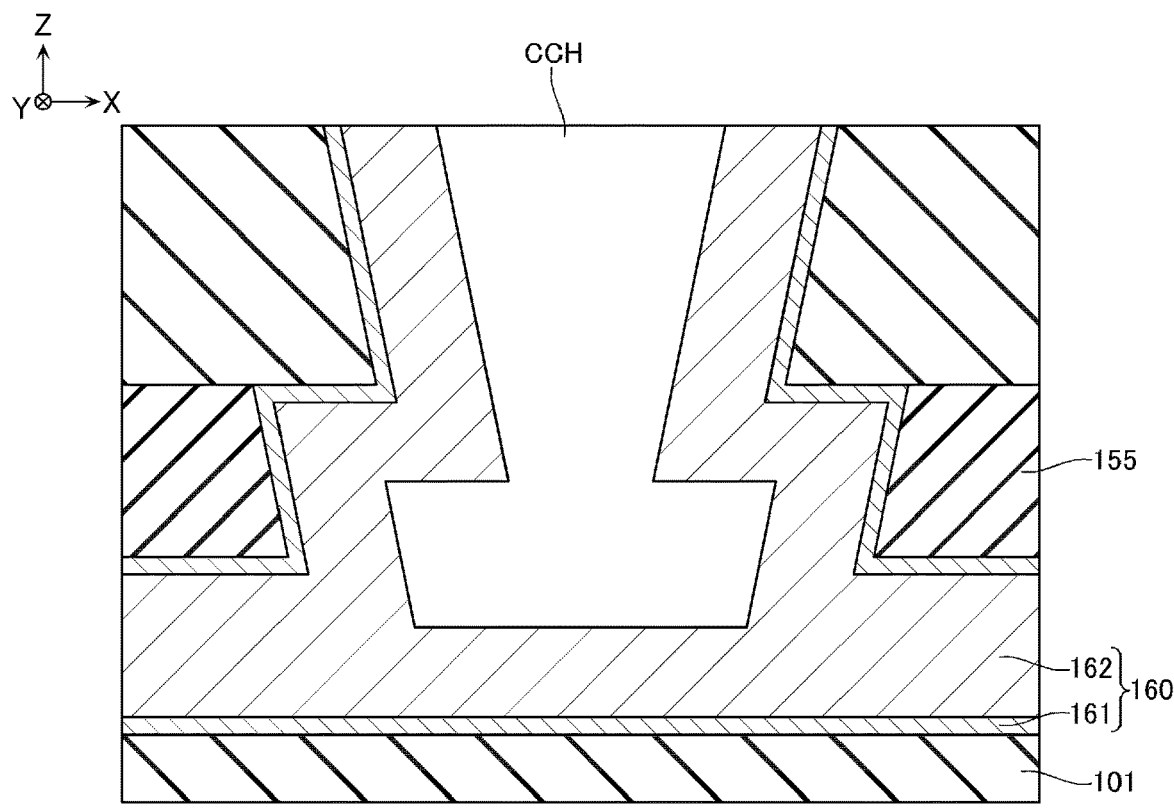
FIG. 84 is a schematic cross-sectional view illustrating the manufacturing method.
Figure 85:
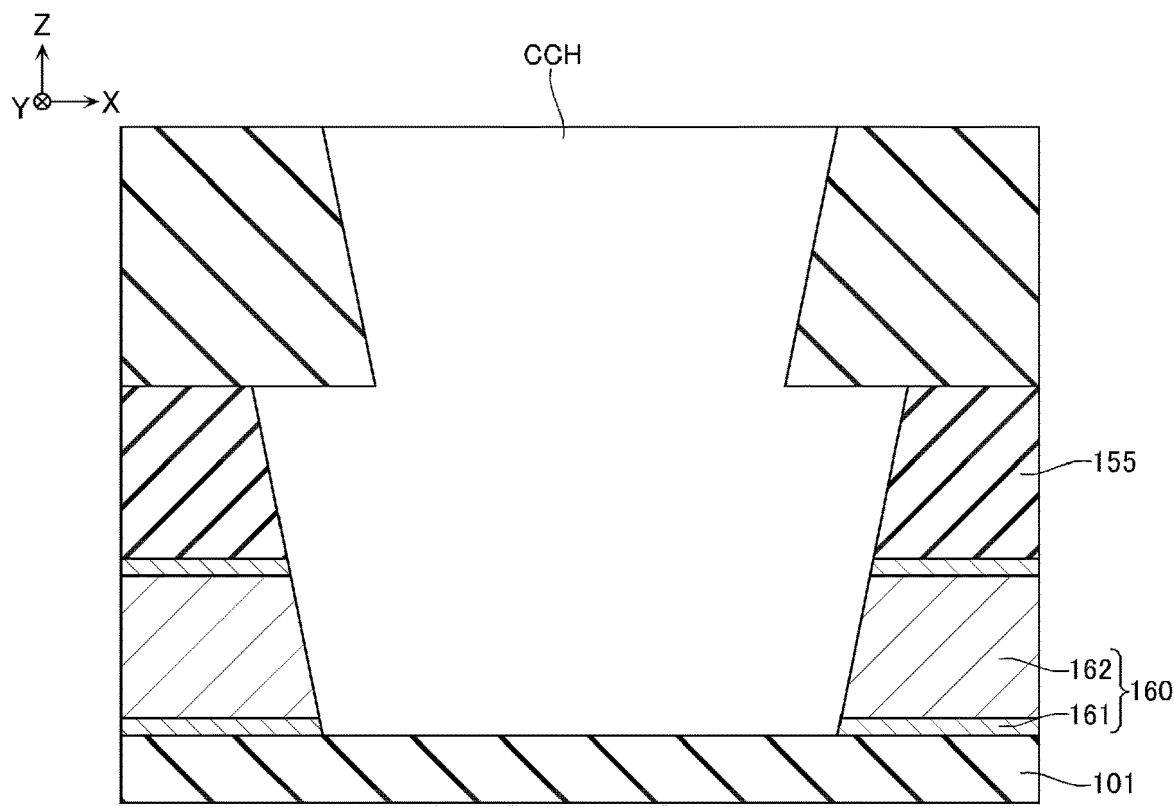
FIG. 85 is a schematic cross-sectional view illustrating the manufacturing method.

Next, a method of manufacturing the semiconductor storage device according to the fourth embodiment will be described. The method of manufacturing the semiconductor storage device according to the fourth embodiment is basically the same as the method of manufacturing the semiconductor storage device according to the second embodiment. However, in the method of manufacturing the semiconductor storage device according to the fourth embodiment, the processes described with reference to FIG. 76 and the processes described with reference to FIG. 80 may be omitted. In addition, in the method of manufacturing the semiconductor storage device according to the fourth embodiment, in the processes described with reference to FIGS. 82 and 84, the inside of the contact hole CCH may be buried with the metal film 162. In addition, in the method of manufacturing the semiconductor storage device according to the fourth embodiment, the processes described with reference to FIGS. 83 and 85 are not executed.

Effect of Fourth Embodiment

As described with reference to FIG. 12, in the semiconductor storage device according to the first embodiment, the metal film 164 in the contact CC and the metal film 162 in the conductive layer 160 are connected via the barrier conductive film 163. As described with reference to FIG. 75, the same applies to the second embodiment. In addition, although not illustrated, the same applies to the third embodiment.

Herein, the resistivity of the barrier conductive film 163 is larger than the resistivity of the metal film 164 and the metal film 162. Therefore, in order to reduce the resistance value of the current path from the contact CC to the conductive layer 110, it is preferable that the metal film 164 in the contact CC is connected to the metal film in the conductive layer 160 without passing through the barrier conductive film 163.

Therefore, in the fourth embodiment, for example, as illustrated in FIG. 98, the structure in which the metal film 162 in the contact CC''' is formed to be continuous with the metal film 162 in the conductive layer 160 is adopted. According to such a configuration, as compared with the structure illustrated in the first to third embodiments, the resistance value of the current path from the contact CC to the conductive layer 110 can be set to be smaller than that of the first to third embodiments.

In addition, as illustrated in FIG. 57, in the semiconductor storage device according to Comparative Example, the barrier conductive film 163 is provided in the electric path from the metal film 164 in the contact CC to the metal film 112 in the conductive layer 110. In addition, the facing area between the metal film 164 and the metal film 112 is about the same as the area of the lower end portion of the contact CC.

On the other hand, as illustrated in FIGS. 98 and 11, in the semiconductor storage device according to the fourth embodiment, the barrier conductive film 161 and the barrier conductive film 111 are provided in the electric path from the metal film 162 in the contact CC''' to the metal film 112 in the conductive layer 110. In addition, as illustrated in FIG. 8, the facing area between the metal film 162 and the metal film 112 is about a size of the product of the length of a substantially semicircular curve in which the conductive layer 110 and the conductive layer 160 are in contact with each other and the thickness of the metal film 162 or the metal film 112 the Z direction.

According to such a configuration, by allowing the facing area between the metal film 162 in the contact CC''' and the metal film 112 in the conductive layer 110 to be larger than that in Comparative Example, it is possible to allow the resistance value of the current path from the contact CC to the conductive layer 110 to be smaller than that of Comparative Example.

Fifth Embodiment

Next, the semiconductor storage device according to the fifth embodiment will be described with reference to FIG. 99. FIG. 99 is a schematic cross-sectional view illustrating a portion of the configuration of the semiconductor storage device according to the fifth embodiment.

The structure of the semiconductor storage device according to the fifth embodiment in the memory cell region $R_{MC}$ is the same as that of the semiconductor storage device according to Comparative Example described with reference to FIGS. 53 to 56. In addition, the structure of the semiconductor storage device according to the fifth embodiment in the hookup region $R_{HU}$ is the same as that of the semiconductor storage device according to the fourth embodiment described with reference to FIGS. 97 and 98.

In addition, as illustrated in FIG. 99, the semiconductor storage device according to the fifth embodiment includes a conductive layer 110'''. The conductive layer 110''' is basically configured in the same manner as the conductive layer 110' according to Comparative Example. However, the end portion of the conductive layer 110''' in the X direction is connected to the conductive layer 160. The metal film 112 in the conductive layer 110''' is connected to the metal film 162 in the conductive layer 160 via the barrier conductive film 111 and the barrier conductive film 161.

It is noted that the insulating layers 136' are provided on the upper and lower surfaces of the conductive layer 110'''. On the other hand, the insulating layers 136' are not provided on the upper and lower surfaces of the conductive layer 160. Therefore, the thickness of the metal film 162 in the Z direction is larger than the thickness of the metal film 112 in the Z direction.

[Manufacturing Method]

The method of manufacturing the semiconductor storage device according to the fifth embodiment is the same as the method of manufacturing the semiconductor storage device according to Comparative Example up to the processes described with reference to FIG. 71. However, in the processes described with reference to FIGS. 69 and 70, only the portion of the sacrifice layer 110A provided in the memory cell region $R_{MC}$ is removed.

Next, the processes after FIG. 78 of the semiconductor storage device according to the second embodiment are executed. However, in the method of manufacturing the semiconductor storage device according to the fifth embodiment, the processes described with reference to FIG. 80 may be omitted. In addition, in the method of manufacturing the semiconductor storage device according to the fifth embodiment, in the processes described with reference to FIG. 81, a portion of the insulating layer 136' formed at the end of the conductive layer 110''' in the X direction via the contact hole CCH is removed to expose the end portion of the conductive layer 110''' in the X direction. In addition, in the method of manufacturing the semiconductor storage device according to the fifth embodiment, in the processes described with reference to FIGS. 82 and 84, the inside of the contact hole CCH may be buried with the metal film 162. In addition, in the method of manufacturing the semiconductor storage device according to the fifth embodiment, the processes described with reference to FIGS. 83 and 85 are not executed.

Effect of Fifth Embodiment

As described above, the number of the conductive layers 110' and the insulating layers 101 arranged in the Z direction gradually increases. Along with this, the thicknesses of the conductive layer 110' and the insulating layer 101 in the Z direction gradually decrease in order to achieve high integration of the semiconductor storage device in the Z direction.

Herein, for example, as illustrated in FIG. 56, the conductive layer 110' includes the barrier conductive film 111 and the metal film 112. In addition, the insulating layer 136' is provided on the upper and lower surfaces of the conductive layer 110'. Herein, it is preferable that the barrier conductive film 111 has a constant thickness in order to prevent the diffusion of impurities in the metal film 112. In addition, it is preferable that the insulating layer 136' also has a constant thickness in terms of the characteristics of the memory cell MC. Therefore, when reducing the thickness of the conductive layer 110' and the insulating layer 101 in the Z direction, the thickness of the metal film 112 is mainly reduced in the Z direction.

Herein, the resistivity of the barrier conductive film 111 is larger than the resistivity of the metal film 112. Therefore, when the thickness of the metal film 112 in the Z direction becomes small, in some cases, the resistance value in the conductive layer 110' may increase. In some cases, along with this, the delay in the operation of the semiconductor storage device may occur.

Therefore, in the fifth embodiment, as illustrated in FIG. 98, the insulating layer 136' in the hookup region $R_{HU}$ is omitted. Accordingly, by securing the thickness of the metal film 162 in the Z direction in the hookup region $R_{HU}$, it is possible to significantly reduce the wiring resistance in the hookup region $R_{HU}$. Accordingly, it is possible to achieve high integration of the semiconductor storage device while preventing the delay in the operation of the semiconductor storage device.

Sixth Embodiment

Figure 100:
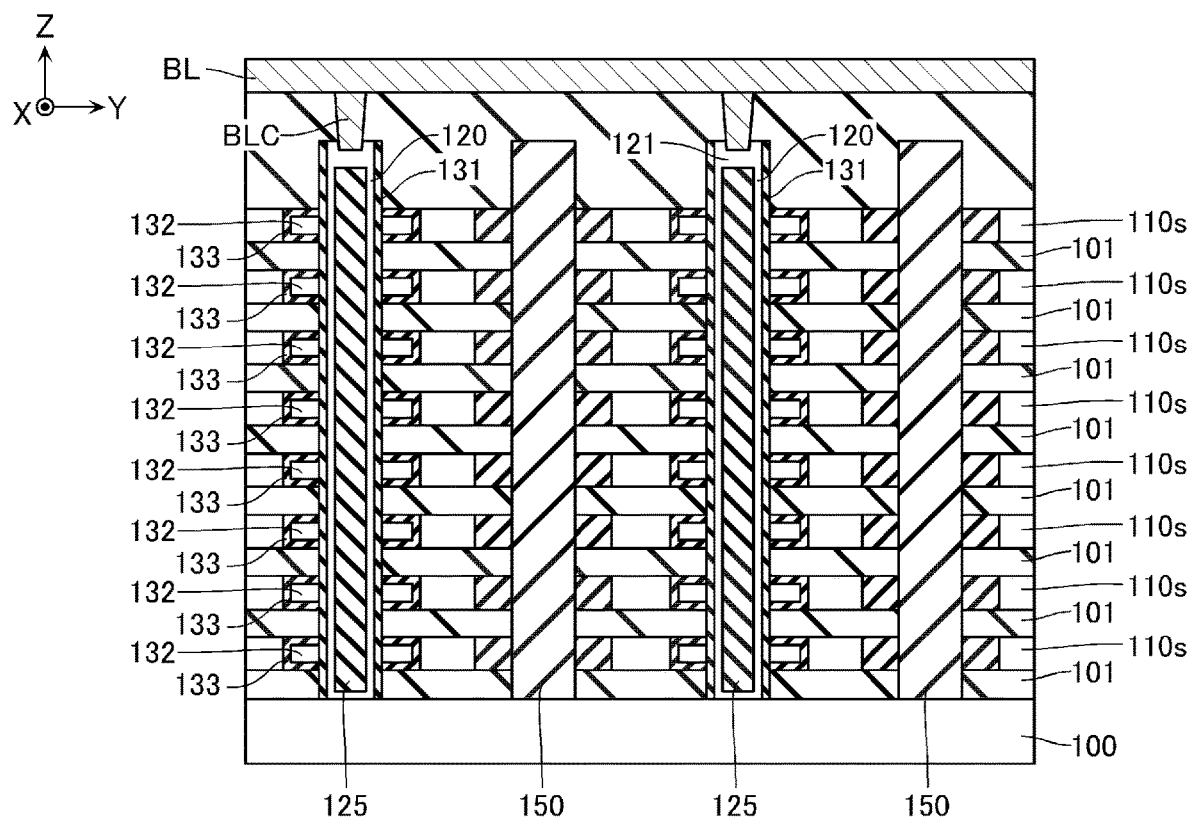
FIG. 100 is a schematic cross-sectional view of the semiconductor storage device according to the sixth embodiment.
Figure 101:
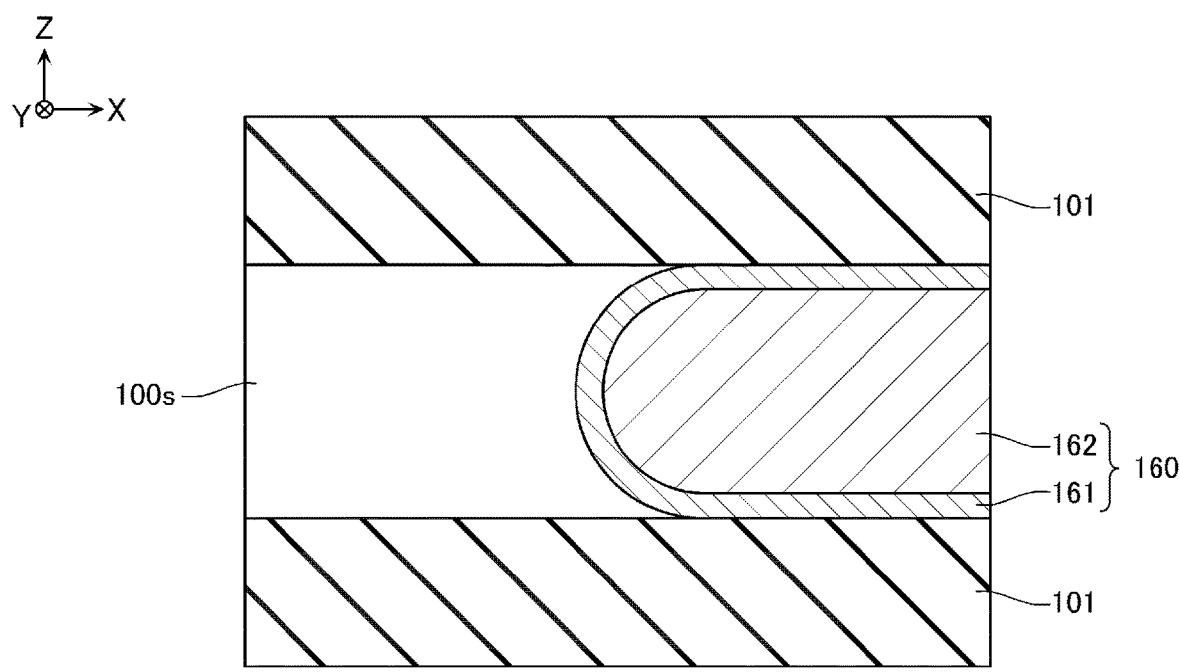
FIG. 101 is a schematic cross-sectional view of the semiconductor storage device.

Next, a semiconductor storage device according to a sixth embodiment will be described with reference to FIGS. 100 and 101. FIGS. 100 and 101 are schematic cross-sectional views illustrating a portion of the configuration of the semiconductor storage device according to the sixth embodiment.

The semiconductor storage device according to the sixth embodiment is basically configured in the same manner as the semiconductor storage device according to the fourth embodiment. However, as illustrated in FIG. 100, the semiconductor storage device according to the sixth embodiment includes a conductive layer 110s instead of the conductive layer 110. The conductive layer 110s is basically configured in the same manner as the conductive layer 110. However, the conductive layer 110s is formed of a semiconductor layer made of polycrystalline silicon or the like containing N-type impurities such as phosphorus (P) or P-type impurities such as boron (B). In addition, as illustrated in FIG. 101, the end portion of the conductive layer 110s in the X direction is connected to the end portion of the conductive layer 160 in the X direction.

It is noted that, in the sixth embodiment, the conductive layer 110s provided in the memory cell region $R_{MC}$ is configured with the semiconductor layer made of polycrystalline silicon or the like, whereas the conductive layer 160 provided in the hookup region $R_{HU}$ is configured with a stacked film including the barrier conductive film 161 and the metal film 162.

Effect of Sixth Embodiment

As in the sixth embodiment, in some cases, the semiconductor layer made of polycrystalline silicon or the like containing N-type impurities such as phosphorus (P) or P-type impurities such as boron (B) may be used as the word line WL. Herein, the semiconductor layer has a higher resistance value than the conductive layer 110 including the metal film 112. Therefore, in the embodiment, the conductive layer 160 including the metal film 162 is used in the hookup region $R_{HU}$. Accordingly, the wiring resistance in the hookup region $R_{HU}$ can be significantly reduced. As a result, it is possible to achieve the high integration of the semiconductor storage device while preventing the delay in the operation of the semiconductor storage device.

OTHER EMBODIMENTS

Heretofore, the semiconductor storage devices according to the first to sixth embodiments have been exemplified. However, the above configurations are merely examples, and the specific configuration and the like can be adjusted as appropriate.

For example, in the semiconductor storage device according to the sixth embodiment, the conductive layer 110s made of polycrystalline silicon or the like containing N-type impurities such as phosphorus (P) or P-type impurities such as boron (B) is used as a word line WL. In addition, the structure of the semiconductor storage device according to the sixth embodiment in the hookup region $R_{HU}$ is configured in the same manner as the structures of the fourth and fifth embodiments. However, for example, as in the sixth embodiment, the conductive layer 110s may be used as the word line WL, and the structure in the hookup region $R_{HU}$ of any one of the first to third embodiments may be adopted as the structure in the hookup region $R_{HU}$.

In addition, for example, in the first to sixth embodiments, the semiconductor storage device in which the memory strings MSa and MSb are formed on one side surface and the other side surface of the trench structure AT in the Y direction, respectively, is illustrated. However, the structure in the hookup region $R_{HU}$ as illustrated in the first to sixth embodiments can also be adopted in other semiconductor storage devices. For example, as other semiconductor storage devices, the structure can also be applied to a semiconductor storage device in which the outer peripheral surface of the component corresponding to the semiconductor layer 120 is surrounded by the components corresponding to the conductive layers 110 over the entire periphery and the component corresponding to the gate insulation layer 130 is provided between these components. In addition, the embodiments can be applied to a semiconductor storage device in which a ferroelectric substance or the like is contained in the gate insulation layer 130 in such components. In addition, the embodiments can be applied to a semiconductor storage device having a metal wiring or the like extending in the Z direction instead of the semiconductor layer 120 extending in the Z direction and including a variable resistance element or the like instead of the gate insulation layer 130.

[Others]

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first conductive layer, a second conductive layer, and a third conductive layer that extend in a first direction and are arranged in a second direction intersecting the first direction;
a plurality of first semiconductor layers provided between the first conductive layer and the second conductive layer and arranged in the first direction;
a plurality of first charge storage portions provided between the first conductive layer and the plurality of first semiconductor layers;
a plurality of second charge storage portions provided between the second conductive layer and the plurality of first semiconductor layers;
a first insulating layer provided between the first conductive layer and the second conductive layer and between two adjacent ones of the first semiconductor layers in the first direction;
a second insulating layer provided between the first conductive layer and the first insulating layer and between two adjacent ones of the first charge storage portions in the first direction;
a third insulating layer provided between the second conductive layer and the first insulating layer and between two adjacent ones of the second charge storage portions in the first direction;
a plurality of second semiconductor layers provided between the second conductive layer and the third conductive layer and arranged in the first direction;
a plurality of third charge storage portions provided between the second conductive layer and the plurality of second semiconductor layers;
a plurality of fourth charge storage portions provided between the third conductive layer and the plurality of second semiconductor layers;
a fourth insulating layer provided between the second conductive layer and the third conductive layer and between two adjacent ones of the second semiconductor layers in the first direction;
a fifth insulating layer provided between the second conductive layer and the fourth insulating layer and between two adjacent ones of the third charge storage portions in the first direction; and
a sixth insulating layer provided between the third conductive layer and the fourth insulating layer and between two adjacent ones of the fourth charge storage portions in the first direction,
wherein the first conductive layer has a first surface facing the second insulating layer,
wherein the second conductive layer has a second surface facing the third insulating layer,
wherein the second conductive layer has a third surface facing the fifth insulating layer,
wherein the third conductive layer has a fourth surface facing the sixth insulating layer,
wherein a barrier conductive film containing at least one of nitrogen (N) or titanium (Ti) is provided on the first surface and the second surface, and
wherein the barrier conductive film is not provided on the third surface and the fourth surface.

2. The semiconductor storage device according to claim 1,
wherein the first conductive layer includes a first metal film and a first barrier conductive film provided between the first metal film and the second insulating layer,
wherein the second conductive layer includes a second metal film and a second barrier conductive film provided between the second metal film and the third insulating layer,
wherein the third conductive layer includes a third metal film,
wherein the semiconductor storage device further includes:
a third barrier conductive film provided between the first conductive layer and the first charge storage portion;
a fourth barrier conductive film provided between the second conductive layer and the second charge storage portion;
a fifth barrier conductive film provided between the second conductive layer and the third charge storage portion; and
a sixth barrier conductive film between the third conductive layer and the fourth charge storage portion,
wherein the third barrier conductive film is in contact with the side surface of the first barrier conductive film on the first semiconductor layer side in the second direction,
wherein the fourth barrier conductive film is in contact with the side surface of the second barrier conductive film on the first semiconductor layer side in the second direction,
wherein the fifth barrier conductive film is in contact with the side surface of the second metal film on the second semiconductor layer side in the second direction, and
wherein the sixth barrier conductive film is in contact with the side surface of the third metal film on the second semiconductor layer side in the second direction.

3. The semiconductor storage device according to claim 1, comprising:
a substrate;
a plurality of the first conductive layers arranged in a third direction intersecting a surface of the substrate and intersecting the first direction and the second direction;
a plurality of the second conductive layers arranged in the third direction; and
a plurality of the third conductive layers arranged in the third direction,
wherein the first semiconductor layer includes:
a first portion facing the plurality of first conductive layers; and
a second portion facing the plurality of second conductive layers, and
wherein the second semiconductor layer includes:
a third portion facing the plurality of second conductive layers; and
a fourth portion facing the plurality of third conductive layers.

* * * * *